United States Patent
Ogihara et al.

(10) Patent No.: US 8,395,159 B2
(45) Date of Patent: Mar. 12, 2013

(54) SEMICONDUCTOR APPARATUS WITH THIN SEMICONDUCTOR FILM

(75) Inventors: Mitsuhiko Ogihara, Tokyo (JP); Hiroyuki Fujiwara, Tokyo (JP); Masaaki Sakuta, Tokyo (JP); Ichimatsu Abiko, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 12/591,475

(22) Filed: Nov. 20, 2009

(65) Prior Publication Data

US 2010/0072633 A1 Mar. 25, 2010

Related U.S. Application Data

(63) Continuation of application No. 11/651,586, filed on Jan. 10, 2007, now abandoned.

(30) Foreign Application Priority Data

Nov. 11, 2002 (JP) .................. 2002-326328

(51) Int. Cl.
*H01L 29/04* (2006.01)
*H01L 29/22* (2006.01)

(52) U.S. Cl. .............. 257/72; 257/88; 257/99

(58) Field of Classification Search .......... 257/72, 257/88, 99, 684, E27.12, E27.121, 690, 783, 257/784, E23.024
See application file for complete search history.

(56) References Cited

U.S. PATENT DOCUMENTS

| | | | |
|---|---|---|---|
| 5,917,534 A | 6/1999 | Rajeswaran | |
| 6,300,161 B1 * | 10/2001 | Goetz et al. | .......... 438/106 |
| 6,468,821 B2 | 10/2002 | Maeda et al. | |
| 6,614,056 B1 | 9/2003 | Tarsa et al. | |
| 6,696,704 B1 | 2/2004 | Maeda et al. | |
| 2005/0184300 A1 * | 8/2005 | Tazima et al. | .......... 257/94 |

FOREIGN PATENT DOCUMENTS

| | | |
|---|---|---|
| CN | 1237785 A | 12/1999 |
| EP | 1 104 937 A1 | 6/2001 |
| JP | 58-203071 A | 11/1983 |
| JP | 61-169814 A | 7/1986 |
| JP | 61-237483 A | 10/1986 |
| JP | 63-249669 | 10/1988 |
| JP | 06-085318 A | 3/1994 |
| JP | 06-085319 A | 3/1994 |
| JP | 6-177431 | 6/1994 |
| JP | 06-198957 A | 7/1994 |
| JP | 10-063807 A | 3/1998 |
| JP | 11-191642 A | 7/1999 |
| JP | 11-291538 A | 10/1999 |
| JP | 11-354829 A | 12/1999 |
| JP | 2000-114203 A | 4/2000 |

(Continued)

OTHER PUBLICATIONS

Yablonovitch et al., "Van der Weals bonding of GaAs on Pd leads to a permanent, solid-phase-topotaxial, metallurgical bond", 1991.

*Primary Examiner* — Hung Vu
(74) *Attorney, Agent, or Firm* — Rabin & Berdo, P.C.

(57) ABSTRACT

A semiconductor apparatus includes a substrate having at least one terminal, a thin semiconductor film including at least one semiconductor device, the thin semiconductor film being disposed and bonded on the substrate; and an individual interconnecting line formed as a thin conductive film extending from the semiconductor device in the thin semiconductor film to the terminal in the substrate, electrically connecting the semiconductor device to the terminal. Compared with conventional semiconductor apparatus, the invented apparatus is smaller and has a reduced material cost.

6 Claims, 44 Drawing Sheets

FOREIGN PATENT DOCUMENTS

| | | |
|---|---|---|
| JP | 2000-168140 A | 6/2000 |
| JP | 2001-068795 A | 3/2001 |
| JP | 2001-180037 A | 7/2001 |
| JP | 2001-210869 A | 8/2001 |
| JP | 2002-009333 A | 1/2002 |
| JP | 2002-036630 A | 2/2002 |
| JP | 2002-083953 A | 3/2002 |
| JP | 2002-314133 | 10/2002 |

* cited by examiner

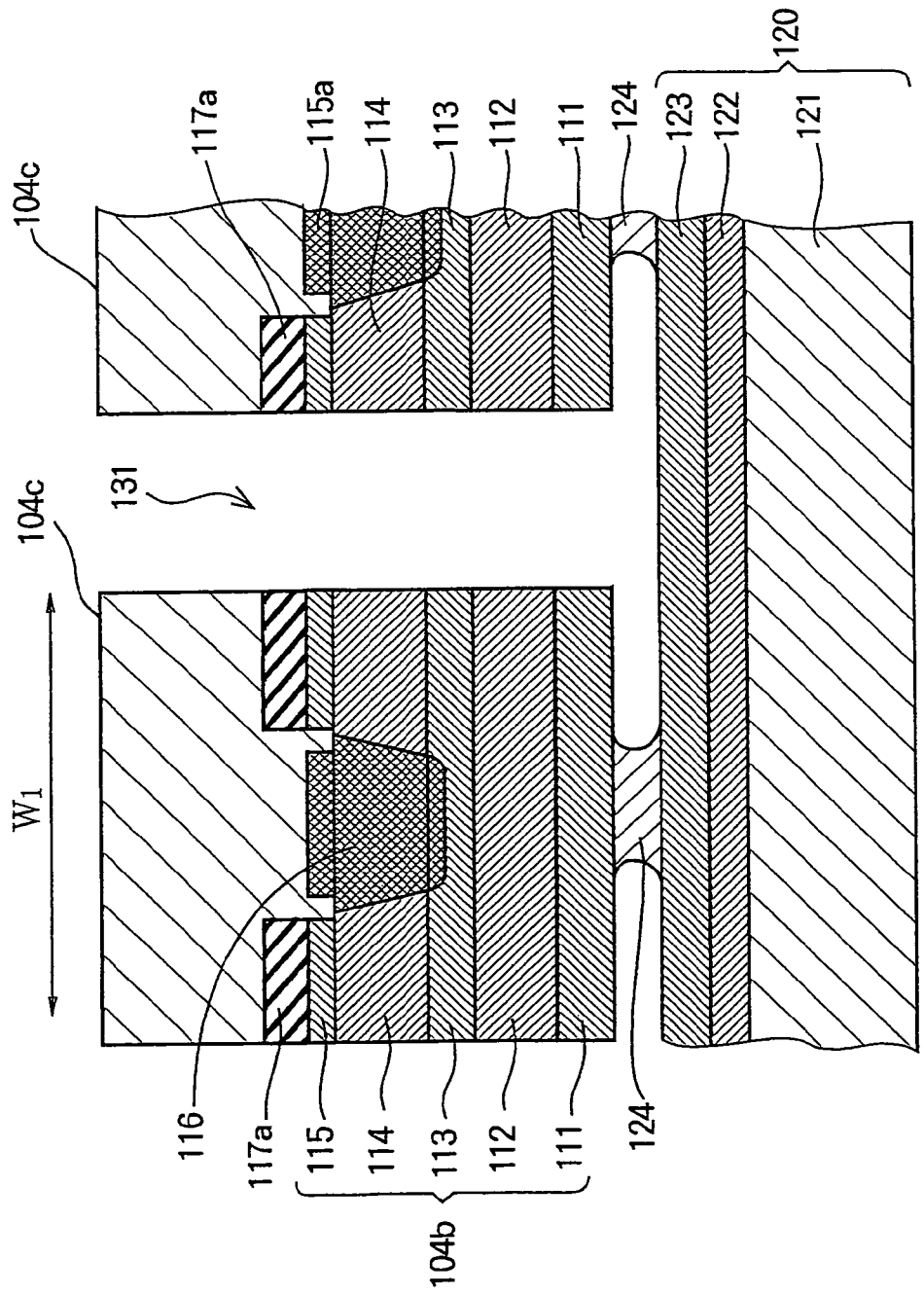

SEMICONDUCTOR APPARATUS WITH THIN SEMICONDUCTOR FILM

RELATED APPLICATIONS

This application is a continuation application of U.S. patent application Ser. No. 11/651,586, filed on Jan. 10, 2007, which was a divisional of U.S. patent application Ser. No. 11/651,579, filed on Jan. 10, 2007, which was a divisional of U.S. patent application Ser. No. 10/701,622, filed on Nov. 6, 2003, and issued as U.S. Pat. No. 7,180,099 on Feb. 20, 2007. The above-noted applications are incorporated herein by reference in their entirety.

BACKGROUND OF THE INVENTION

1. Field of the Invention

The present invention relates to a semiconductor apparatus useful in, for example, a light-emitting diode (LED) print head in an electrophotographic printer.

2. Description of the Related Art

Referring to FIG. 45, a conventional LED print head 900 includes a circuit board 901 on which are mounted a plurality of LED array chips 902 having electrode pads 903, and a plurality of driver integrated circuit (IC) chips 904 having electrode pads 905. The electrode pads 903, 905 are interconnected by bonding wires 906 through which current is supplied from the driver IC chips 904 to LEDs 907 formed in the LED array chips 902.

For reliable wire bonding, the electrode pads 903, 905 must be comparatively large, e.g., one hundred micrometers square (100 µm×100 µm), and the LED array chips 902 must have approximately the same thickness as the driver IC chips 904 (typically 250-300 µm), even though the functional parts of the LED array chips 902 (the LEDs 907) have a depth of only about 5 µm from the surface. To accommodate the needs of wire bonding, an LED array chip 902 must therefore be much larger and thicker than necessary simply to accommodate the LEDs 907. These requirements drive up the material cost of the LED array chips 902.

As shown in plan view in FIG. 46, the electrode pads 903 may need to be arranged in a staggered formation on each LED array chip 902. This arrangement further increases the chip area and, by increasing the length of the path from some of the LEDs 907 to their electrode pads 903, increases the associated voltage drop.

Light-emitting elements having a thin-film structure are disclosed in Japanese Patent Laid-Open Publication No. 10-063807 (FIGS. 3-6, FIG. 8, and paragraph 0021), but these light-emitting elements have electrode pads for solder bumps through which current is supplied. An array of such light-emitting elements would occupy substantially the same area as a conventional LED array chip 902.

SUMMARY OF THE INVENTION

A general object of the present invention is to reduce the size and material cost of semiconductor apparatus.

A more specific object is to reduce the size and material cost of a semiconductor apparatus comprising an LED array and its driving circuits.

The invented semiconductor apparatus includes a substrate having at least one terminal. A thin semiconductor film includes at least one semiconductor device, the thin semiconductor film being disposed and bonded on the substrate. An individual interconnecting line formed as a thin conductive film extends from the semiconductor device in the thin semiconductor film to the terminal in the substrate, so the semiconductor device is electrically connected to the terminal.

The semiconductor device may be an LED. The thin semiconductor film may include an array of LEDs, and the substrate having at least one terminal may include an integrated circuit that drives the LEDs. Compared with conventional semiconductor apparatus comprising an LED array chip and a driving-IC chip which is different from the LED array chip, the invented semiconductor apparatus has a reduced material cost because the LED array is reduced to a thin film and the overall size of the apparatus is reduced. The overall size of the apparatus is reduced because the large wire bonding pads conventionally used to interconnect the LEDs and their driving circuits are eliminated. Furthermore, the distance between the LEDs and their driving circuits can be reduced because of the elimination of the large wire bonding pads.

BRIEF DESCRIPTION OF THE DRAWINGS

In the attached drawings:

FIG. 10 is a cross sectional view schematically showing a fourth stage in the LED epitaxial-film fabrication process;

DETAILED DESCRIPTION OF THE INVENTION

Figure 1:
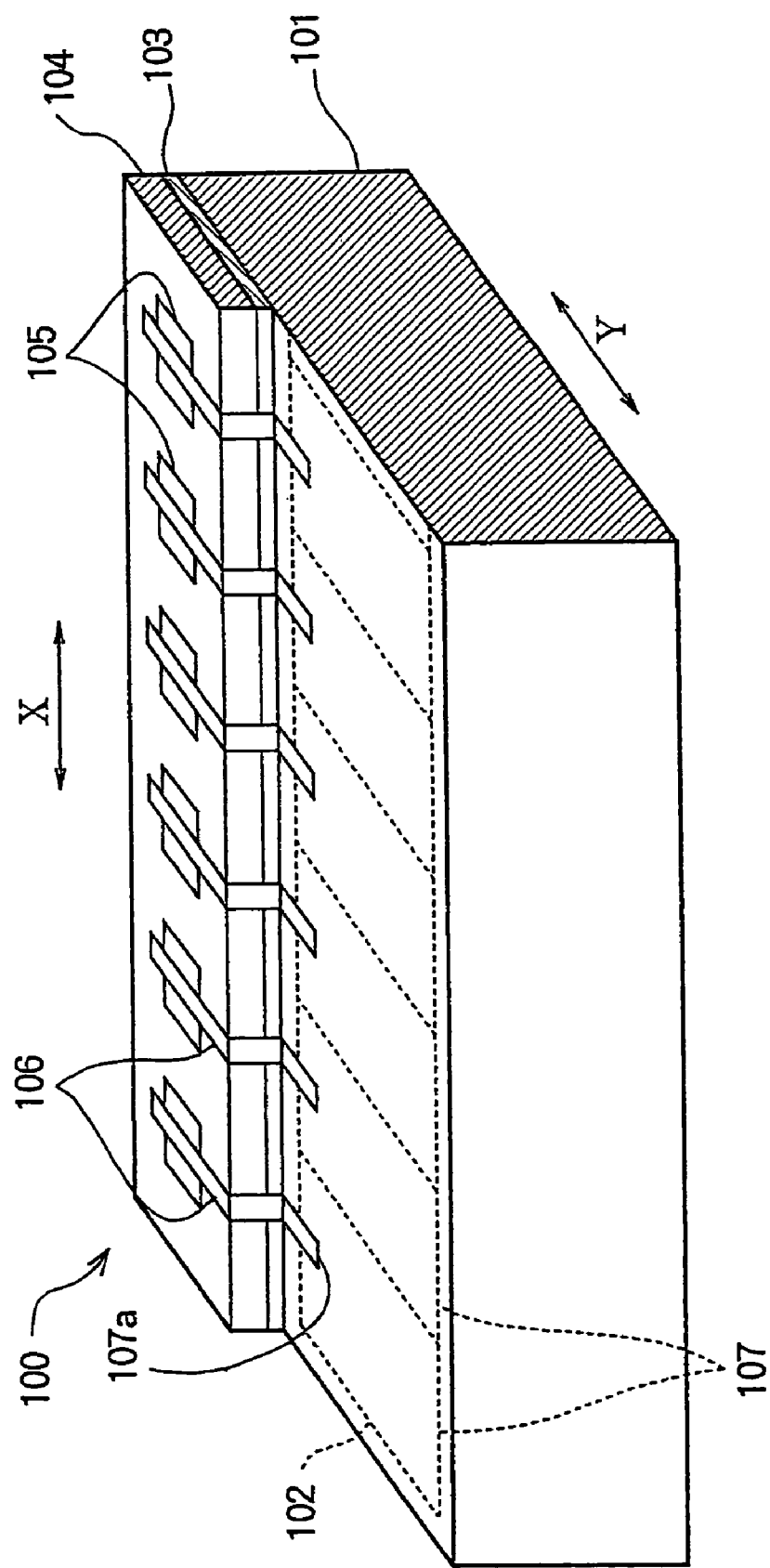
FIG. 1 is a perspective view schematically showing part of an integrated LED/driving-IC chip according to a first embodiment of the invention.

Embodiments of the invention will now be described with reference to the attached drawings, in which like elements are indicated by like reference characters.

First Embodiment

Figure 2:
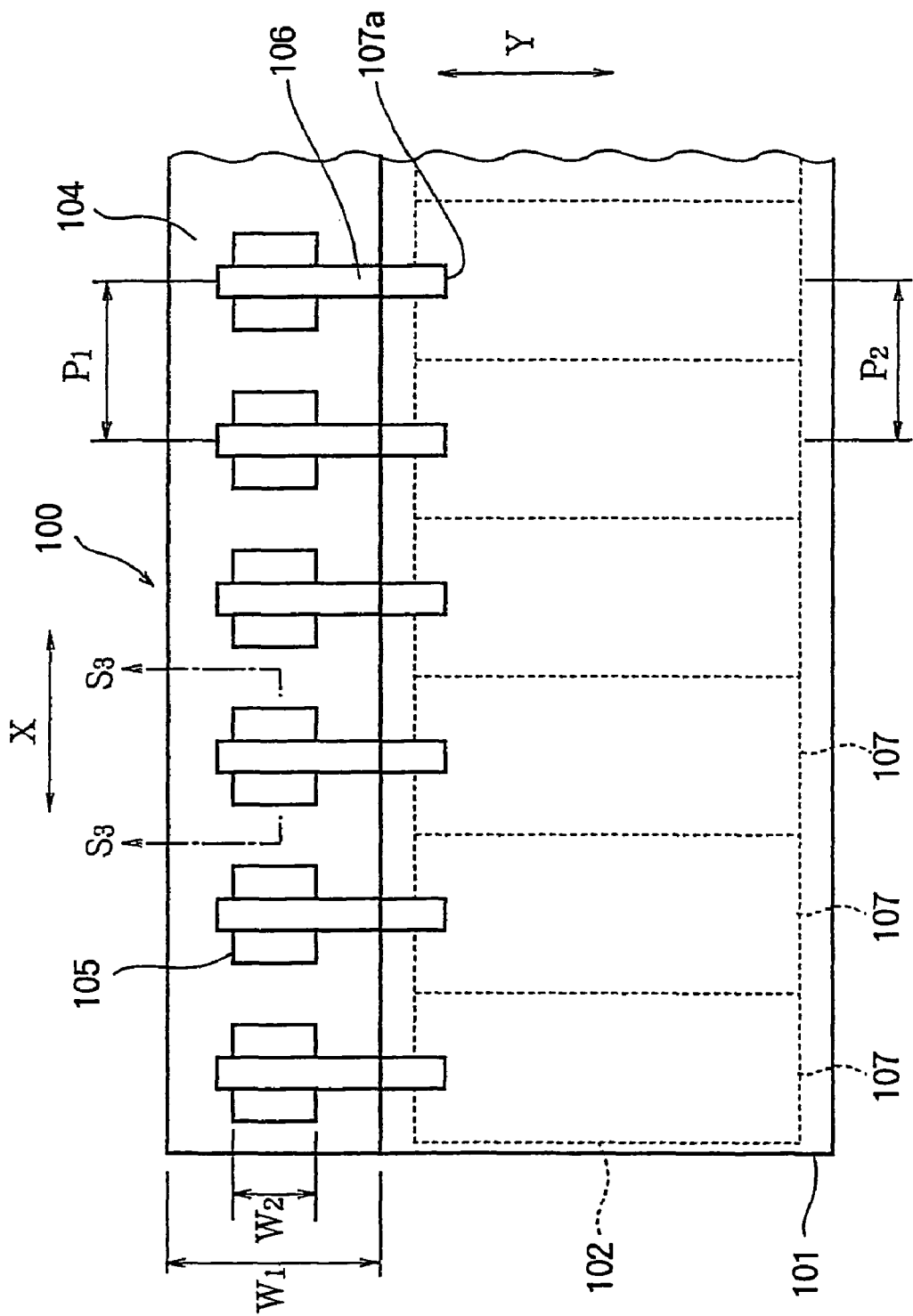
FIG. 2 is a plan view schematically showing part of the integrated LED/driving-IC chip in FIG. 1.

A first embodiment of the invented semiconductor apparatus, shown schematically in partial perspective view in FIG. 1 and partial plan view in FIG. 2, is an integrated LED/driving-IC chip 100 having a silicon (Si) substrate 101 in which an integrated circuit 102 is formed. A metal layer 103 is formed in tight contact with part of the surface of the silicon substrate 101, and the metal layer 103 is electrically connected to, for example, ground voltage. A thin semiconductor film, referred to below as an LED epitaxial film 104, is bonded to the surface of the metal layer 103. A plurality of light-emitting diodes 105 (LEDs, also referred to below as light-emitting parts or regions) are formed at regular intervals in the LED epitaxial film 104. The LEDs 105 are electrically connected to the integrated circuit 102 by individual interconnecting lines 106.

The LEDs 105 are aligned in the longitudinal direction or X-direction of the array of the driving IC circuit 102 formed on the silicon substrate 101 to form a linear array with an array pitch denoted $P_1$ in FIG. 2. In the orthogonal direction or Y-direction, the LED epitaxial film 104 has width $W_1$ greater than width $W_2$ of the light-emitting regions or LEDs 105. For example, the LED width $W_2$ may be twenty micrometers (20 µm) and the width $W_1$ of the LED epitaxial film 104 may be 0.50 µm, leaving a margin of 15 µm on both sides of the LEDs 105. Width $W_1$ of the LED epitaxial film 104 is much less than width (typically about 400 µm) of a conventional LED array chip having electrode pads.

The invention is not limited to the configuration of a single row of LEDs. The LEDs 105 may be disposed in two or more linear arrays offset in the Y-direction, and the intervals between adjacent LEDs 105 need not all be the same. FIGS. 1 and 2 show six LEDs which are part of an array of LEDs; the invention is not limited to a case of a specific number of LEDs. Width $W_1$ of the LED epitaxial film 104 and width $W_2$ of the light-emitting regions 105 are not limited to the values mentioned above.

The LED epitaxial film 104 preferably consists of epitaxial semiconductor layers. The grown epitaxial semiconductor layers are grown on a separate substrate from the substrate 101, and then transferred onto the metal layer 103. Thickness of the LED epitaxial film 104 may be about 2 µm, which is sufficient to obtain stable LED operating characteristics (for example, light-emitting characteristics and electrical characteristics). This thickness is much thinner than a conventional thickness (typically about 300-400 µm) of an LED array chip having electrode pads. The probability of open-circuit faults in the individual interconnecting lines 106 increases as the thickness of the LED epitaxial film 104 and the resulting step height, or rise, at its edge increases. To avoid the occurrence of this type of defect, the thickness of the LED epitaxial film 104 is preferably less than about 10 µm. This is not an absolute limitation, however; the thickness of the LED epitaxial film 104 may be greater than 10 μm if necessary.

The silicon substrate 101 is a monolithic silicon crystal in which the integrated circuit 102 is fabricated. The integrated circuit 102 comprises a plurality of driving circuits 107 that drive individual LEDs 105, the driving circuits 107 forming repeating circuit units in the integrated circuit 102. The driving circuits 107 are disposed at regular intervals, facing the plurality of LEDs 105. Besides the driving circuits 107, the integrated circuit 102 includes shared circuitry for illumination control of the LEDs 105. The thickness of the silicon substrate 101 is, for example, about 300 μm.

The metal layer 103 is formed on the surface of the silicon substrate 101 in a region adjacent to but not overlapping the integrated circuit 102. The metal layer 103 is, for example, a palladium or gold film with a thickness of about one hundred nanometers (100 nm=0.1 μm). The LED epitaxial film 104 is attached to the surface of the metal layer 103. The metal layer 103 is formed in order to obtain good bonding quality in the bonding of the LED epitaxial film 104 on the substrate 101, and in order to connect the bottom-surface of the epitaxial layer 111 (or the bottom-surface of the first-conductive-type region in the LED epitaxial film 104) to the common-voltage electrode layer 102a formed on the substrate 101. The LED epitaxial film 104 is preferentially formed an ohmic contact or an electric contact with low resistivity at the bonding interface 104a. The common voltage is, for example, the ground-level voltage. Ohmic contacts are preferably formed between the metal layer 103 and the common-voltage electrode layers 102a. In this embodiment, the first conductive type is an n-type; the epitaxial layer 111 in the LED epitaxial film 104 is, for example, an n-type GaAs layer. The metal layer 103 on which n-type GaAs is bonded is a common n-electrode for all of the LEDs 105. The common electrode regions may be formed on the entire surface or part of the surface of the substrate 101. The common electrode regions on the substrate 101 are n-type electrode for making control of the LEDs 105.

In the first-embodiment modifications that will be described later, the metal layer 103 is partly or wholly insulated from the conductive surface of the silicon substrate 101, in which case the metal layer 103 may be connected to the common electrode region of the driving integrated circuits 102 (driving ICs 102). The common voltage for the driving ICs may have some variations. When the variations in the common voltage for the driving ICs have an influence on the common voltage for the LEDs, the common electrode 103 or common electrode region 102a on the substrate 111 is not connected to the common electrode for the driving ICs.

When the LEDs 105 are disposed in a single row with an array pitch $P_1$ as shown in FIGS. 1 and 2, a row of the LEDs are preferably aligned to a row of the driving circuits 107; the direction of the row of the LEDs is well parallel to the direction of the row of the driving ICs. Preferably the array pitch for the driving ICs is substantially equal to the array pitch $P_2$, so that driving circuits 107 to control an LED face to the LED one to one correspondence.

The individual interconnecting lines 106 electrically interconnect the upper surfaces of the light-emitting regions 105 in the LED epitaxial film 104 at the individual output terminals 107a in the driving circuits 107 on the silicon substrate 101. The individual interconnecting lines 106 may be formed by patterning a thin conductive film. Specific examples of suitable films include (1) a film containing gold (Au), e.g., a single-layer gold film, a multi-layer film with titanium, platinum, and gold layers (a Ti/Pt/Au film), a multi-layer film with gold and zinc layers (an Au/Zn film), or a multi-layer film with a gold layer and a gold-germanium-nickel layer (an AuGeNi/Au film); (2) a film containing palladium (Pd), e.g., a single-layer palladium film or a multi-layer film with palladium and gold layers (a Pd/Au film); (3) a film containing aluminum (Al), e.g., a single-layer aluminum film or a multi-layer film with aluminum and nickel layers (an Al/Ni film); (4) a polycrystalline silicon (polysilicon) film; (5) a thin, electrically conductive oxide film such as an indium tin oxide (ITO) film or a zinc oxide (ZnO) film. Material of the driving-IC output-electrode pad to connect with the individual interconnecting line may be different from the materials described above for the individual interconnecting line 106. When material of the pad differs from material of the interconnecting line, a suitable material combination should be chosen; in some unsuitable material combination, interdiffusion of atoms between different materials occurs and it leads to defects at the connecting region. All of the individual interconnecting lines 106 can be formed simultaneously, as will be described below.

When the individual interconnecting lines 106 are formed from a thin film, since their width is restricted by the array pitch $P_1$ of the LEDs 105, a significant voltage drop will occur if the individual interconnecting lines 106 are too long. When several milliamperes of driving current is supplied through an individual interconnecting line 106 that is 5 μm wide and 0.5 μm thick, for example, length of the individual interconnecting line is preferably less than about 200 μm.

Figure 3:
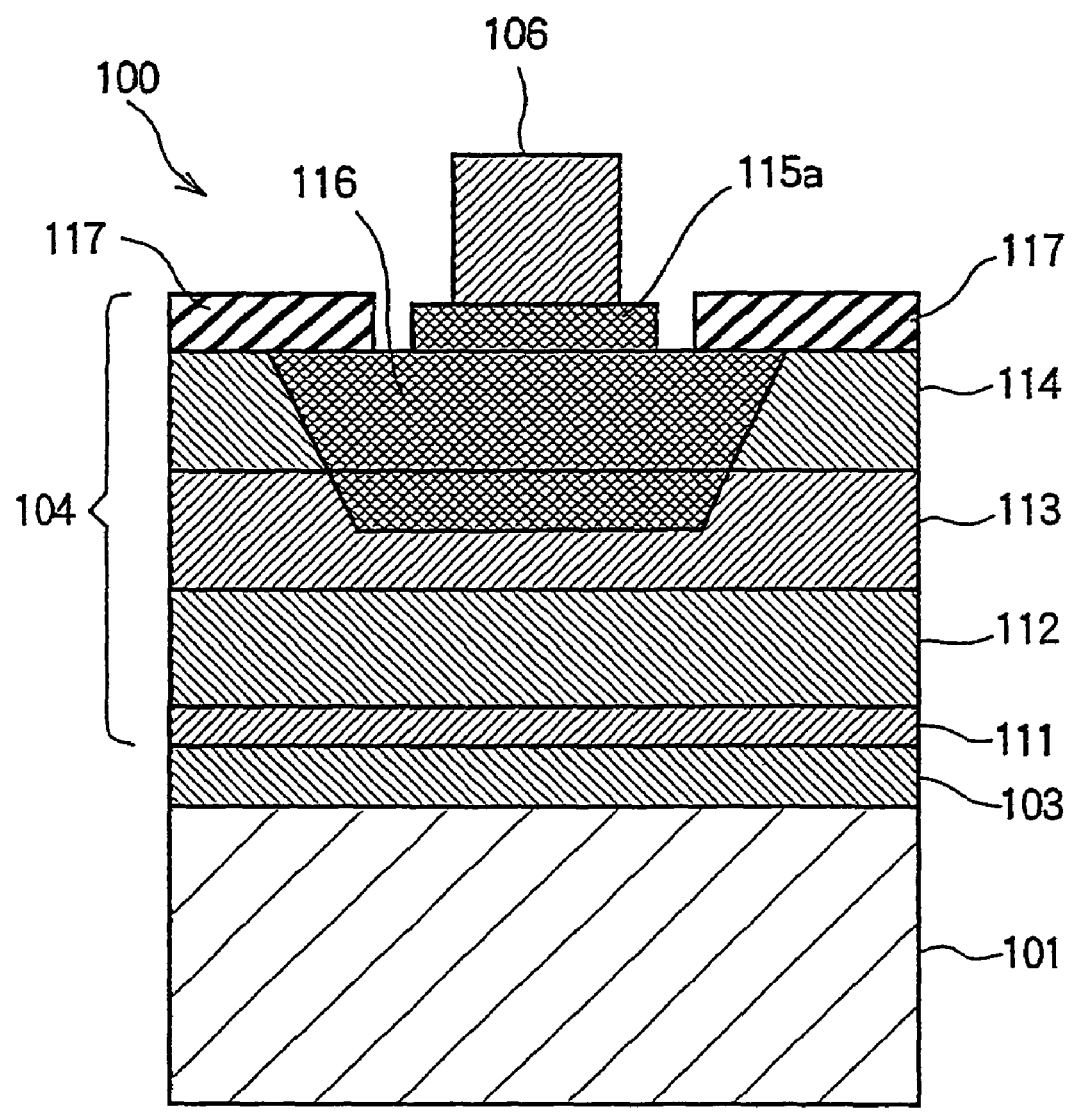
FIG. 3 is a cross sectional view schematically showing a cross section through line $S_3$-$S_3$ in FIG. 2.

An interdielectric thin film 117, shown in FIGS. 3 and 4, prevents short circuits in the individual line to the top- and side-surface of the LED epitaxial film 104, the metal layer 103, the surface of the silicon substrate 101, and metal-wirings in the driving ICs 107. The individual interconnecting lines 106 must cross steps, such as the step at the edge of the metal layer 103 and steps at the edges of openings in the interlayer dielectric film. To prevent short- and open-circuit faults in the individual interconnecting lines 106 at these steps, the interlayer dielectric film is preferably formed by a method such as a plasma chemical vapor deposition (P-CVD) method that provides good step coverage. The steps may also be planarized with a polyimide film or a spin-on-glass film.

Referring to FIG. 3, the LED epitaxial film 104 comprises, from the bottom up, an n-type gallium arsenide (GaAs) layer 111 and three n-type aluminum gallium arsenide (AlGaAs) layers: an $Al_xGa_{1-x}As$ lower cladding layer 112 ($0 \leq x \leq 1$), an $Al_yGa_{1-y}As$ active layer 113 ($0 \leq y \leq 1$), and an $Al_zGa_{1-z}As$ upper cladding layer 114 ($0 \leq z \leq 1$). A second n-type GaAs contact layer 115 (shown in FIG. 7) is formed on the n-type $Al_zGa_{1-z}As$ layer 114 and then p-type impurity of zinc (Zn) is selectively diffused into the epitaxial layers so that the Zn-diffusion front is in the active layer 113. Pn-junction region formed in the upper GaAs layer is removed by etching. The insulating thin film 117 is formed to cover the upper surface of the substrate and the individual electrode 106 is formed on the p-type (Zn-diffused) contact layer 115a. Light is emitted when forward current is supplied across the pn junction between the p-type and n-type regions. The dielectric film 117 mentioned above may be formed on the n-type $Al_zGa_{1-z}As$ upper cladding layer 114 (as shown in FIG. 3), and on the GaAs layer 115 (as shown in FIGS. 8-10). The n-type GaAs layer 111 is about 10 nm (0.01 μm) thick, the n-type $Al_xGa_{1-x}As$ lower cladding layer 112 about 0.5 μm thick, the n-type $Al_yGa_{1-y}As$ active layer 113 about 1 μm thick, the n-type $Al_zGa_{1-z}As$ upper cladding layer 114 about 0.5 μm thick, and the p-type GaAs contact layer 115a about 10 nm (0.01 μm) thick. The total thickness of the LED epitaxial film 104 is about 2.02 μm.

The aluminum composition ratios x, y, z of the AlGaAs layers are preferably selected so that x>y and z>y (e.g., x=z=0.4, y=0.1), and the diffusion front of the zinc diffusion region 116 is preferably located within the n-type $Al_yGa_{1-y}As$ active layer active 113. In this structure, minority carriers injected through the pn junction are confined within the n-type $Al_yGa_{1-y}As$ active layer 113 and the p-type $Al_yGa_{1-y}As$ region created therein by zinc diffusion, so that high luminous efficiency is obtained. The structure shown in FIG. 3 enables high luminous efficiency to be obtained with an LED epitaxial film 104 as thin as about 2 μm.

The LED epitaxial film 104 is not limited to thicknesses or materials given above. Other materials, such as an aluminum-gallium indium phosphide $((Al_xGa_{1-x})_yIn_{1-y}P$, where $0 \leq x \leq 1$ and $0 \leq y \leq 1$), a gallium nitride (GaN), an aluminum gallium nitride (AlGaN), and an indium gallium nitride (InGaN), may also be employed. Other than a double hetero-epitaxial structure described in FIG. 3, a single hetero-epitaxial structure and a homo-epitaxial structure can be also applied in LEDs.

Next, a method of fabricating the integrated LED/driving-IC chip 100 will be described with reference to FIGS. 4A through 4F.

Figure 4A:
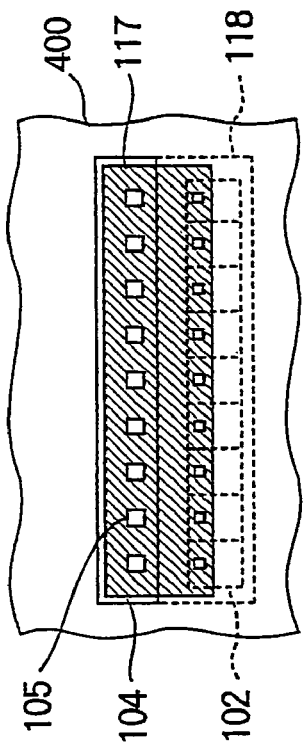
FIGS. 4A through 4F are plan views schematically showing a fabrication process for the integrated LED/driving-IC chip in FIG. 1.
Figure 4B:
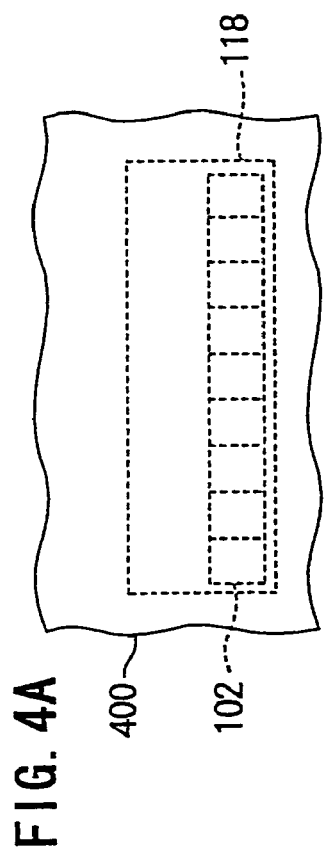
Figure 4C:
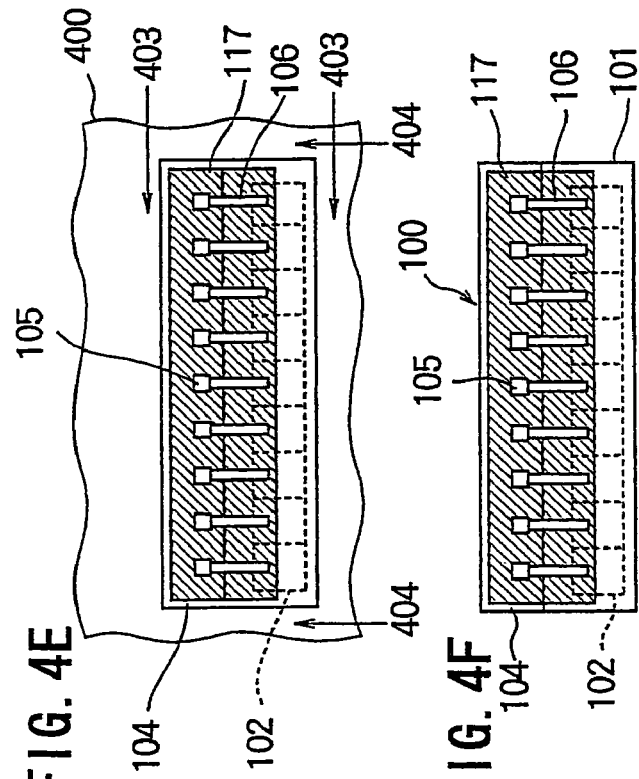

In the fabrication process, first the integrated circuit 102 is formed in part of a chip formation area 118 on a semiconductor wafer 400 as shown in FIG. 4A. Next, as shown in FIG. 4B, the metal layer 103 is formed in close region to the integrated circuit 102 in the chip formation area 118. This step is followed by bonding of the LED epitaxial film 104 as shown in FIG. 4C. To obtain large enough bonding strength between the LED epitaxial film 104 and the metal layer 103, they are sintered at a temperature of, for example, 200° C. to 250° C. after the epitaxial film bonding process.

Figure 4D:
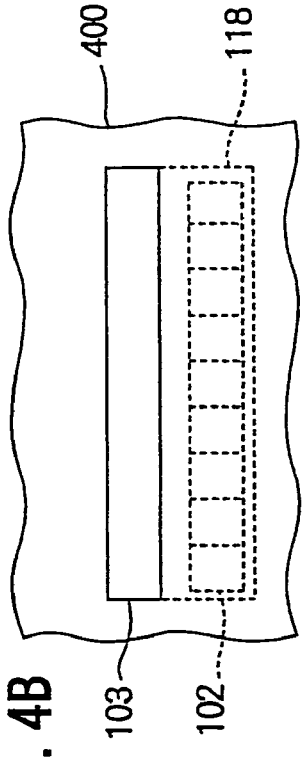

Next, as shown in FIG. 4D, an interlayer dielectric film 117 is deposited on a region in which the individual interconnecting lines 106 will be formed. The interlayer dielectric film 117 covers, at least, part of the LED epitaxial film 104, part of the integrated circuit 102 and region between the LED epitaxial film 104 and the integrated circuit 102 on which the interconnecting lines 106 are formed. Openings are formed in the interlayer dielectric film 117 to make electrical contact between the individual interconnecting lines and the LEDs and driving-circuit output-pads; then the individual interconnecting lines 106 are formed. The interconnecting-line pattern is formed by either a liftoff process or a photolithography/etching process.

Figure 4E:
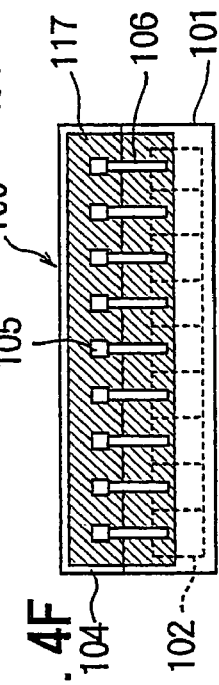

The individual interconnecting lines 106 are then formed as shown in FIG. 4E, connecting individual interconnecting lines from the LEDs to the individual output electrode pads in the driving circuits. Sintering may be carried out as necessary to reduce the electrical contact resistance between the individual interconnecting lines 106 and the p-type GaAs contact layers 115a of the LEDs. The proper sintering temperature depends on the materials used for the individual interconnecting lines, but a sintering temperature approximately equal to the sintering temperature used to bond the LED epitaxial film 104 to the metal layer 103 is preferable. This is because if sintering is performed at too high a temperature, significant stress may be applied in the LED epitaxial film 104 due to difference in thermal expansion coefficient between the silicon substrate 101 and LED epitaxial film 104, possibly leading to defects in the LED epitaxial film.

Figure 4F:
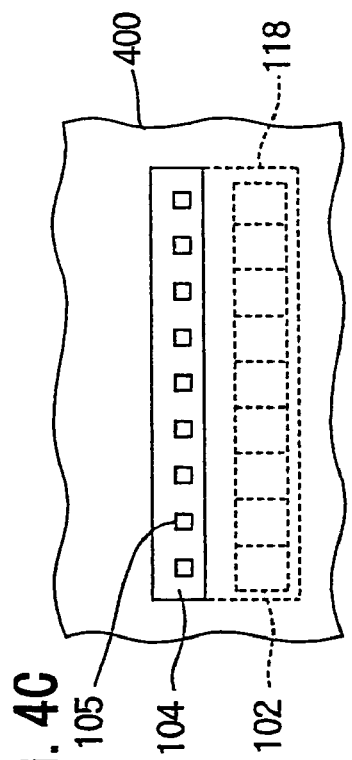

Next, the semiconductor wafer 400 is diced along dicing lines 403 and 404 indicated by arrows in FIG. 4E to separate the wafer into chips. FIG. 4F shows one integrated LED/driving-IC chip 100 after dicing.

In the process described above, formation of the integrated circuit 102 may include the formation of the above-mentioned common conductive area, by which the metal layer 103 is electrically coupled to a ground or n-side potential used by the integrated circuit 102 for driving the LEDs.

Figure 5:
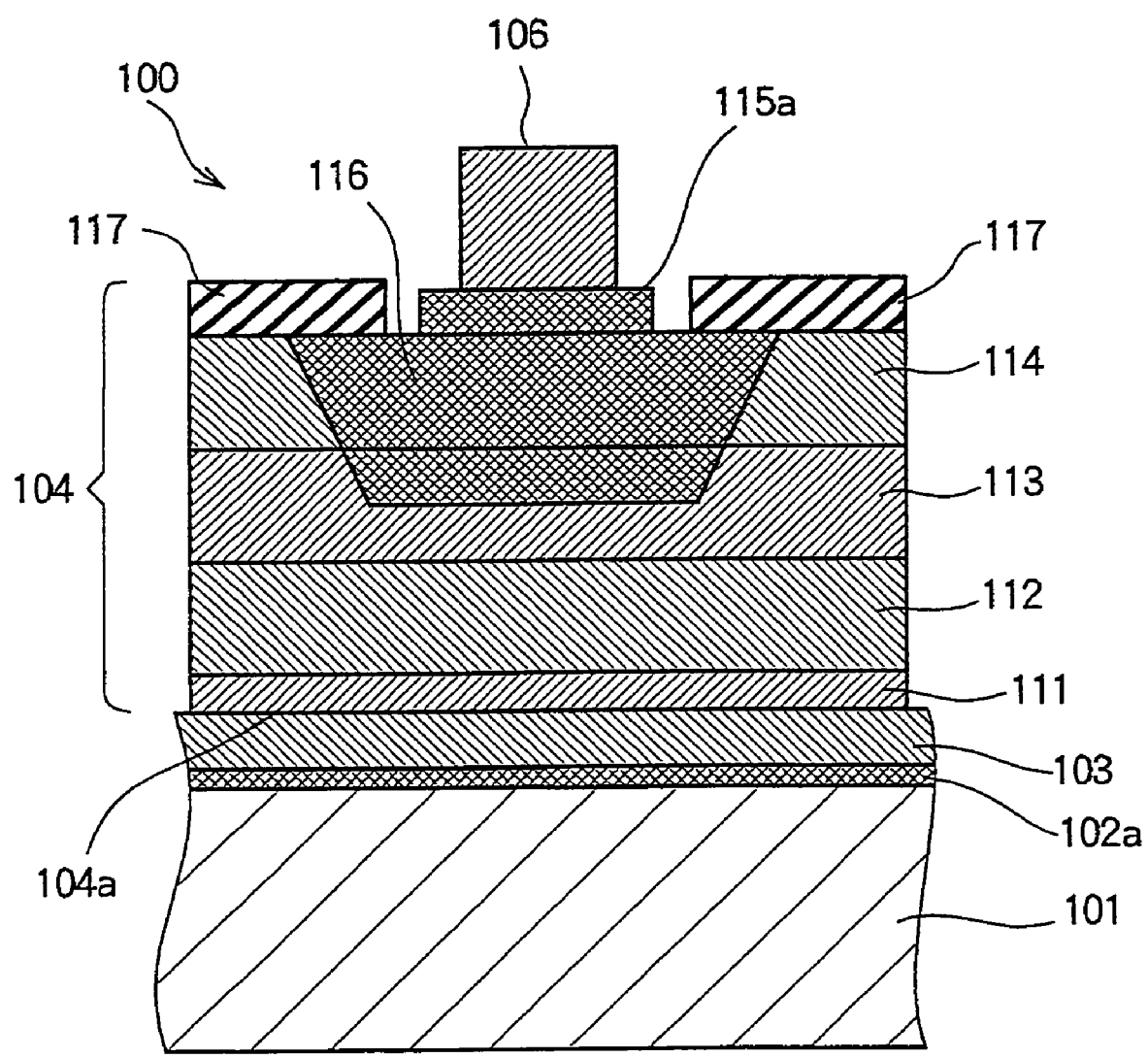
FIG. 5 is a cross sectional view schematically showing a cross section through line $S_3$-$S_3$ in FIG. 2 in a modification of the first embodiment.

FIG. 5 shows a modification of the first embodiment in which a common electrode area 102a is formed on the substrate 101 below the metal layer 103, making ohmic contact with the entire undersurface of the metal layer 103. An ohmic contact is also prepared between the metal layer 103 and the bottom surface 104a of the LED epitaxial film 104. The metal layer 103 serves a common electrode area for the LEDs. A ground potential or n-side potential is supplied to the metal layer 103 through the common electrode area 102a.

Figure 6:
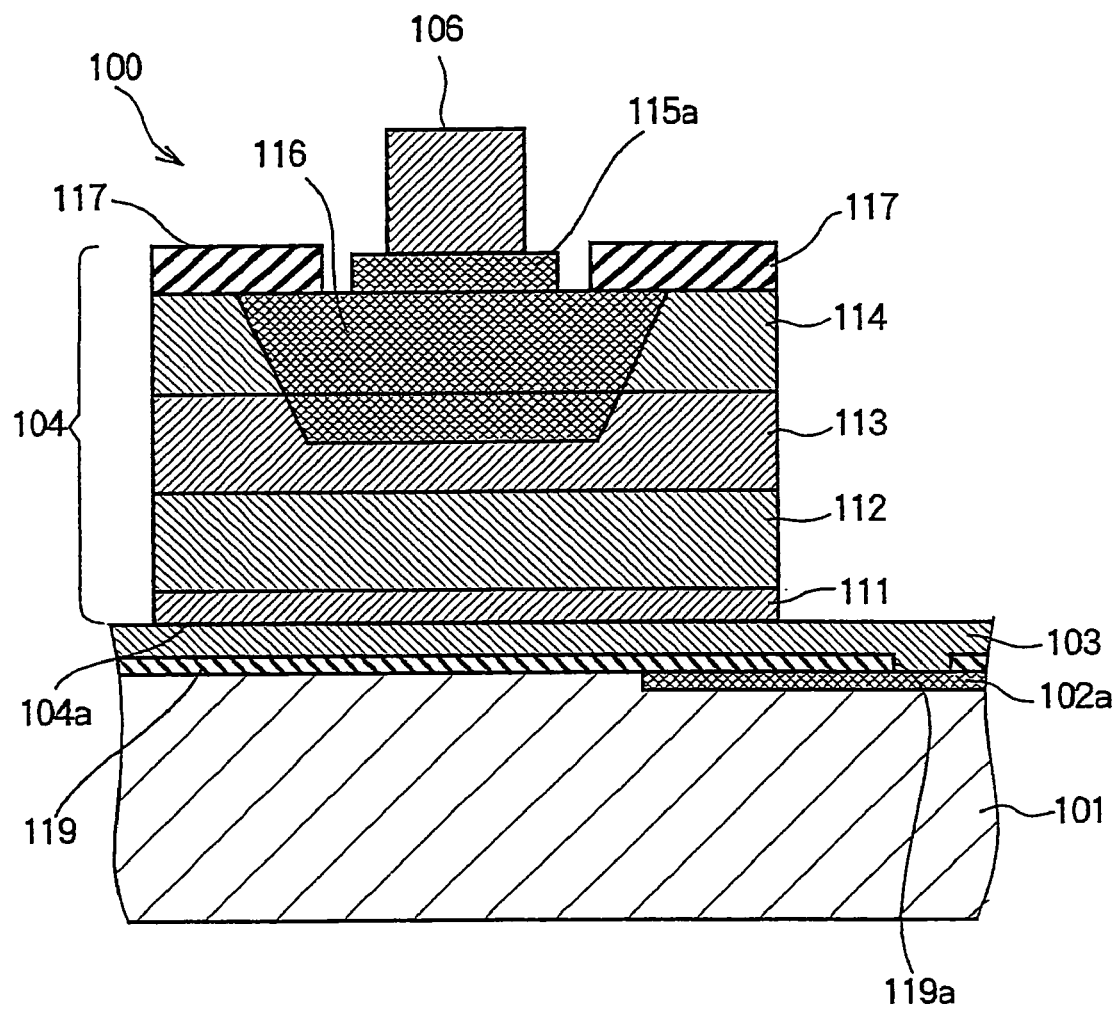
FIG. 6 is a cross sectional view schematically showing a cross section through line $S_3$-$S_3$ in FIG. 2 in a further modification of the first embodiment.

FIG. 6 shows a further modification of the first embodiment, in which a dielectric film 119, e.g., a silicon dioxide ($SiO_2$) layer, is formed between the metal layer 103 and the silicon substrate 101. An opening 119a is created in this dielectric layer 119 to permit the metal film 103 to make electrical contact with the common conductive area 102a and supply the common ground potential or n-side potential for driving the LEDs. The opening 119a is preferably located so that it will be near but not beneath the LED epitaxial film 104, because if the opening 119a is located beneath the LED epitaxial film 104, it may create topographic surface profile in the metal film 103, making it difficult to achieve a uniformly tight bonding between the LED epitaxial film 104 and the metal layer 103. The metal layer 103 may be connected directly to the common conductive area 102a formed on the silicon substrate 101 through the opening 119a as shown in FIG. 6, or it may be connected by an interconnecting line reaching from the metal layer 103 to the opening 119a.

Next, a fabrication process for the LED epitaxial film 104 will be described with reference to FIGS. 7, 8, 9A, 9B, and 10. The illustrated process simultaneously creates a plurality of LED epitaxial films 104, which may then be attached to a plurality of integrated LED/driving-IC chips 100.

Figure 7:
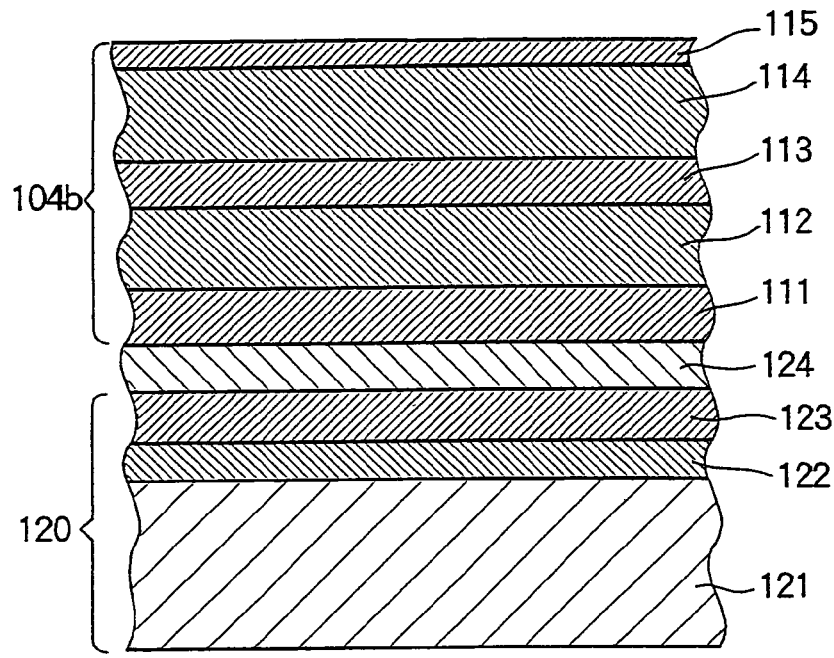
FIG. 7 is a cross sectional view schematically showing a first stage in an LED epitaxial-film fabrication process.
Figure 8:
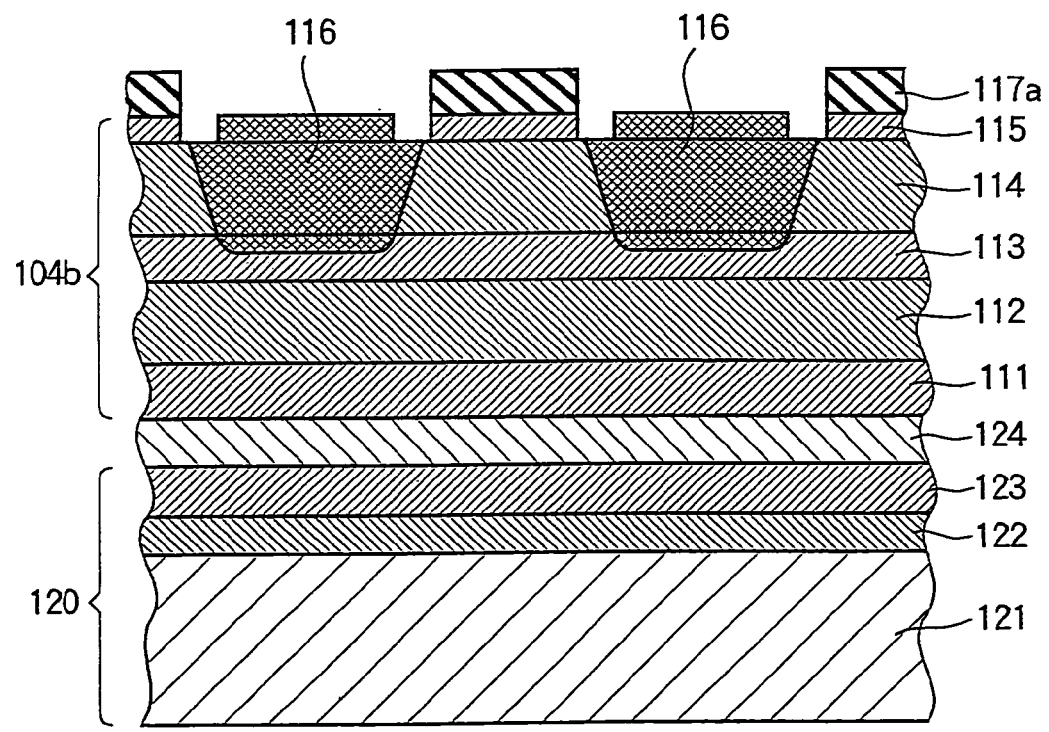
FIG. 8 is a cross sectional view schematically showing a second stage in the LED epitaxial-film fabrication process.

Referring to FIG. 7, the fabrication process begins with the formation of an LED epitaxial layer 104b on a fabrication substrate 120 by well-known techniques such as metal organic chemical vapor deposition (MOCVD) or molecular beam epitaxy (MBE). The LED epitaxial film fabrication substrate 120 in FIG. 7 includes a GaAs substrate 121, a GaAs buffer layer 122, an aluminum-arsenide indium phosphide ((AlAs)InP) etching stop layer 123, and an aluminum arsenide (AlAs) sacrificial layer 124. The n-type GaAs contact layer 111, n-type $Al_xGa_{1-x}As$ lower cladding layer 112, n-type $Al_yGa_{1-y}As$ active layer 113, n-type $Al_zGa_{1-z}As$ upper cladding layer 114, and n-type GaAs contact layer 115 are formed in this order on the AlAs sacrificial layer 124, creating an LED epitaxial layer 104b.

Referring to FIG. 8, an interlayer dielectric film 117a is now formed, openings are created therein, and a p-type impurity comprising zinc (Zn) is diffused through the appropriate openings by, for example, a solid-phase diffusion method to create the zinc diffusion regions 116. The diffusion source film (not shown) used for the solid-phase diffusion process is then removed to expose the surface of the GaAs contact layer 115 in the zinc diffusion regions 116. Due to the p-type impurity diffusion, the n-type GaAs contact layer 115 has become a p-type GaAs contact layer in these diffusion regions. The part of the GaAs contact layer 115 including the pn junction is preferably removed by etching, as shown in FIG. 8.

Figure 9A:
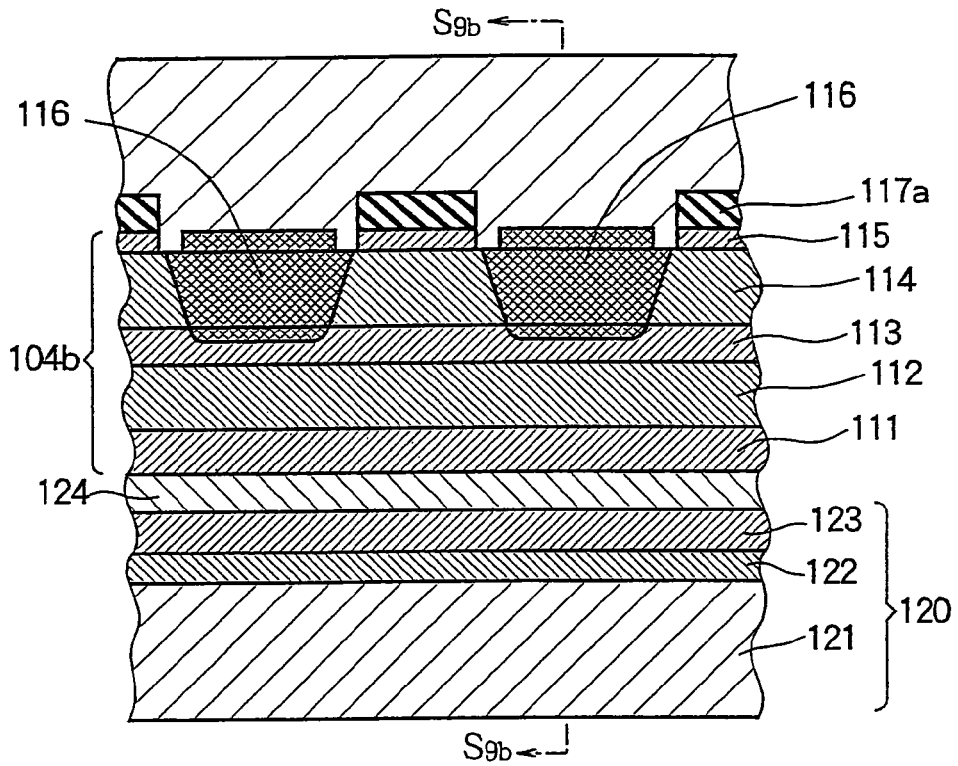
FIG. 9A is a cross sectional view schematically showing a third stage in the LED epitaxial-film fabrication process.
Figure 9B:
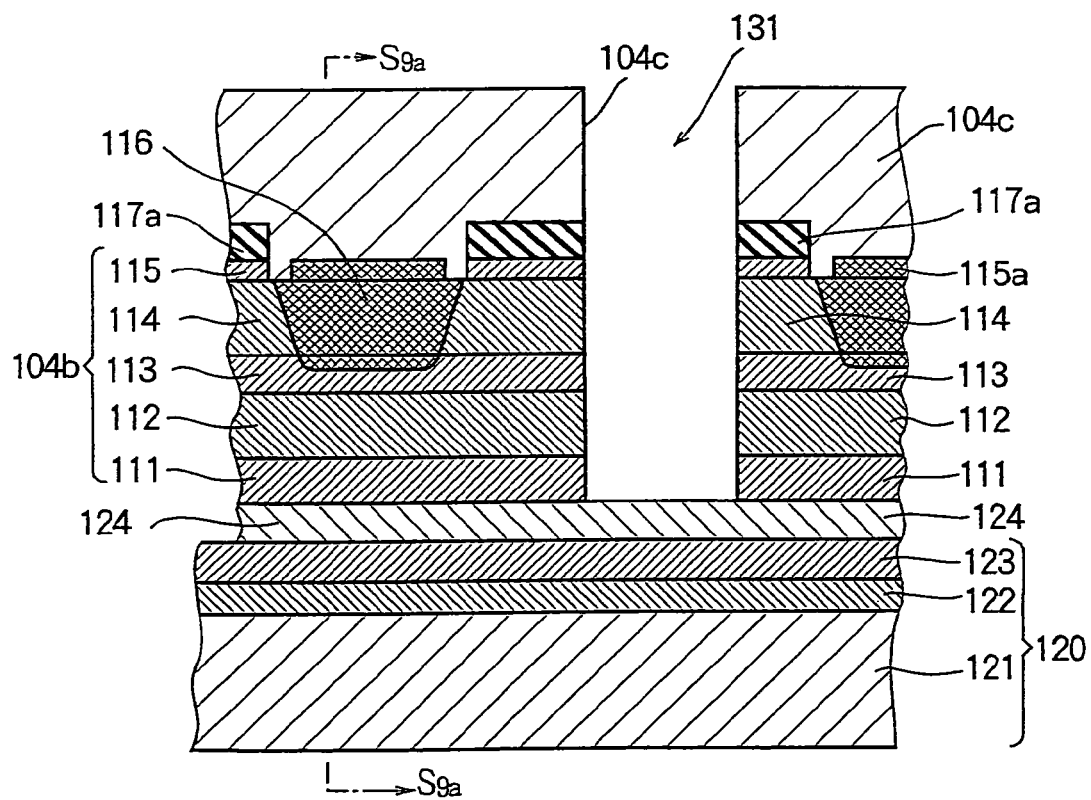
FIG. 9B is a cross sectional view schematically showing a cross section through line $S_{9b}$-$S_{9b}$ in FIG. 9A.

Referring FIGS. 9A and 9B, an LED epitaxial film supporting stuff 104c is deposited to facilitate to handle thin LED epitaxial film after removing the epitaxial film from the substrate 120. The LED epitaxial film supporting stuff 104c may comprise any suitable material, since it will ultimately be removed. Parallel trenches 131 are formed in the LED epitaxial film supporting stuff 104c and LED epitaxial layer 104b by photolithography and etching. For simplicity, the photoresist mask used in these processes is not shown in the drawings, and only one trench 131 is shown (in FIG. 9B). The etchant is a solution of phosphoric acid and hydrogen peroxide, which etches the AlGaAs layers (112, 113 and 114) and the GaAs layers (111 and 115) much faster in etching rate than the (AlGa)InP etching stop layer 123. Phosphoric acid/hydrogen peroxide solution does not readily etch the interlayer dielectric film 117a. Therefore before trench 131 is formed, the interlayer dielectric film on the area where the trench is to be formed is removed, for example, by dry-etching using $CF_4+O_2$ plasma. Then through the opening in the interlayer dielectric film, LED epitaxial film is etched, for example, by wet-etching using phosphoric acid/hydrogen peroxide solution. The (AlGa)InP etching stop layer 123 ensures that the trench etching does not go to the GaAs substrate 121.

FIG. 9A, which shows a cross section through line $S_{9A}$-$S_{9A}$ in FIG. 9B, gives a side view of LEDs (structure of the diffusion regions and the interlayer-dielectric-film layer) in one LED epitaxial film 104. FIG. 9B shows a cross sectional view at the trench region between two individual LED epitaxial films. The interval between trenches 131 defines the LED epitaxial film width denoted $W_1$ in FIG. 2. From material-cost point of view, the width $W_1$ is preferably less than 300 µm; more preferably, $W_1$ is less than 100 µm, such as a width of 50 µm, as mentioned earlier. Part of the surface or side of the sacrificial layer should be, at least, exposed to a sacrificial-layer etching solution by forming the trench 131 to lift-off the LED epitaxial film 104b from the substrate 120 by selectively etching the sacrificial layer 124. Etching solution (for example, 10% hydrofluoric acid) goes through the trench to the sacrificial layer, and too narrow $W_1$ may have an influence on etching speed for etching the sacrificial layer; the width $W_1$ is preferably larger than 10 µm.

Referring to FIG. 10, after the formation of trenches 131, the LED epitaxial film supporting stuff 104c is held by suitable means and the AlAs sacrificial layer 124 is selectively etched with a 10% hydrofluoric acid (HF) solution. The etching-resist mask which is used to form the trenches may also be used as the supporting stuff 104. Since the HF etching rate of the AlAs layer 124 is much faster than that of the AlGaAs layers 112 to 114, the GaAs layers 111, 115, 121, and 122 and the (AlGa)InP etching stop layer 123, the AlAs sacrificial layer 124 can be etched without significant damage to these other layers. FIG. 10 shows an intermediate stage in the sacrificial-layer etching process, in which part of the AlAs sacrificial layer 124 still remains. By the end of the etching process, the AlAs sacrificial layer 124 is completely removed, enabling the LED epitaxial film 104 to be separated from the fabrication substrate 120.

After the AlAs sacrificial layer 124 has been completely removed by etching, the LED epitaxial film 104 is immersed in deionized water so that no etching solution residue remains. Then the LED epitaxial film 104 is lifted from the fabrication substrate 120 by, for example, a vacuum suction jig, transferred to the metal layer 103 on the silicon substrate 101, and bonded thereto as explained above. The LED epitaxial film supporting stuff 104c is now removed, another interlayer dielectric film 117a is formed, and the individual interconnecting lines 106 are formed.

As shown in FIG. 4D, the interlayer dielectric film 117 must be formed on part of the silicon substrate 101 as well as on the LED epitaxial film 104. Accordingly, the interlayer dielectric film 117 may be formed partly or entirely after the LED epitaxial film 104 has been bonded to the metal film 103.

First effect of the first embodiment is that since the LED epitaxial film 104 is electrically connected to a common ground or n-side electrode in the silicon substrate 101 through the metal layer 103, and to the individual driving IC output electrode pad 107a of the driving circuits 107 through the individual interconnecting lines 106, no wire-bonding connections need be made between the LED epitaxial film 104 and its driving circuits 107. Assembly costs can therefore be reduced.

Second effect is that, since it is not necessary to provide electrode pads for wire bonding on the LED epitaxial film 104, space can be saved and the area occupied by the LED epitaxial film 104 can be much smaller than the area occupied by a conventional LED array chip. Furthermore, since the LED epitaxial film 104 is supported by the silicon substrate 101 and need not be thickened to provide strength for wire bonding, it can be much thinner than a conventional LED array chip. These effects lead to a substantial reduction in material costs. The fabrication substrate 120 can be reused after lifting-off the LED epitaxial film. Thus, the necessary amount of relatively expensive compound semiconductor materials such as gallium arsenide can be greatly reduced, as compared with conventional LED array chips.

A further effect is that, since the LEDs 105 in the LED epitaxial film 104 are close to their driving circuits 107, the individual interconnecting lines 106 can be correspondingly short, leading to a reduction in electrical resistance, not to mention an overall reduction in the integrated width of the apparatus including the LEDs and their driving circuits. The integrated LED/driving-IC chip 100 thus takes up less space and can operate on less power than a conventional paired LED array chip and driver IC chip.

Furthermore, in the integrated LED/driving-IC chip 100 of the first embodiment, the metal layer 103 is disposed below the epitaxial film 104, and the epitaxial film 104 has an extremely thin thickness, for example, a thickness of about 2 µm. Accordingly, not only light is directly emitted upward from the LED 105 but also light emitted downward from the LED 105 is reflected by a surface of the metal layer 103 to travel upward through the epitaxial film 104. Therefore, luminous intensity of the integrated LED/driving-IC chip 100 can be increased.

Figure 11:
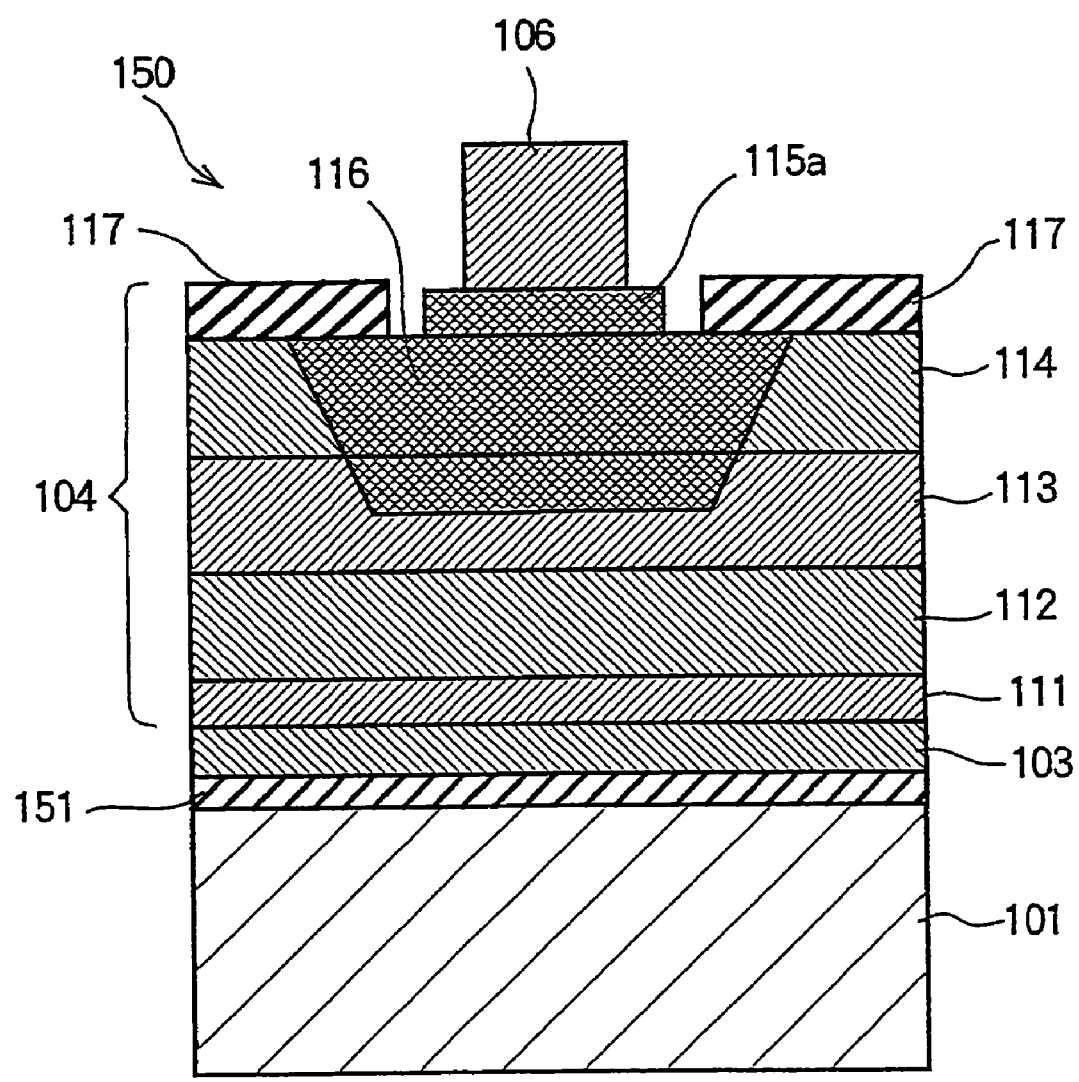
FIG. 11 is a cross sectional view schematically showing an integrated LED/driving-IC chip according to another modification of the first embodiment.

Referring to FIG. 11, in another modification of the first embodiment, the integrated LED/driving-IC chip 150 includes a dielectric film 151 disposed between the silicon substrate 101 and metal layer 103. An opening (not shown) is provided in the dielectric film 151 so that the metal film 103 can be connected to a ground terminal or n-side terminal in the silicon substrate 101, as in FIG. 6. The difference between FIGS. 6 and 11 is that in FIG. 11, the metal layer 103 overlies the part of the silicon substrate 101 in which the integrated circuit 102 is formed, so that the total width of the integrated LED/driving-IC chip 150 is further reduced. In other respects, the modification shown in FIG. 11 is similar to the integrated LED/driving-IC chips 100 illustrated in FIGS. 1 through 10.

Second Embodiment

Figure 12:
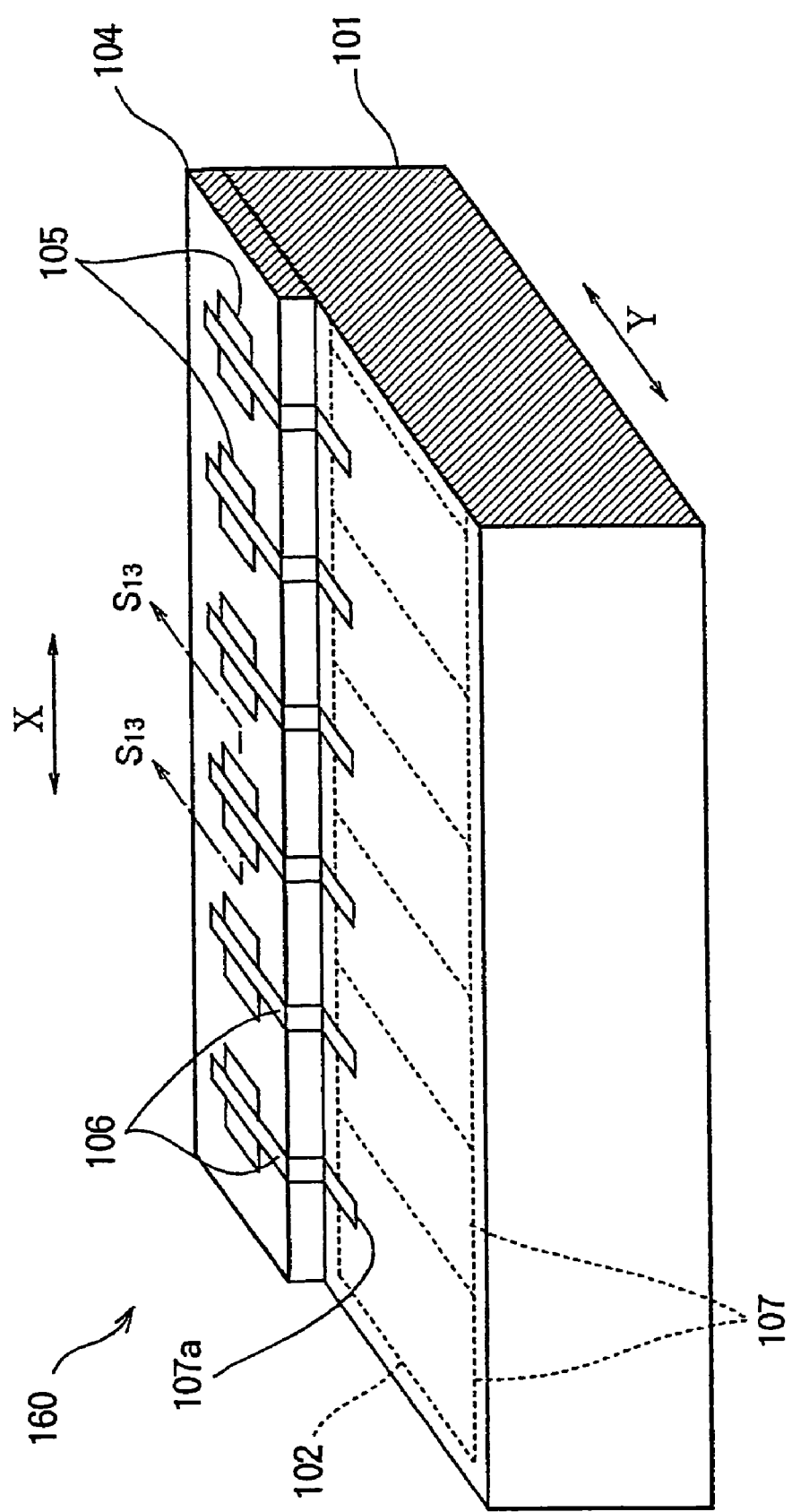
FIG. 12 is a perspective view schematically showing part of an integrated LED/driving-IC chip according to a second embodiment.
Figure 13:
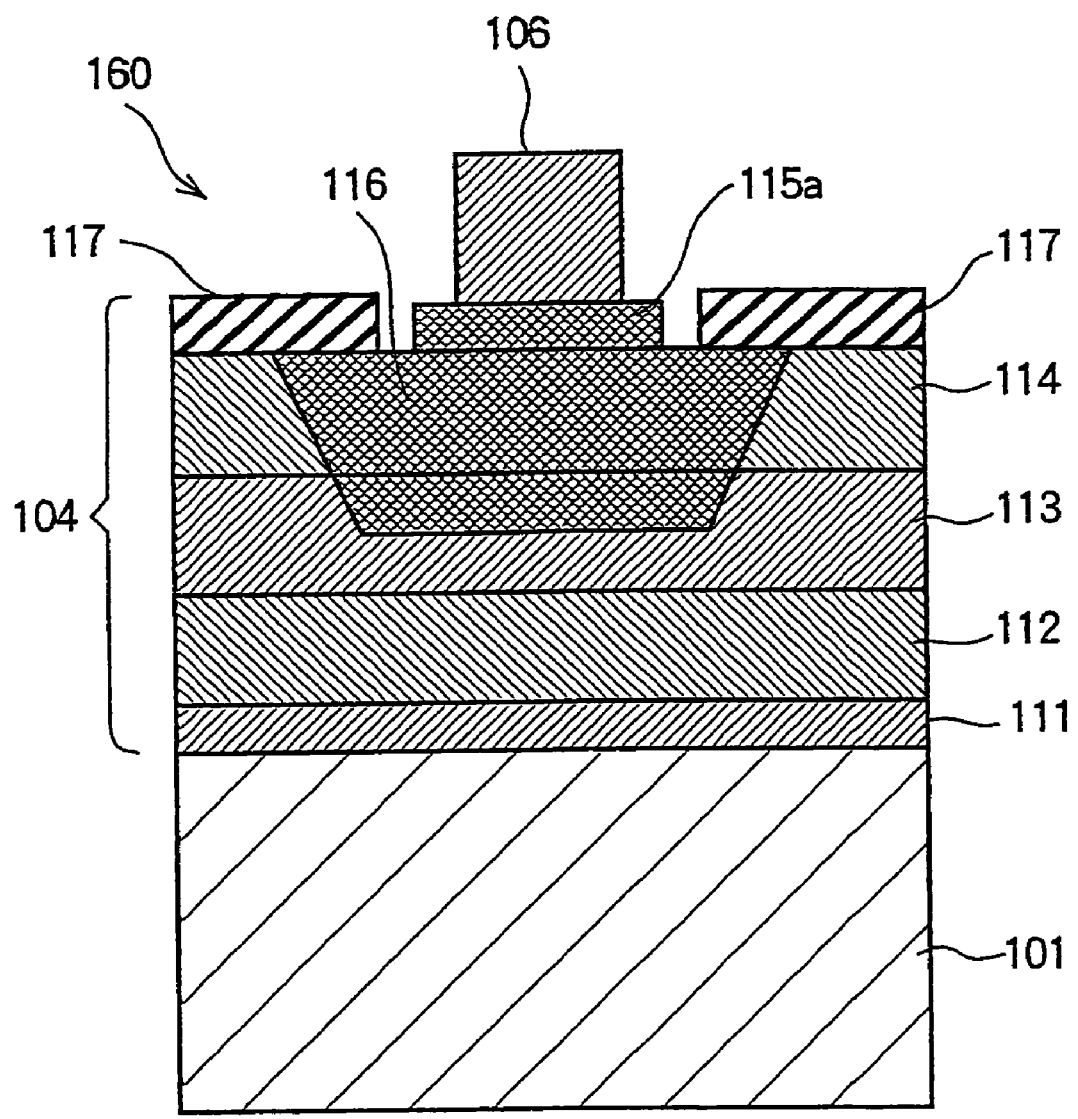
FIG. 13 is a cross sectional view schematically showing a cross section through line $S_{13}$-$S_{13}$ in FIG. 12.

A second embodiment of the invented semiconductor apparatus is shown schematically in partial perspective view in FIG. 12 and partial cross sectional view in FIG. 13. This integrated LED/driving-IC chip 160 differs from the integrated LED/driving-IC chip 100 in the first embodiment in that there is no metal layer between the LED epitaxial film 104 and the silicon substrate 101. The upper surface of the silicon substrate 101 and lower surface of the LED epitaxial film 104 are treated by an appropriate chemical method to remove contaminants and provide planarization to, for example, the order of one atomic layer, after which these two surfaces are placed in tight contact and bonded together by the application of pressure and heat.

Although the heating temperature necessary to achieve secure bonding is higher in the second embodiment than in the first embodiment, the second embodiment eliminates the possibility of bonding defects caused by defects in the metal layer interposed between the LED epitaxial film and the silicon substrate in the first embodiment.

In addition, due to the interposed metal layer 103 in the first embodiment, two bonding processes and two alignment processes must be carried out, the LED epitaxial film 104 being aligned with respect to the metal layer 103 in one alignment process, the metal layer 103 being aligned with respect to the array of driving circuits 107 in the other alignment process. The number of possible factors leading to misalignment between the LED epitaxial film 104 and the driving circuit pattern is multiplied accordingly. In the second embodiment, the LED epitaxial film 104 can be aligned directly with the driving circuit pattern, so the alignment margin can be reduced, in comparison to the first embodiment. The margin for alignment of the individual interconnecting lines 106 with the LEDs 105 and the individual driving terminals 107a of the driving circuits 107 can also be reduced.

Aside from the absence of the metal layer, the second embodiment is identical to the first embodiment.

Third Embodiment

Figure 14:
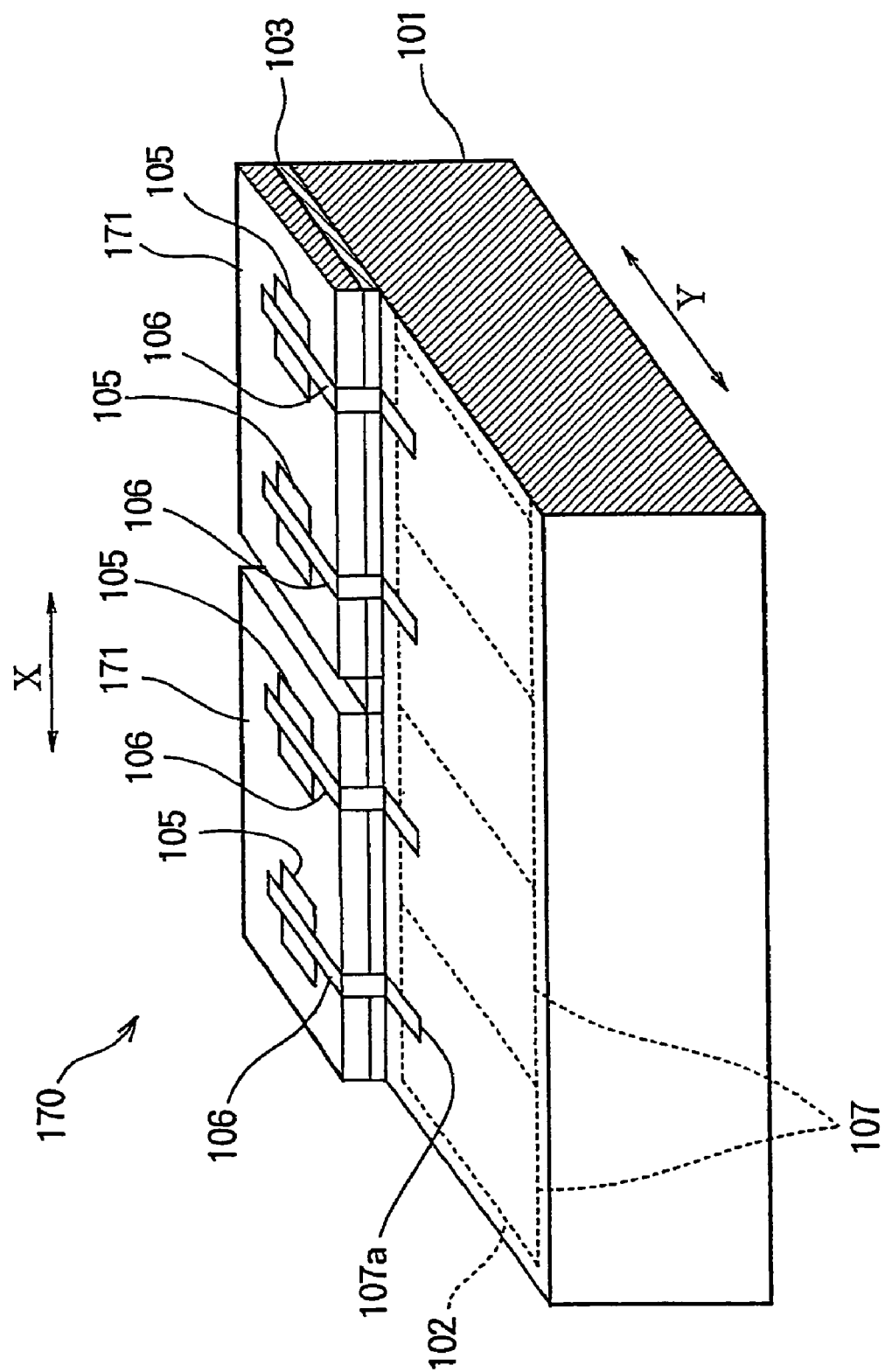
FIG. 14 is a perspective view schematically showing part of an integrated LED/driving-IC chip according to a third embodiment of the invention.
Figure 15:
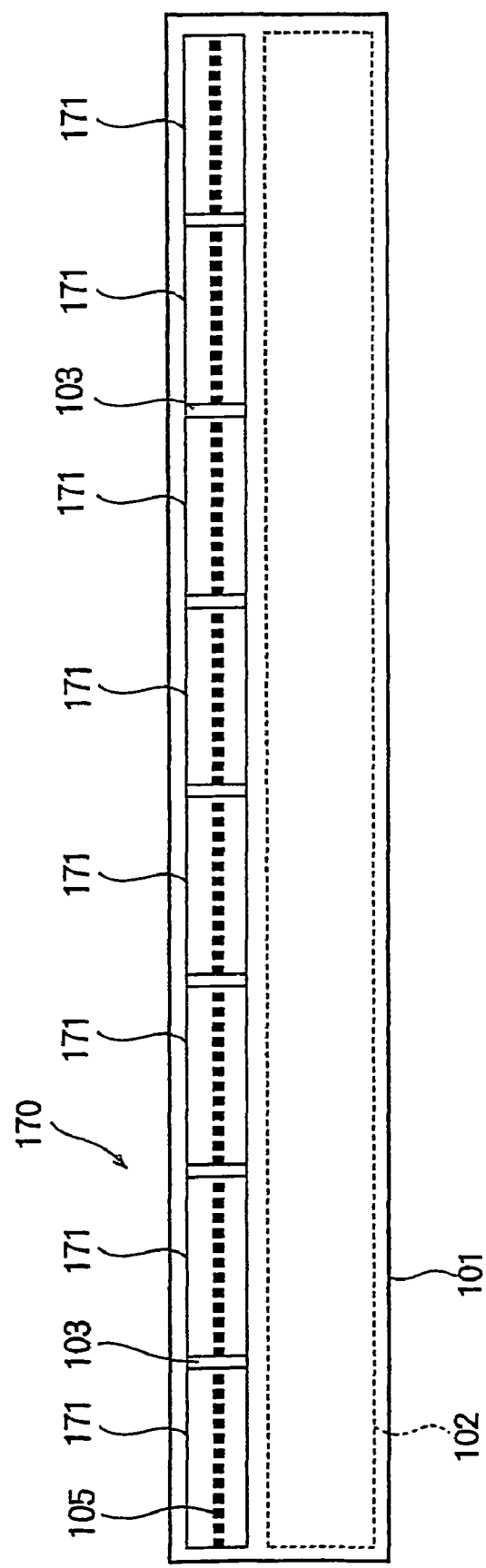
FIG. 15 is a plan view schematically showing the integrated LED/driving-IC chip in FIG. 14.
Figure 16:
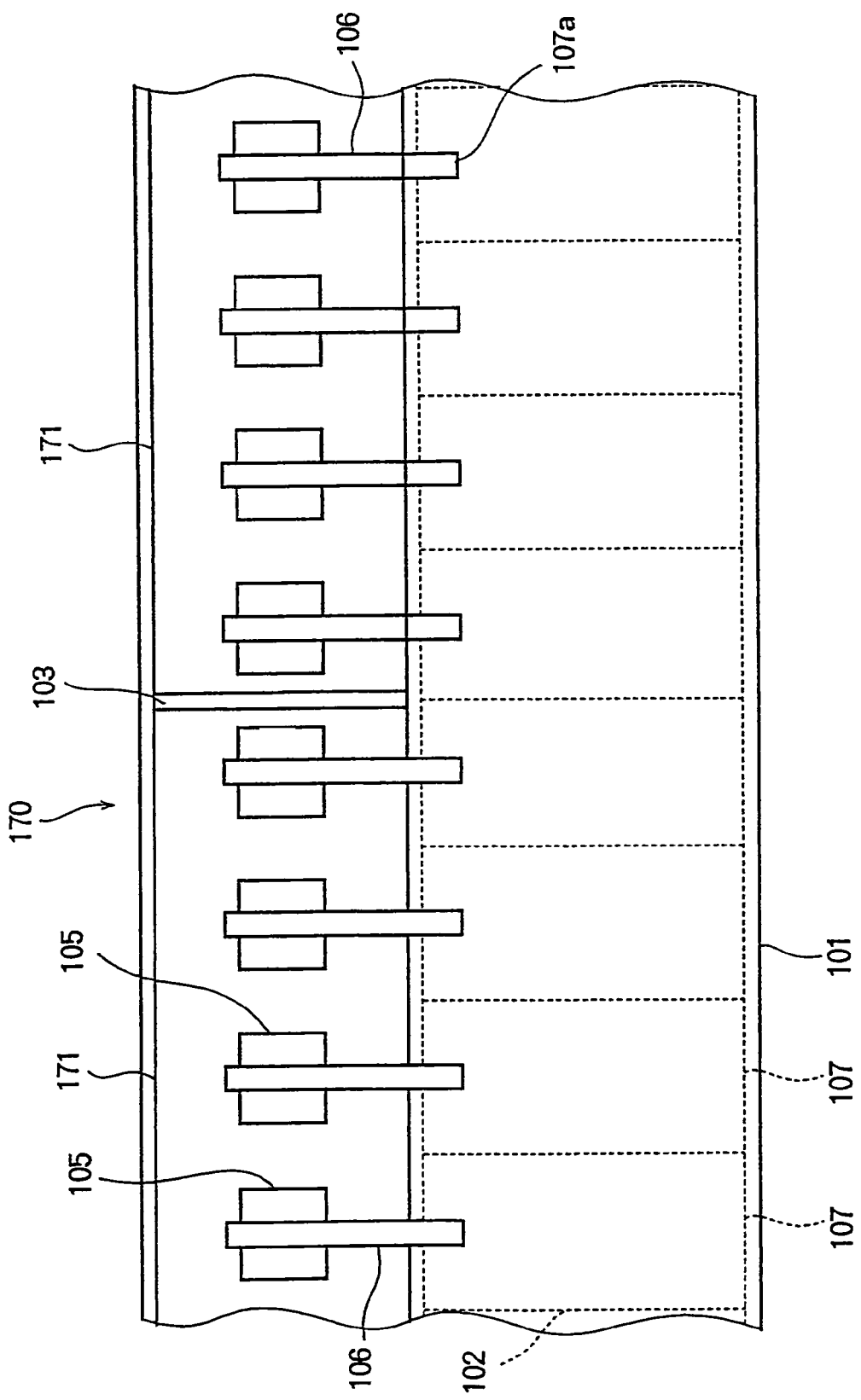
FIG. 16 is a plan view schematically showing part of the integrated LED/driving-IC chip in FIG. 14.

A third embodiment of the invented semiconductor apparatus is shown schematically in partial perspective view in FIG. 14, in plan view in FIG. 15, and in an enlarged partial plan view in FIG. 16. In this integrated LED/driving-IC chip 170, the single LED epitaxial film of the first embodiment is divided into a plurality of LED epitaxial films 171, which are attached separately to the metal layer 103 on the silicon substrate 101. In other respects, the integrated LED/driving-IC chip 170 of third embodiment is similar to the integrated LED/driving-IC chip 100 of the first embodiment.

In one example of the third embodiment, the integrated LED/driving-IC chip 170 is designed for use in a printer with a resolution of six hundred dots per inch (600 dpi), so the array pitch of the LEDs 105 is 42.4 μm. When each LED epitaxial film 171 includes twenty-four LEDs 105, the length of one LED epitaxial film 171 is about one millimeter (42.4 □m×24=1.0176 mm). When the integrated LED/driving-IC chip 170 includes eight LED epitaxial films 171, thus including 192 LEDs. The total length of the integrated LED/driving-IC chip is about eight millimeters (1.0176 mm×8=8.1408 mm).

According to the integrated LED/driving-IC chip 170 of the third embodiment, since it is possible to make the length of the LED epitaxial films 171 short even when a large number of LEDs 105 are included in one integrated LED/driving-IC chip 170, handling of the LED epitaxial films 171 becomes easier in the fabrication process.

The short length of the LED epitaxial films 171 also facilitates uniform and secure bonding of their entire lower surfaces to the upper surface of the metal layer 103, enabling a high fabrication yield to be obtained.

Since uniform bonding is obtained, the uniformity of the electrical and light-emitting characteristics of the LEDs 105 in the LED epitaxial film 171 is improved.

Furthermore, since the LED epitaxial film is divided into short lengths, the internal stress that develops in the LED epitaxial film due to temperature changes is reduced, thereby mitigating one cause of LED failure and improving the reliability of the LEDs 105.

Figure 17:
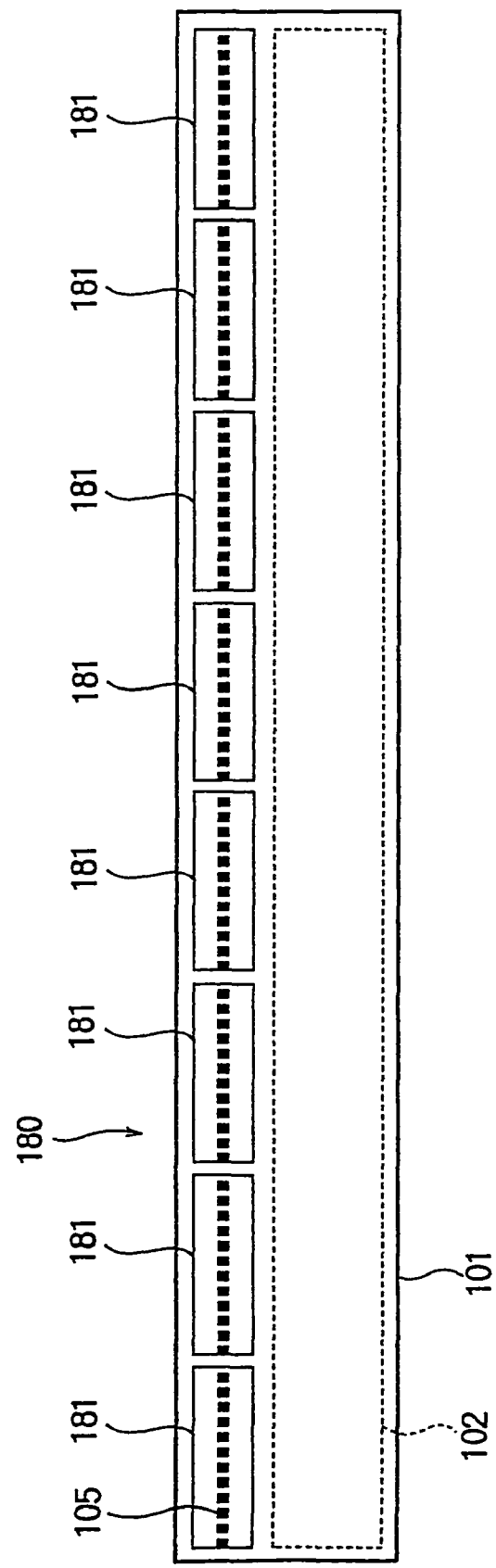
FIG. 17 is a plan view schematically showing an integrated LED/driving-IC chip according to a modification of the third embodiment.

In a modification of the third embodiment shown in plan view in FIG. 17, the integrated LED/driving-IC chip 180 has no metal layer 103; the LED epitaxial films 181 are bonded directly to the silicon substrate 101, as in the second embodiment. In other respects, the modification shown in FIG. 17 is identical to the integrated LED/driving-IC chip 170 shown in FIGS. 14 through 16.

Fourth Embodiment

Figure 18:
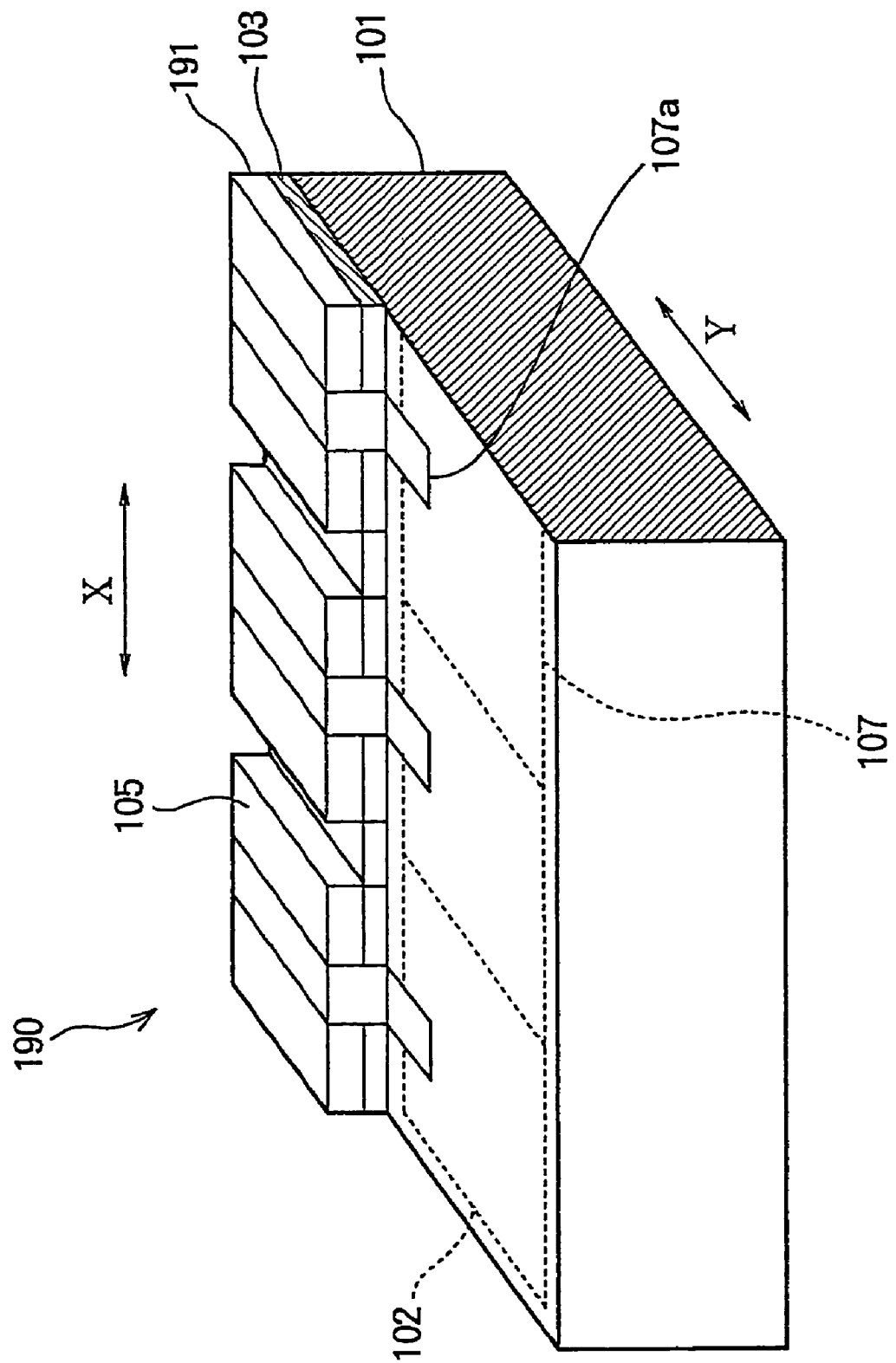
FIG. 18 is a perspective view schematically showing part of an integrated LED/driving-IC chip according to a fourth embodiment.
Figure 19:
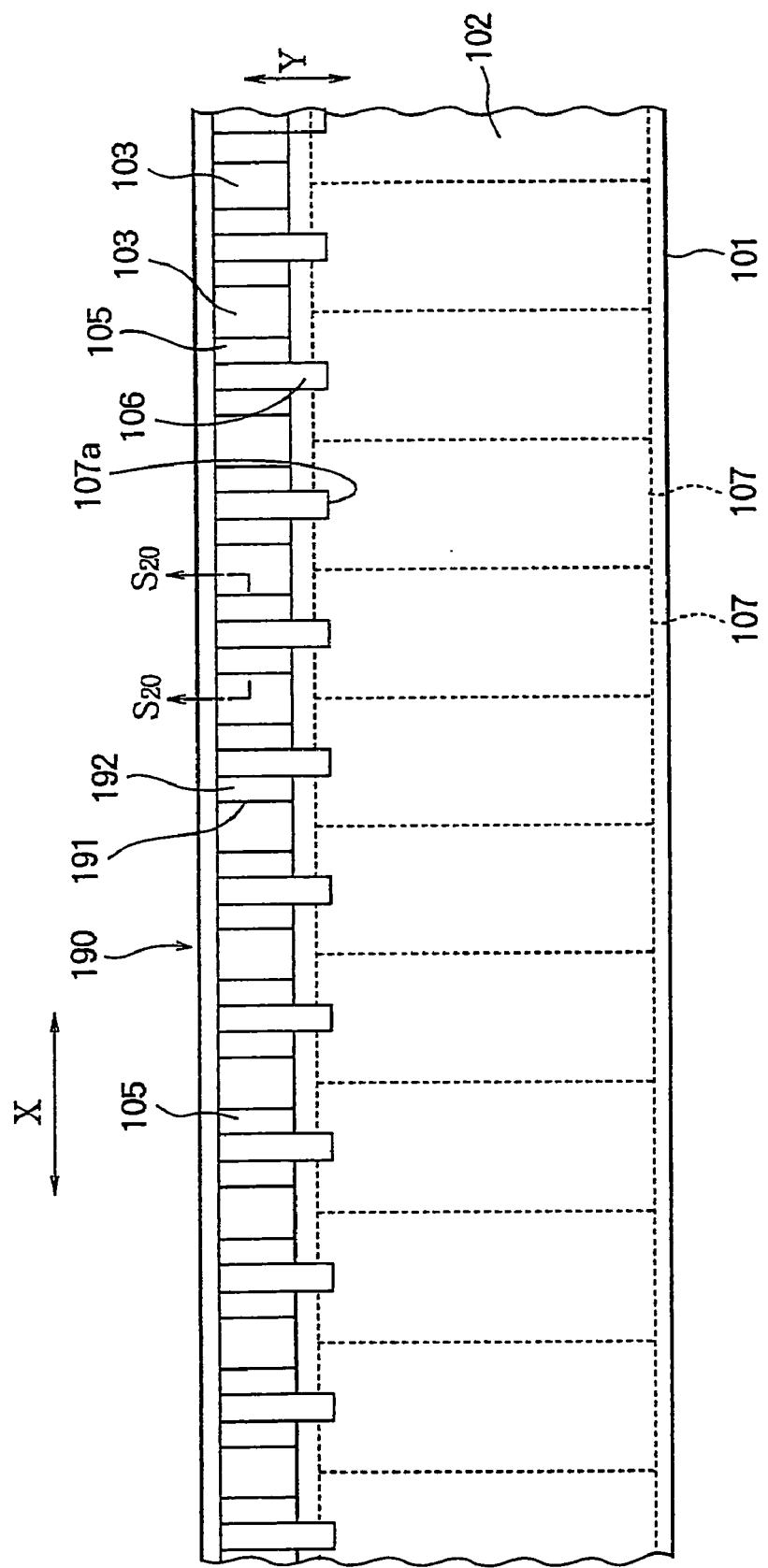
FIG. 19 is a plan view schematically showing part of the integrated LED/driving-IC chip in FIG. 18.
Figure 20:
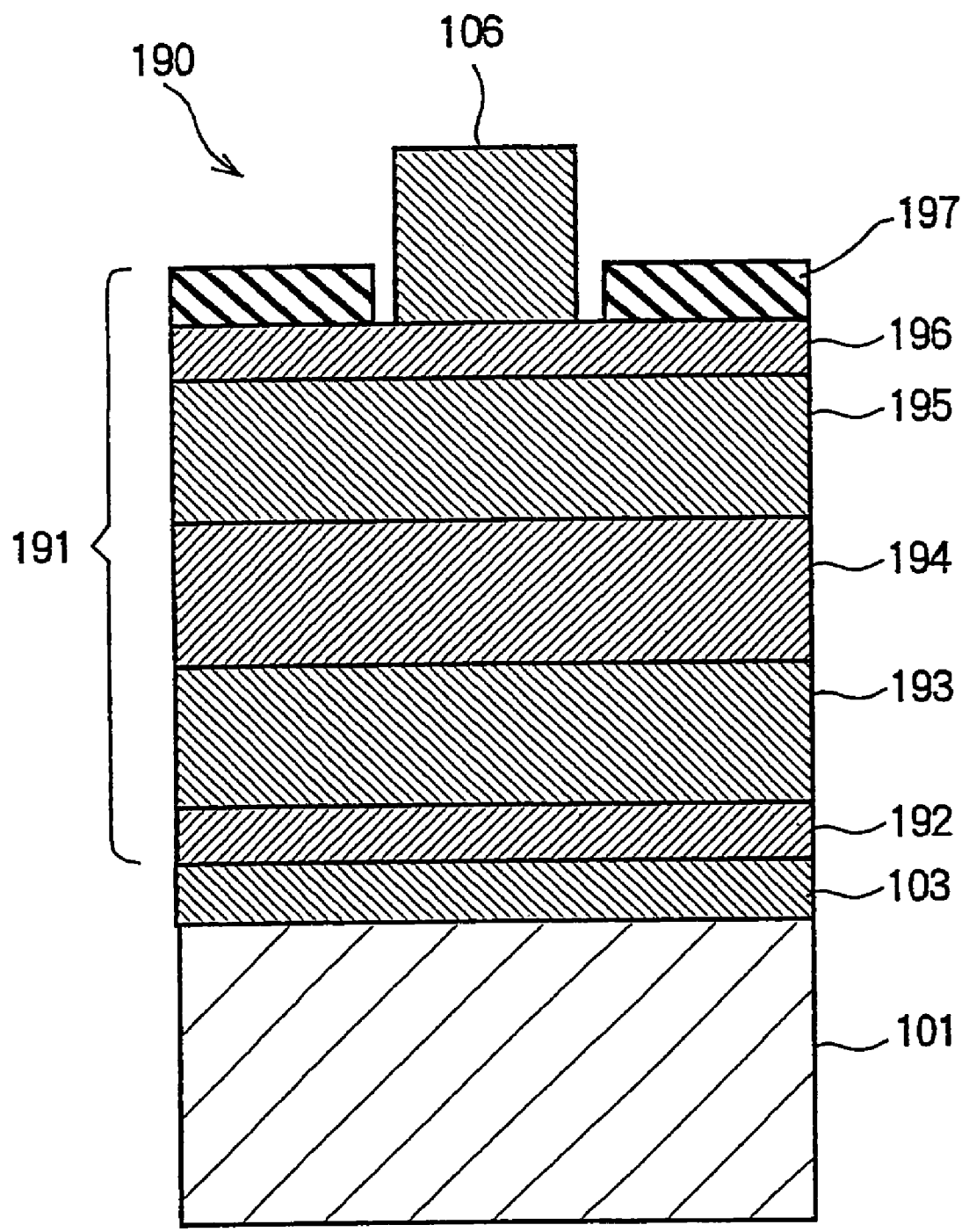
FIG. 20 is a cross sectional view schematically showing a cross section through line $S_{20}$-$S_{20}$ in FIG. 19.

A fourth embodiment of the invented semiconductor apparatus is shown schematically in partial perspective view in FIG. 18, partial plan view in FIG. 19, and partial cross sectional view in FIG. 20. The integrated LED/driving-IC chip 190 in this embodiment differs from the integrated LED/driving-IC chip 100 in the first embodiment in that each LED 105 is formed as a separate LED epitaxial film 191. The LED epitaxial films 191 are bonded onto the metal layer 103 in a row, spaced at regular intervals.

Each LED epitaxial film 191 has a structure shown in FIG. 20, comprising a p-type GaAs lower contact layer 192, a p-type $Al_xGa_{1-x}As$ lower cladding layer 193, a p-type $Al_yGa_{1-y}As$ active layer 194, an n-type $Al_zGa_{1-z}As$ upper cladding layer 195, and an n-type GaAs upper contact layer 196. The Al composition ratios x, y, z may satisfy the conditions x>y and z>y (for example, x=z=0.4, y=0.1).

The LED epitaxial film 191 is not limited to the double hetero-junction structure and composition ratios described above. For example, a single hetero-junction or a homo-junction structure may be employed. Even with a double hetero-junction structure, some modifications are possible, such as a non-doped active layer, a quantum well active layer, and so on. As another modification, the upper layers may be p-type layers and the lower layers n-type layers.

A dielectric film 197 is formed on the n-type GaAs layer 196. An opening is formed in the dielectric film 197 to allow the individual interconnecting line 106 to make contact with the surface of the n-type GaAs upper contact layer 196. The individual interconnecting line 106 extends to the terminal region 107a of the corresponding driving circuit 107, as shown in FIG. 18.

One effect of the fourth embodiment is that, since each LED epitaxial film 191 is extremely small, temperature-induced internal stress in the LED epitaxial film, which becomes significant if the thermal expansion coefficient of the LED epitaxial film differs greatly from that of the silicon substrate 101, is greatly reduced, and one of the factors that can lead to LED failure is substantially eliminated. The reliability of the integrated LED/driving-IC chip 190 is enhanced accordingly.

A further effect is that, since the LED epitaxial film 191 does not include any parts other than the light-emitting region, the width of the LED epitaxial film can be reduced and the length of the individual interconnecting lines 106 can be correspondingly reduced.

Except for the foregoing points, the fourth embodiment is identical to the first embodiment.

In a modification of the fourth embodiment, the metal layer 103 is omitted, as in the second embodiment.

Fifth Embodiment

Figure 21:
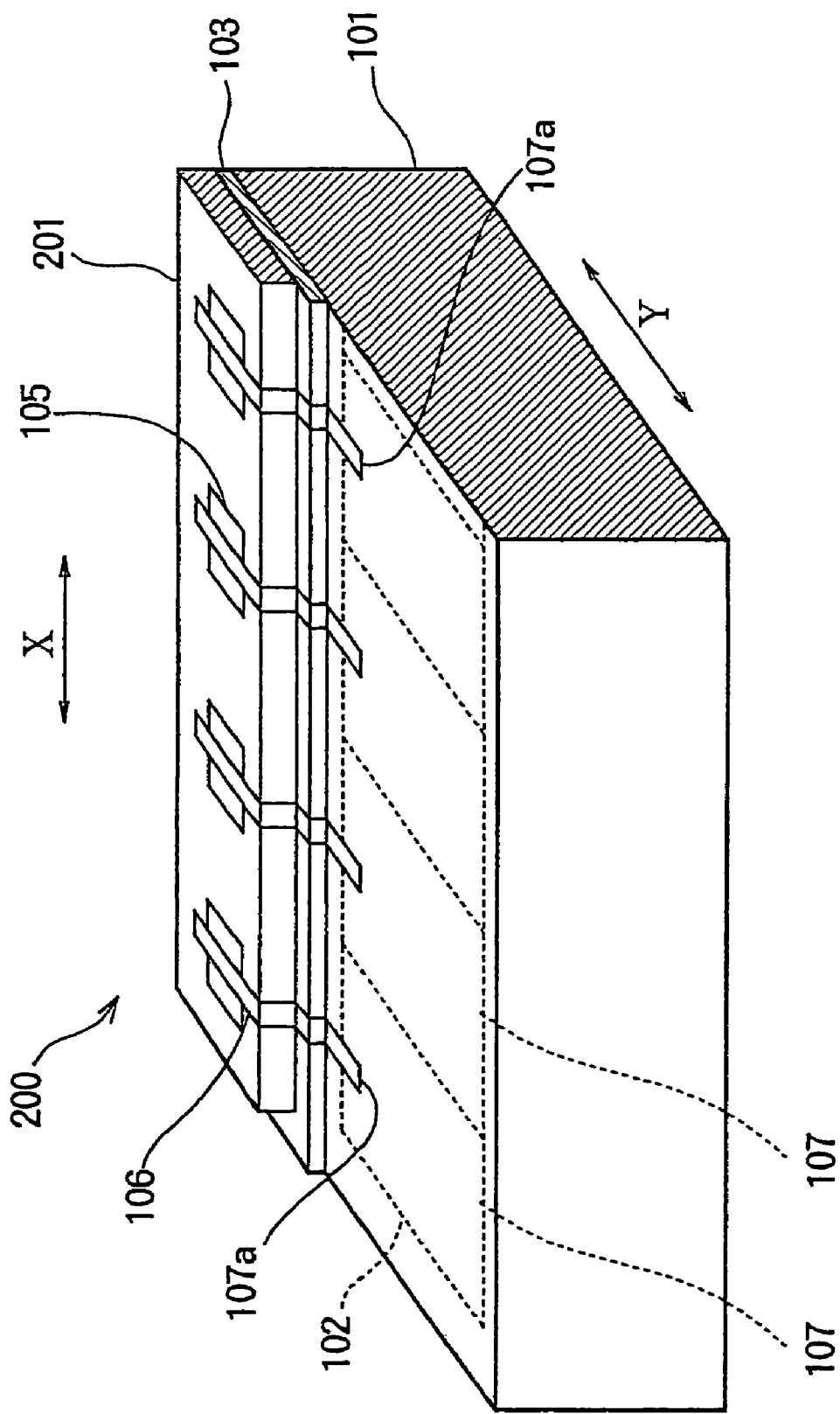
FIG. 21 is a perspective view schematically showing part of an integrated LED/driving-IC chip according to a fifth embodiment of the invention.
Figure 22:
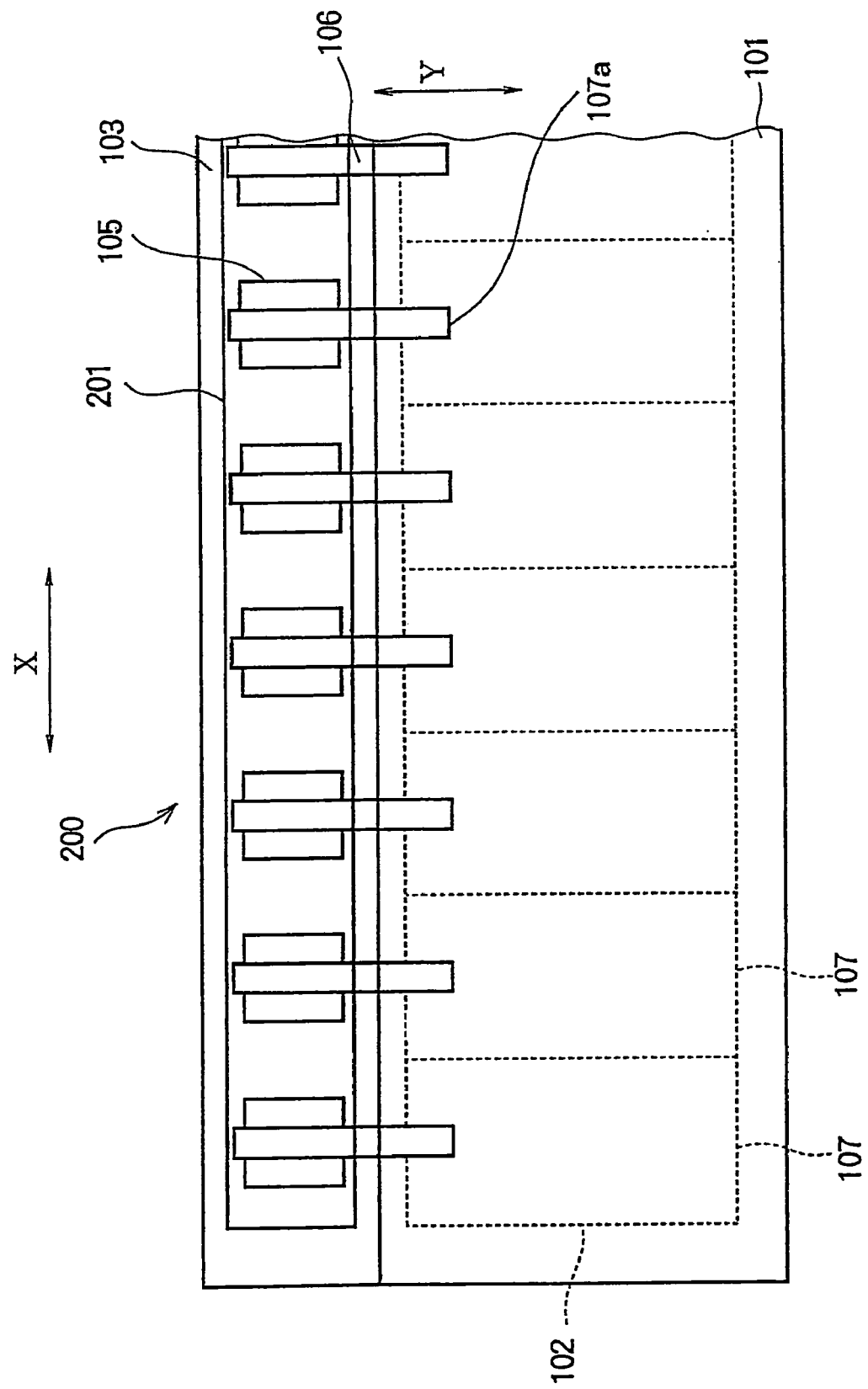
FIG. 22 is a plan view schematically showing part of the integrated LED/driving-IC chip in FIG. 21.

A fifth embodiment of the invented semiconductor apparatus is shown schematically in partial perspective view in FIG. 21 and partial plan view in FIG. 22. The integrated LED/driving-IC chip 200 in the fifth embodiment differs from the integrated LED/driving-IC chip 100 in the first embodiment in that the LED epitaxial film 201 is shorter than the metal layer 103 in both the X- and Y-directions, all four edges of the LED epitaxial film 201 thus being located inward of the edges of the metal layer 103. This structure facilitates alignment during bonding the LED epitaxial film 201 to the metal layer 103.

Except for this difference, the fifth embodiment is identical to the first embodiment.

In a modification of the fifth embodiment, the LED epitaxial film 201 is divided into a plurality of sections as in the third embodiment.

Sixth Embodiment

Figure 23:
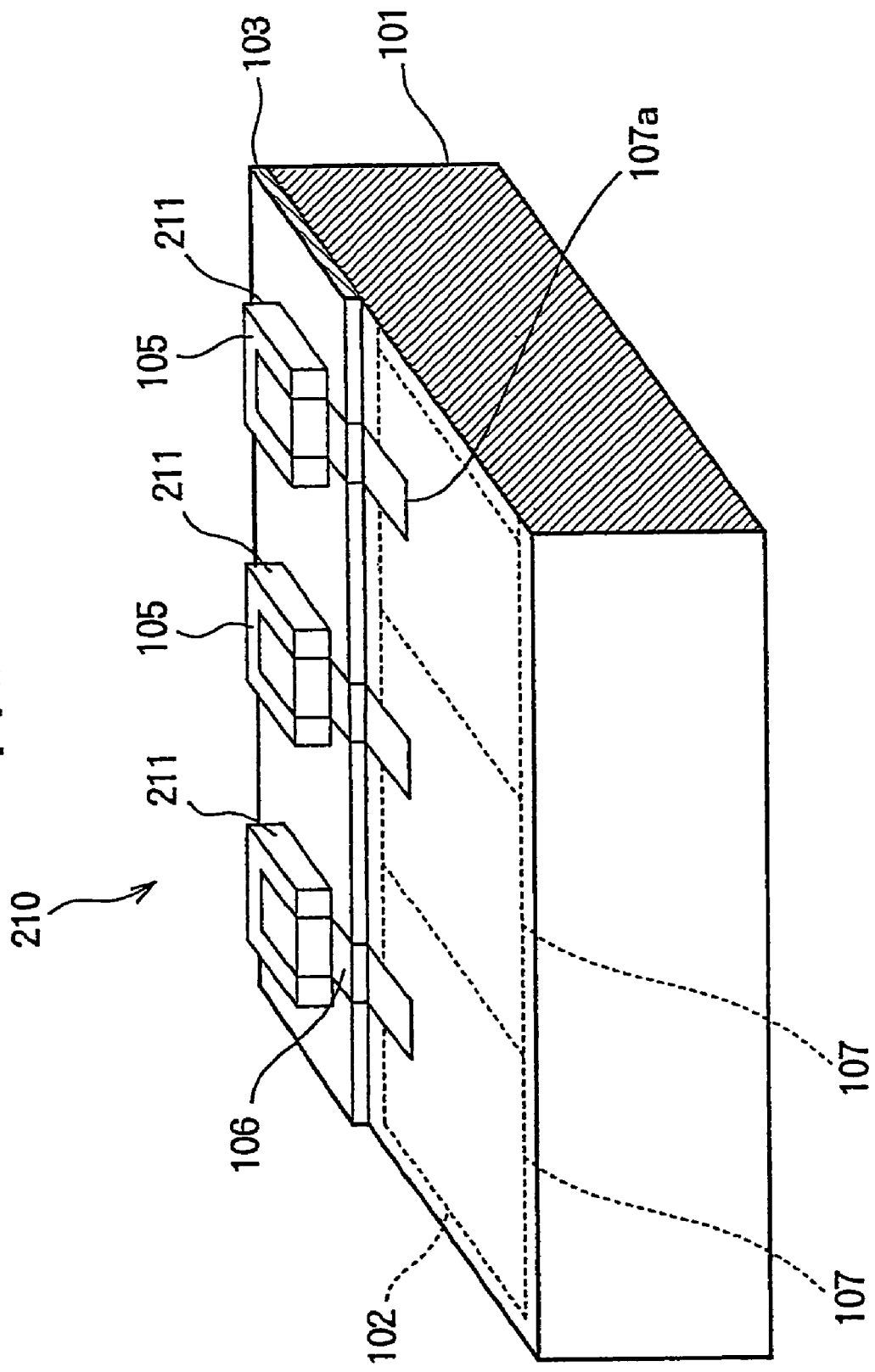
FIG. 23 is a perspective view schematically showing part of an integrated LED/driving-IC chip according to a sixth embodiment of the invention.
Figure 24:
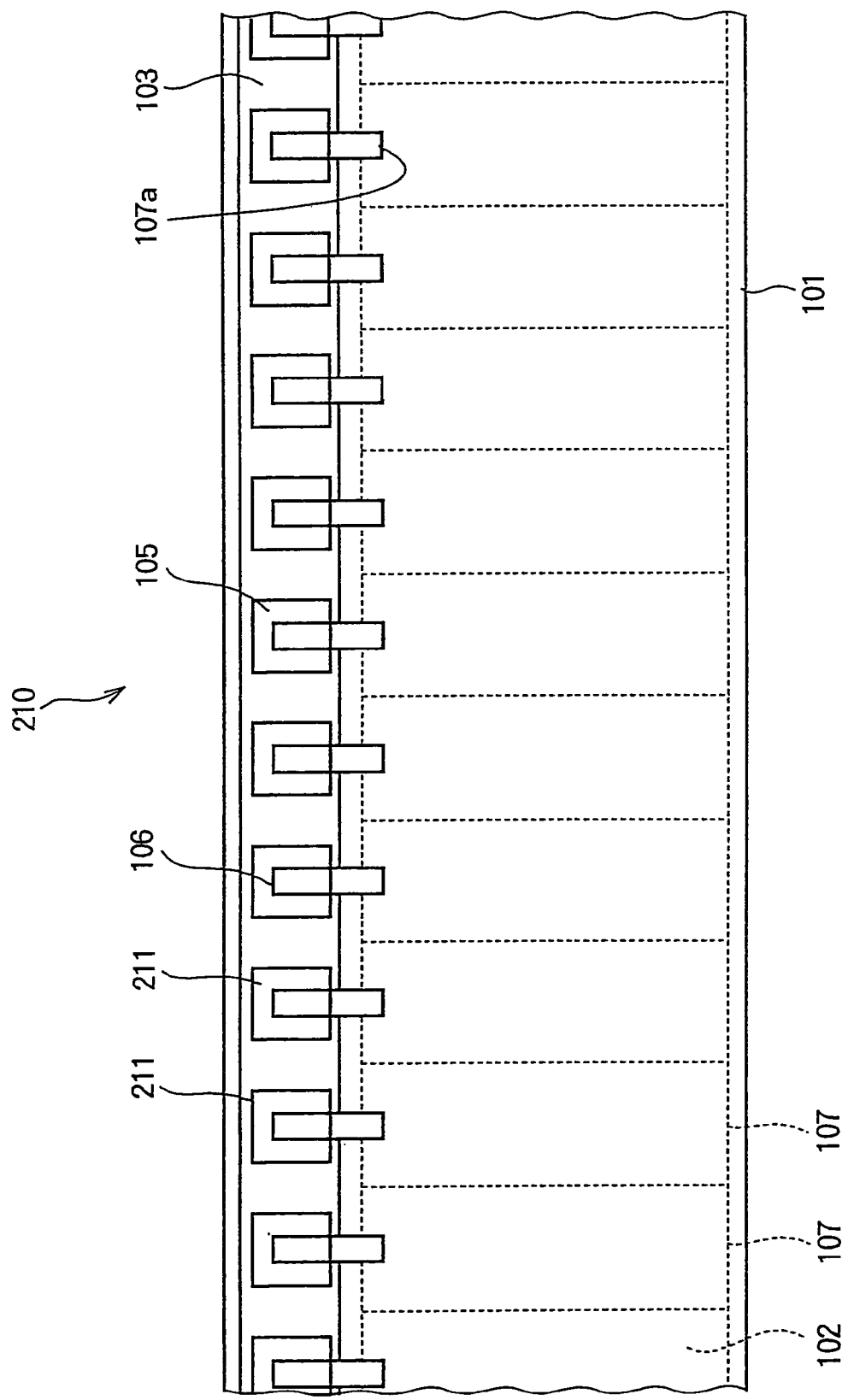
FIG. 24 is a plan view schematically showing part of an integrated LED/driving-IC chip according to the sixth embodiment.

A sixth embodiment of the invented semiconductor apparatus is shown schematically in partial perspective view in FIG. 23 and partial plan view in FIG. 24. The integrated LED/driving-IC chip 210 in the sixth embodiment differs from the integrated LED/driving-IC chip 200 in the fifth embodiment in that each LED 105 is formed as a separate LED epitaxial film 211, as in the fourth embodiment.

The region of contact between the individual interconnecting lines 106 and the LED epitaxial films 211 may extend to the edge of the upper surface of the LED epitaxial films 211, as shown in FIG. 24, or may not extend to the edge of the upper surface of the LED epi-films 211, as shown in FIG. 23.

In other respects, the sixth embodiment is identical to fifth embodiment.

Seventh Embodiment

Figure 25:
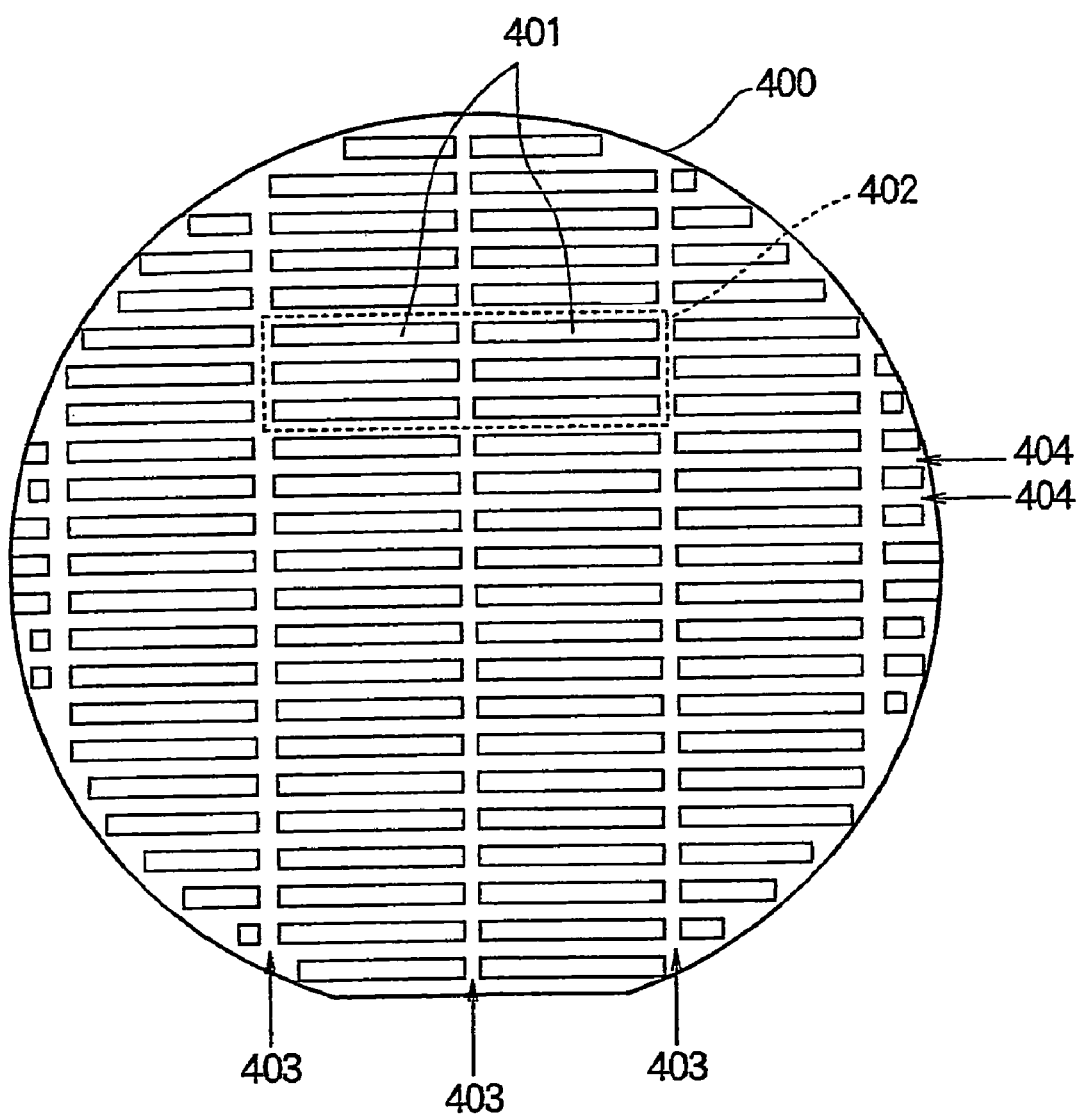
FIG. 25 is a plan view schematically showing a semiconductor wafer on which a plurality of integrated LED/driving-IC chips are formed according to a seventh embodiment of the invention.
Figure 26:
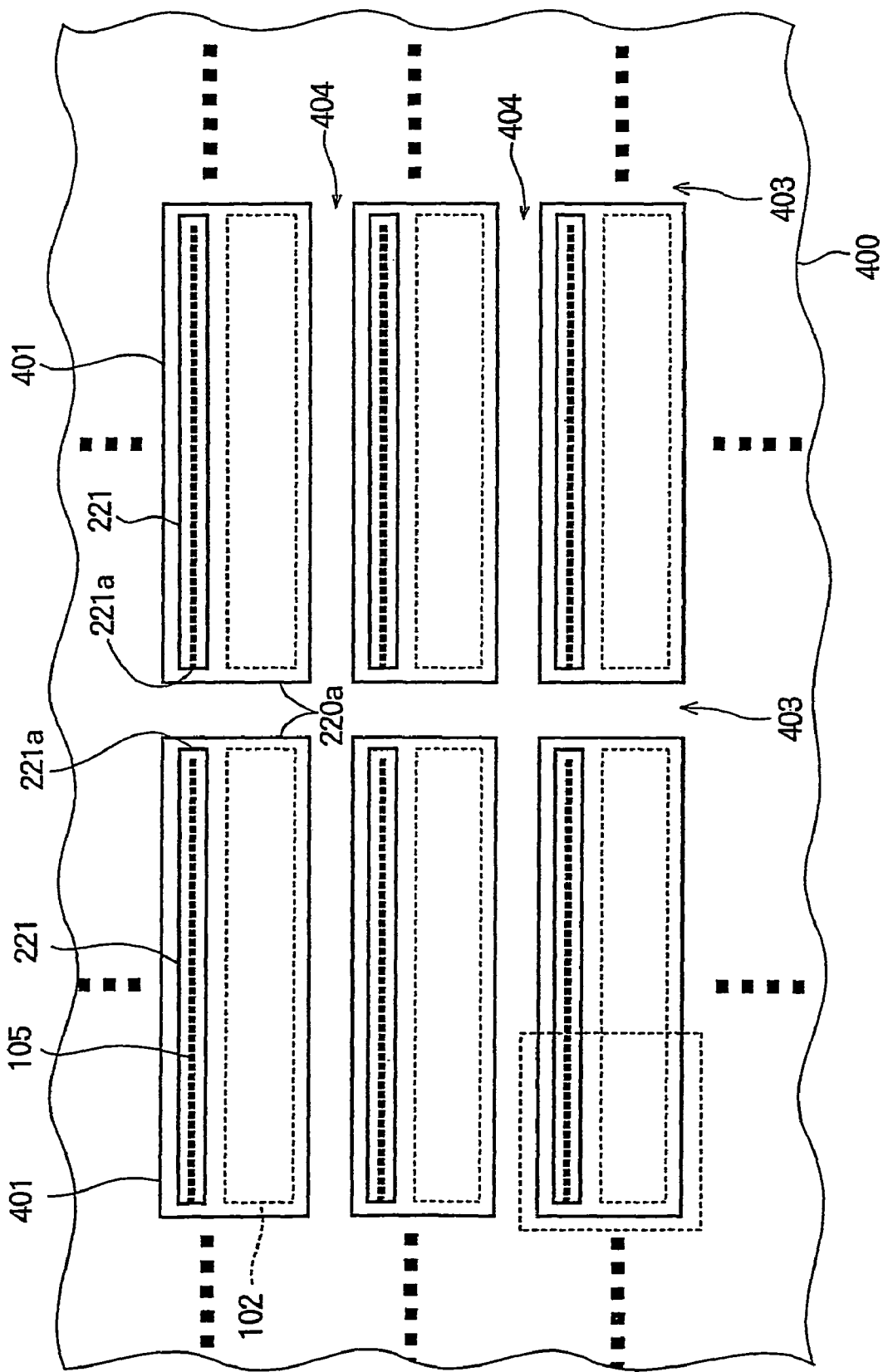
FIG. 26 is a plan view schematically showing part of the semiconductor wafer in FIG. 25.
Figure 27:
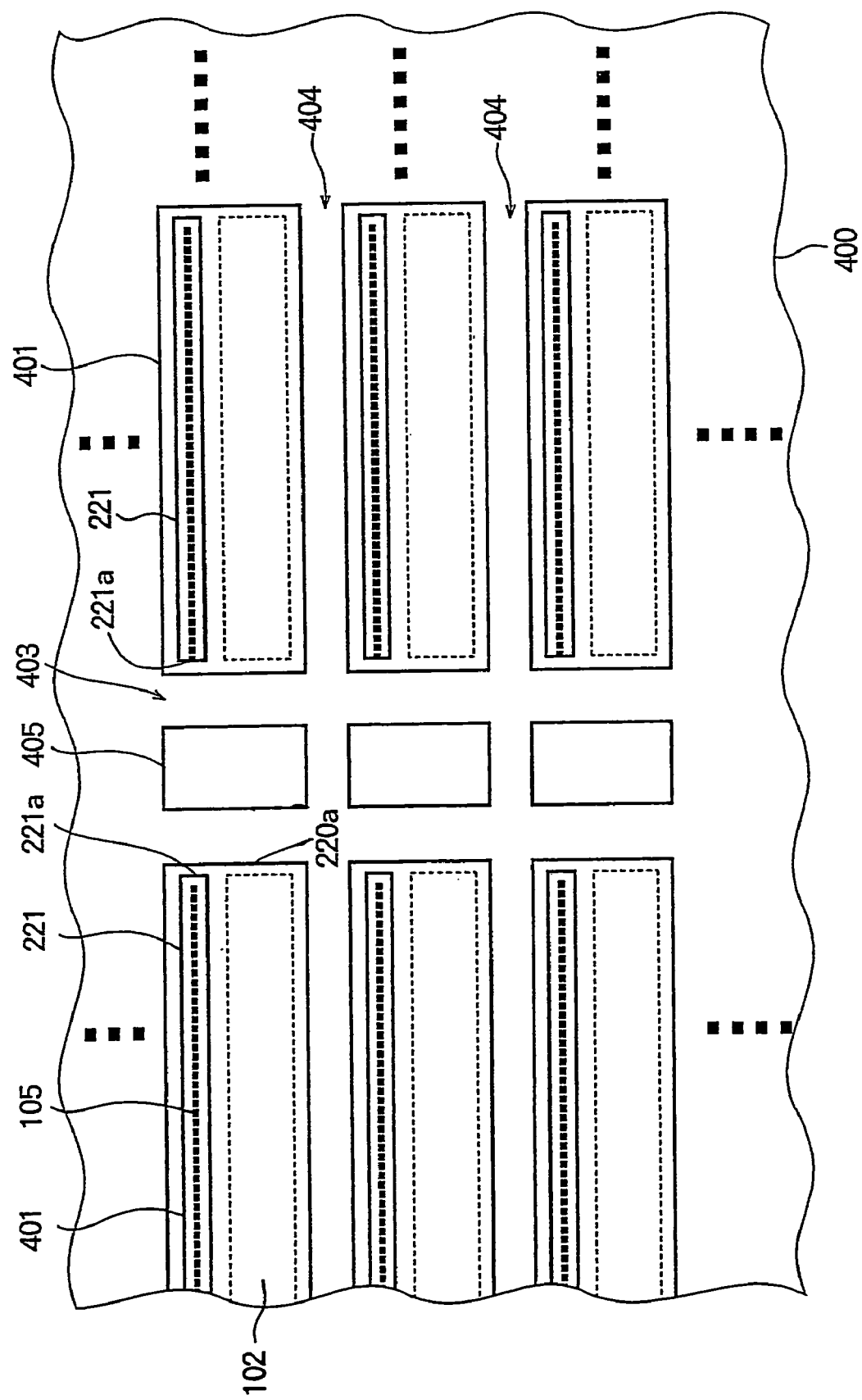
FIG. 27 is a plan view schematically showing part of another semiconductor wafer illustrating the seventh embodiment.
Figure 28:
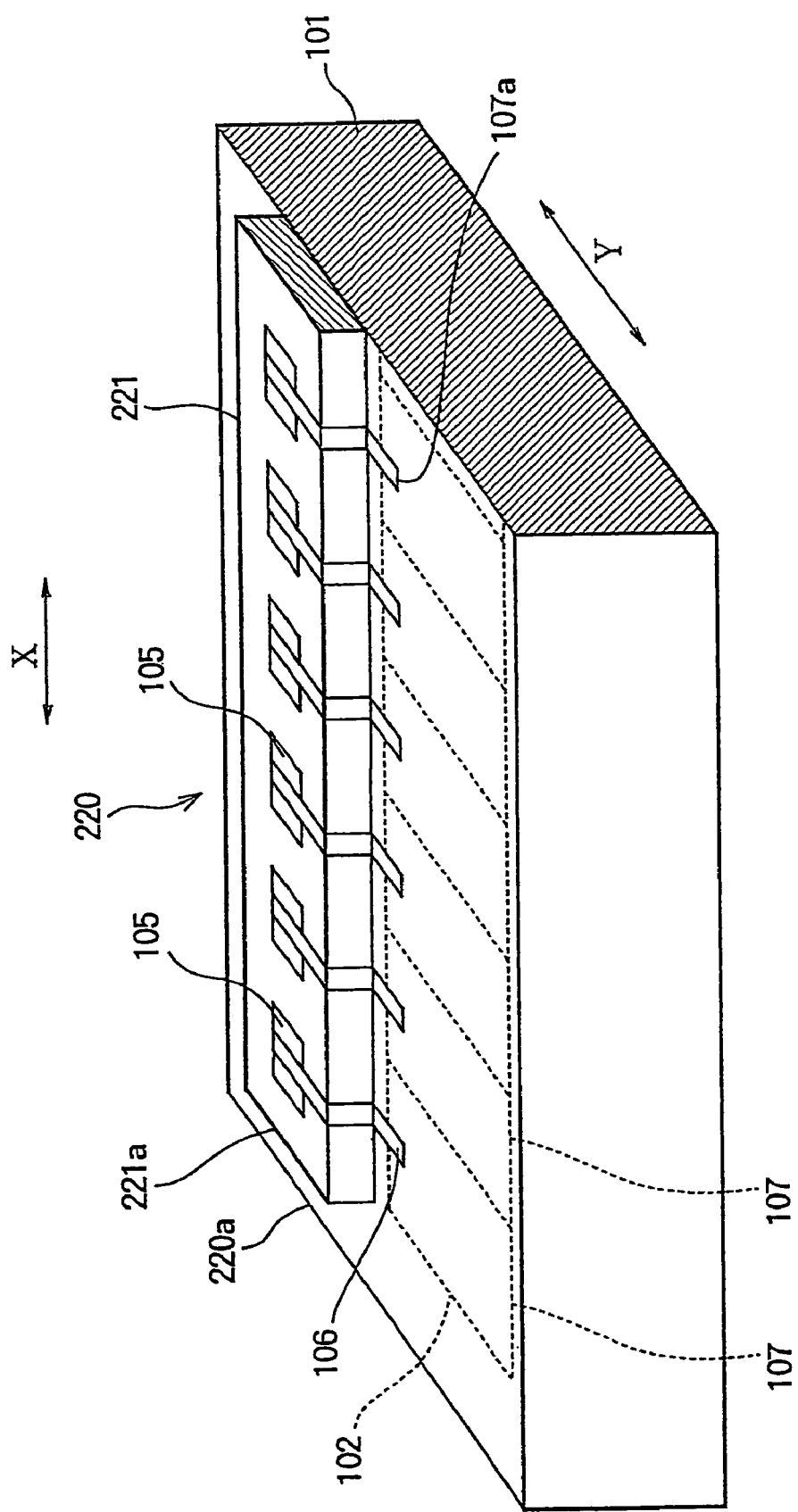
FIG. 28 is a perspective view schematically showing part of an integrated LED/driving-IC chip according to the seventh embodiment.

FIGS. 25, 26, and 27 are schematic plan views of a semiconductor wafer on which a plurality of integrated LED/driving-IC chips according to a seventh embodiment of the invention are fabricated. FIG. 25 shows the entire semiconductor wafer 400, indicating regions 401 in which the individual integrated LED/driving-IC chips are formed. FIGS. 26 and 27 show enlarged views of an area 402 in FIG. 25 including six of these chip regions 401. A single integrated LED/driving-IC chip 220 is shown schematically in partial perspective view in FIG. 28 and partial plan view in FIG. 29.

Referring to FIG. 25, after the integrated LED/driving-IC chips have been formed, the semiconductor wafer 400 is diced along dicing lines 403 and 404, and thereby separated into individual integrated LED/driving-IC chips. The number of integrated LED/driving-IC chips and their layout on the semiconductor wafer 400 are indicated only schematically in the FIG. 25.

Referring to FIG. 27, the dicing lines 403 (and 404) may include alignment mark regions 405 that provide positional references for LED epitaxial film alignment and for alignment of photomasks used, for example, for driving circuit formation, formation of interconnection patterns interconnecting the driving circuits with the LEDs in the LED epitaxial film, and so on. The alignment mark regions 405 include optically detectable markings such as thin-film patterns deposited on or recesses formed in the semiconductor wafer 400. The mark regions 405 are formed in the unused space external to the regions 401 in which the integrated LED/driving-IC chips are formed.

Figure 29:
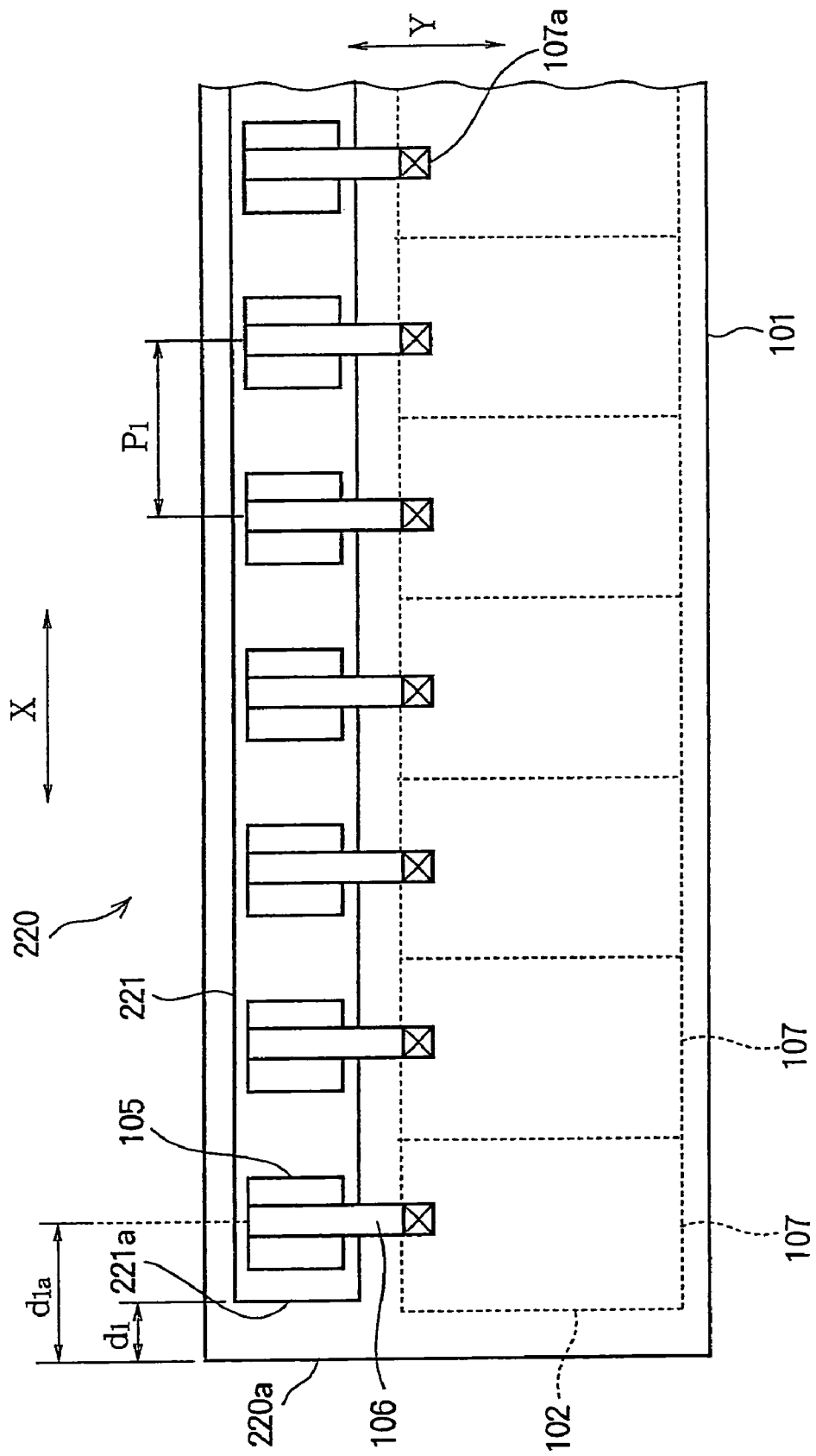
FIG. 29 is a plan view schematically showing part of the integrated LED/driving-IC chip in FIG. 28.

The integrated LED/driving-IC chips are formed in positions on the semiconductor wafer 400 such that the distance from the ends 221a of the LED epitaxial films 221 to the dicing lines 403 facing these ends is not more than half the LED array pitch $P_1$. In FIG. 29, the distance $d_1$ between the end 221a of the LED epitaxial film 221 and the adjacent edge 220a of the integrated LED/driving-IC chip 220 is therefore less than half the array pitch $P_1$ of the LEDs 105. This feature enables a constant interval between LEDs to be maintained in a linear array comprising a plurality of integrated LED/driving-IC chips placed end to end.

In consideration of dicing accuracy and the possibility of chipping during the dicing process, however, the distance $d_1$ between the ends 221a of the LED epitaxial films 221 and the edges 220a of the integrated LED/driving-IC chips 220 is also preferably not less than about 3 μm. More precisely, the distance from the dicing lines 403 to the ends 221a of the LED epitaxial films 221 is at least about 3 μm. Accordingly, the edges of the LED epitaxial films 221 are sufficiently far from the dicing lines 403 that damage to the LED epitaxial films 221, such as cracking or peeling damage, will rarely occur when the semiconductor wafer 400 is diced into individual chips. This feature of the seventh embodiment helps assure that the excellent optical and electrical characteristics and high reliability of the integrated LED/driving-IC chips 220 are maintained.

To allow for the distance $d_1$ between the ends 221a of the LED epitaxial film 221 and the edges 220a of the integrated LED/driving-IC chip, the width of the light-emitting parts 105 of the LED epitaxial film 221 is preferably equal to or less than about half the array pitch ($P_1$ in FIG. 2).

Aside from the extra distance $d_1$ provided between the ends 221a of the LED epitaxial film 221 and the edges 220a of the integrated LED/driving-IC chip, the integrated LED/driving-IC chips 220 in the seventh embodiment are similar to the integrated LED/driving-IC chips 160 of the second embodiment. The LED epitaxial film 221 is bonded directly to the silicon substrate 101 with no intervening metal layer.

Eighth Embodiment

Figure 30:
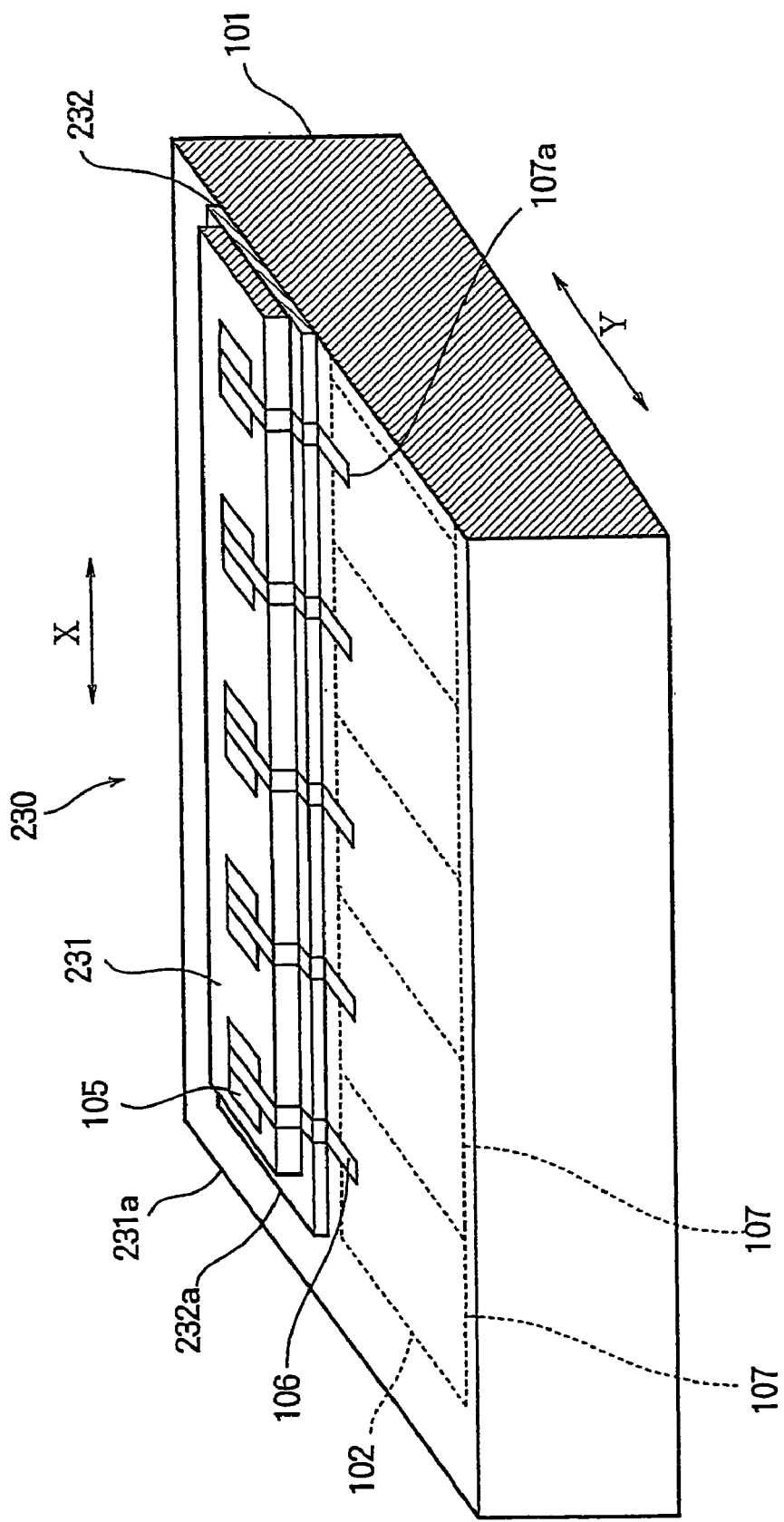
FIG. 30 is a perspective view schematically showing part of an integrated LED/driving-IC chip according to an eighth embodiment of the invention.
Figure 31:
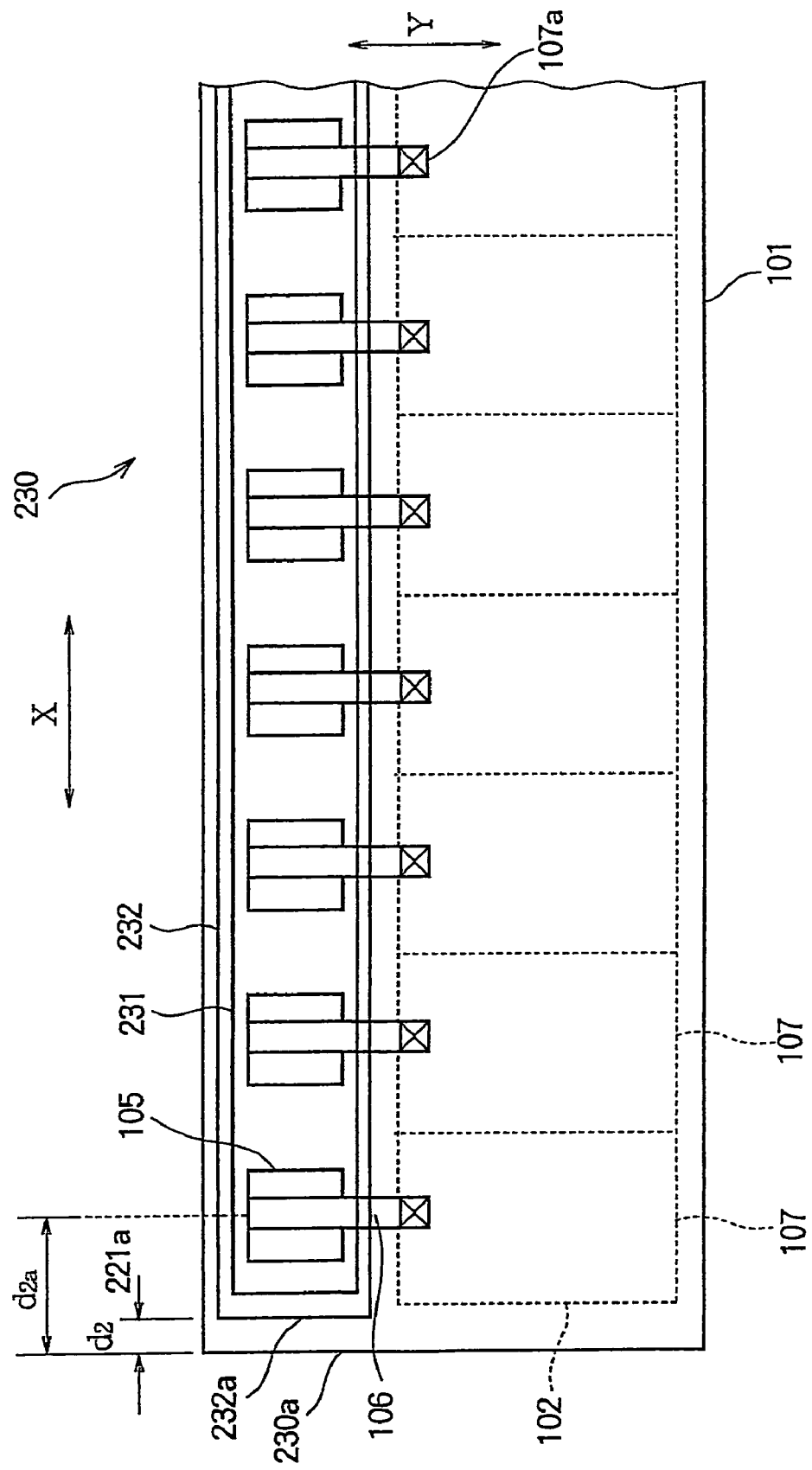
FIG. 31 is a plan view schematically showing part of the integrated LED/driving-IC chip in FIG. 30.

An eighth embodiment of the invented semiconductor apparatus is shown schematically in partial perspective view in FIG. 30 and in partial plan view in FIG. 31. The integrated LED/driving-IC chip 230 in the eighth embodiment differs from the integrated LED/driving-IC chip 220 in the seventh embodiment in that a metal layer 232 is provided between the silicon substrate 101 and the LED epitaxial film 231. The metal layer 232 and the individual interconnecting lines 106 are mutually isolated by a dielectric film (not shown). The function of the metal layer 232 is the same as the function of the metal layer 103 in the first embodiment, but in consideration of chipping effects during dicing, the ends 232a of the metal layer 232 are positioned at a distance $d_2$ from the chip edges 231a. This distance $d_2$ is preferably at least about 3 μm.

In the eighth embodiment, the ends 232a of the metal layer 232 are sufficiently far from the dicing lines that the LED epitaxial film 231 is not damaged, e.g., does not crack or peel, when the wafer on which integrated LED/driving-IC chips 230 are formed is separated into individual chips. Integrated LED/driving-IC chips having both excellent optical and electrical characteristics and high reliability can thereby be obtained.

The distance $d_2$ between the edge 232a of the metal layer 232 and the edge 230a of the integrated LED/driving-IC chip 230 is preferably small enough that when a plurality of integrated LED/driving-IC chips 230 are placed end to end in a row, the intervals between all LEDs in the array can be approximately equal. The distance between the chip-edge 230a and the center of the LED at array-end in one chip, which is defined as $d_{2a}$ in FIG. 31, is preferably less than half the array pitch $P_1$ of the LEDs 105.

In other regards, the eighth embodiment is similar to the seventh embodiment.

Figure 32:
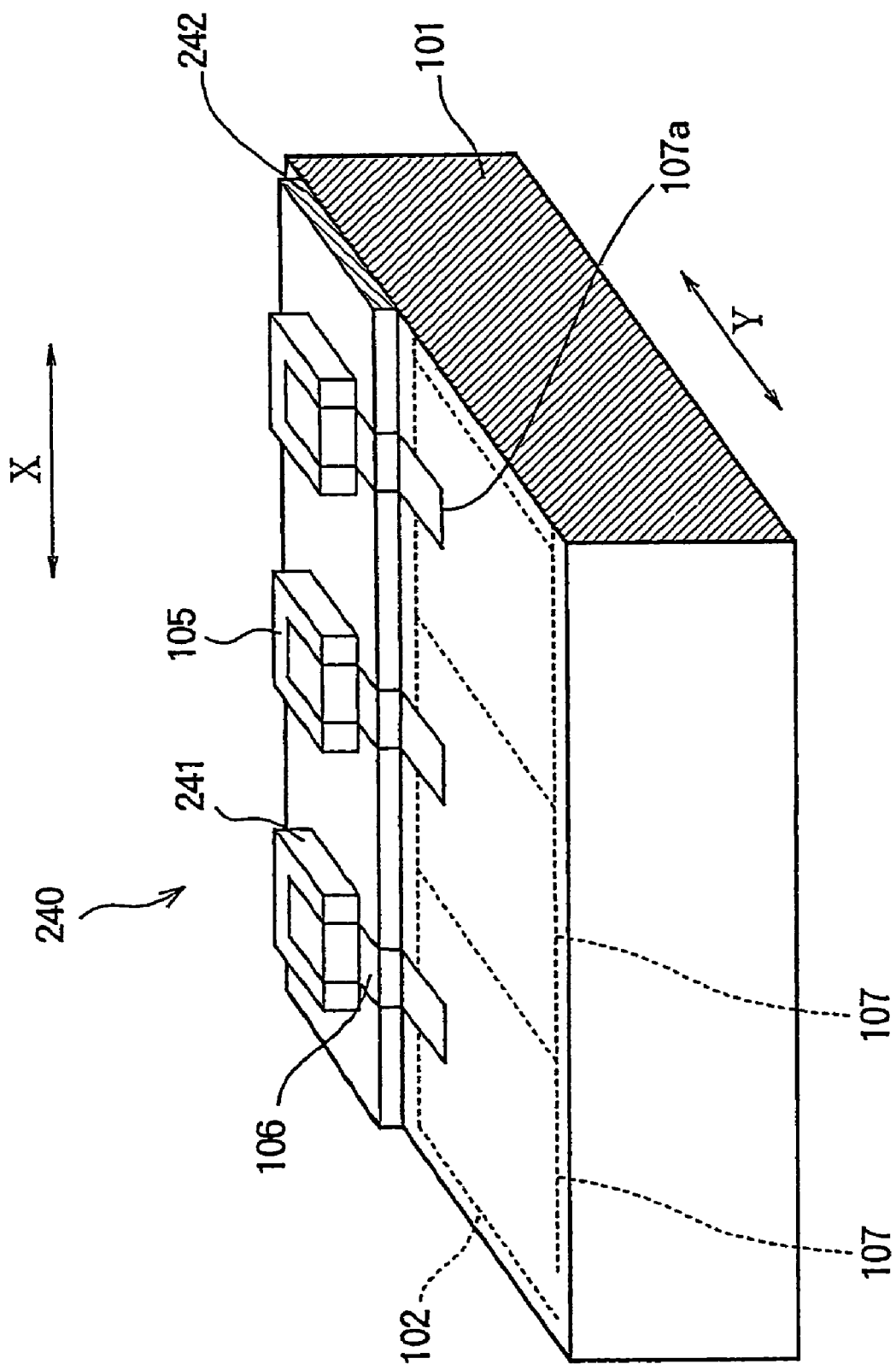
FIG. 32 is a perspective view schematically showing part of an integrated LED/driving-IC chip according to a modification of the eighth embodiment.
Figure 33:
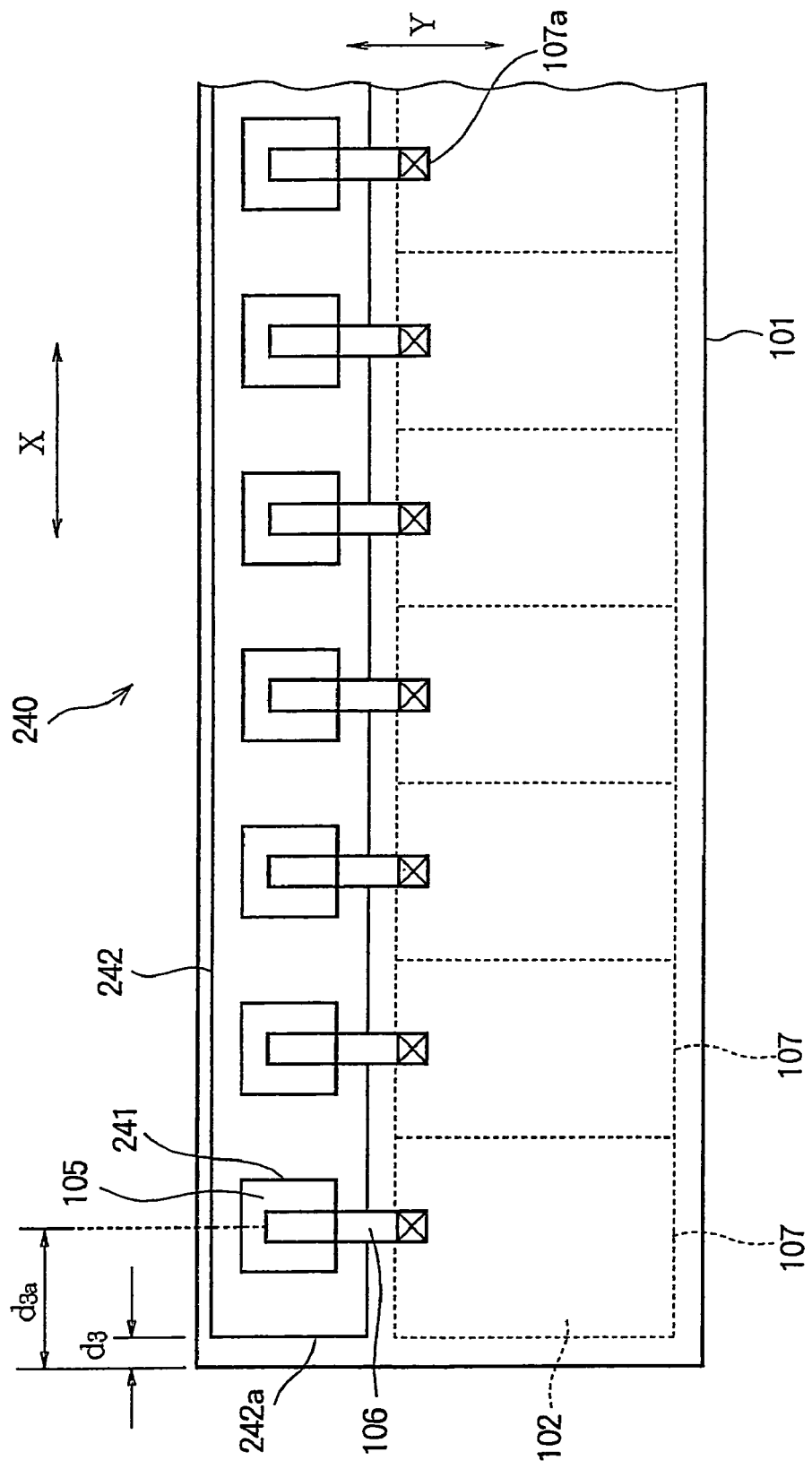
FIG. 33 is a plan view schematically showing part of an integrated LED/driving-IC chip according to this modification of the eighth embodiment.

In a modification of the eighth embodiment, each LED 105 comprises a separate LED epitaxial film 241 as shown in FIG. 32. The LED epitaxial films 241 are bonded to a metal layer 242, the ends 242a which are positioned at a distance $d_3$ from the edges of the integrated LED/driving-IC chip 240, as shown in FIG. 33. The distance $d_3$ is preferably at least 3 □m, so that the LED epitaxial films 241 at the ends of the metal layer 242 will not be damaged during dicing, but is preferably small enough that a plurality of integrated LED/driving-IC chip 240 can be placed end to end to form a row of LEDs with substantially equal spacing between all LEDs 105. The distance $d_{3a}$ in FIG. 33 is defined as $d_{2a}$ in FIG. 31 is defined. The distance $d_{3a}$ is also preferably less than half the array pitch $P_1$ of the LEDs 105.

Ninth Embodiment

Figure 34:
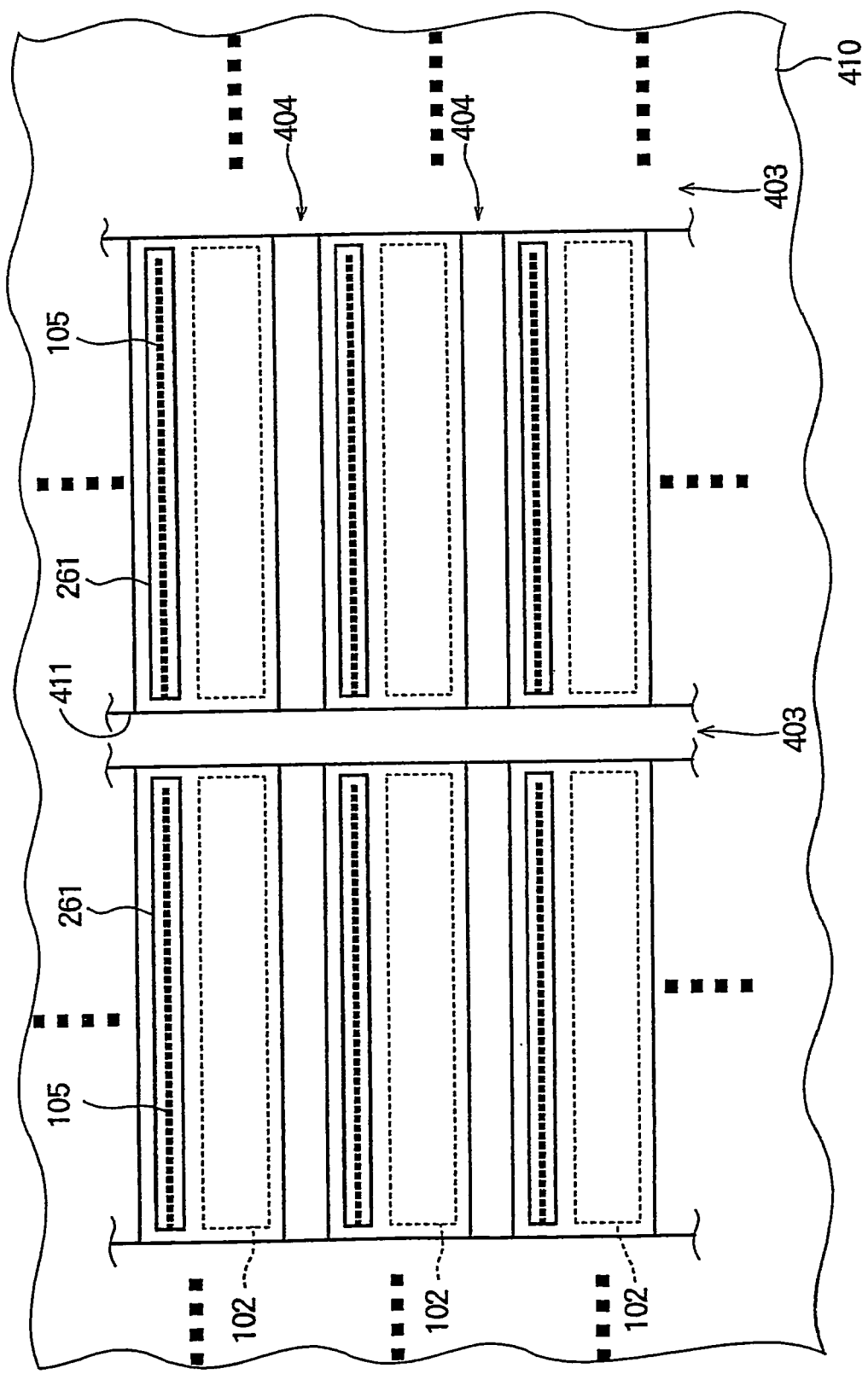
FIG. 34 is plan view schematically showing part of a semiconductor wafer on which a plurality of integrated LED/driving-IC chips are formed according to a ninth embodiment.
Figure 35:
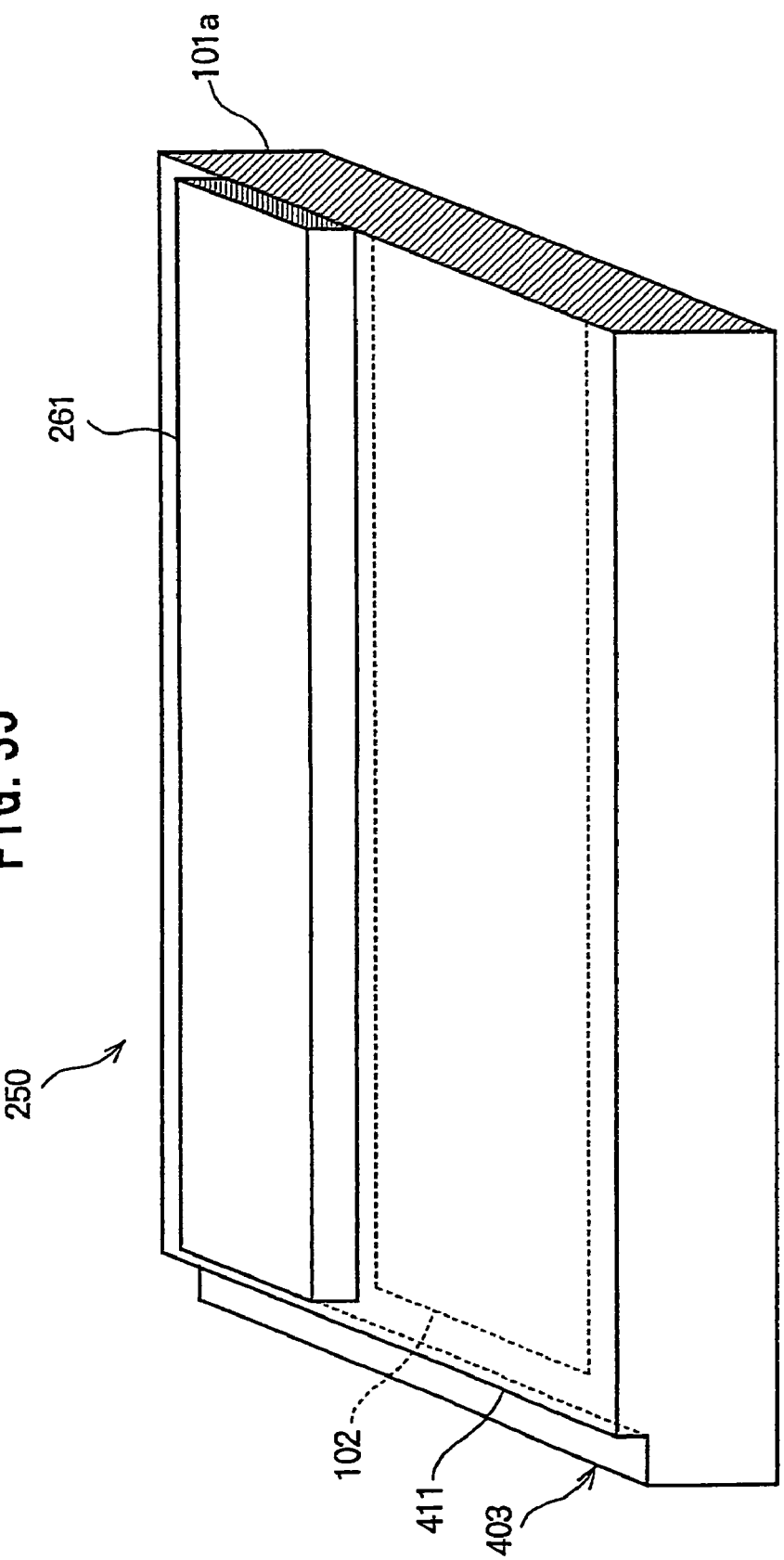
FIG. 35 is a perspective view schematically showing part of an integrated LED/driving-IC chip according to the ninth embodiment.

FIG. 34 is a plan view schematically showing part of a semiconductor wafer 410 on which a plurality of integrated LED/driving-IC chips are fabricated according to a ninth embodiment of the invention. FIG. 35 is a perspective view schematically showing part of one integrated LED/driving-IC chip 250 in the ninth embodiment.

In the ninth embodiment, after the integrated circuits 102 of the integrated LED/driving-IC chips, including the driving circuits and other circuitry, have been formed on the semiconductor wafer 410, a pattern of trenches 411 of a predetermined depth is formed. The trenches 411 follow the vertical dicing lines 403 in FIG. 34, but are wider than these dicing lines 403. (Here, when width of the dicing line 403 is compared with width of the trench 411, the dicing line is defined as the line on which a dicing saw actually cuts the substrate; width of the dicing line is roughly equivalent to the width of the dicing saw used in a dicing process.) Next, the LED epitaxial films 261 are bonded; then the semiconductor wafer 410 is diced along the dicing lines 403 and 404. The integrated LED/driving-IC chips 250 therefore have the appearance shown in FIG. 35, part of a trench 411 remaining at each end of each chip. The trenches 411 tend to inhibit the spread of chipping and other dicing effects into the interior of the chips, thereby improving the fabrication yield of the separated chips.

The distance from the edges of the dicing lines 403 to the adjacent edges of the trenches 411, and the distance from the edges of the trenches 411 to the ends of the LED epitaxial films 261, are preferably designed so that a plurality of integrated LED/driving-IC chips 250 can be placed end to end to form a single linear array with substantially equal spacing between all LEDs 105. The sum of these two distances should accordingly be less than half the array pitch $P_1$ of the LEDs 105. In consideration of chipping and other dicing hazards, the distance from the edges of the trenches 411 to the ends of the LED epitaxial films 261 is preferably at least about 3 μm.

In other regards, the integrated LED/driving-IC chips 250 in the ninth embodiment may be similar to the integrated LED/driving-IC chips in any of the preceding embodiments.

Figure 36:
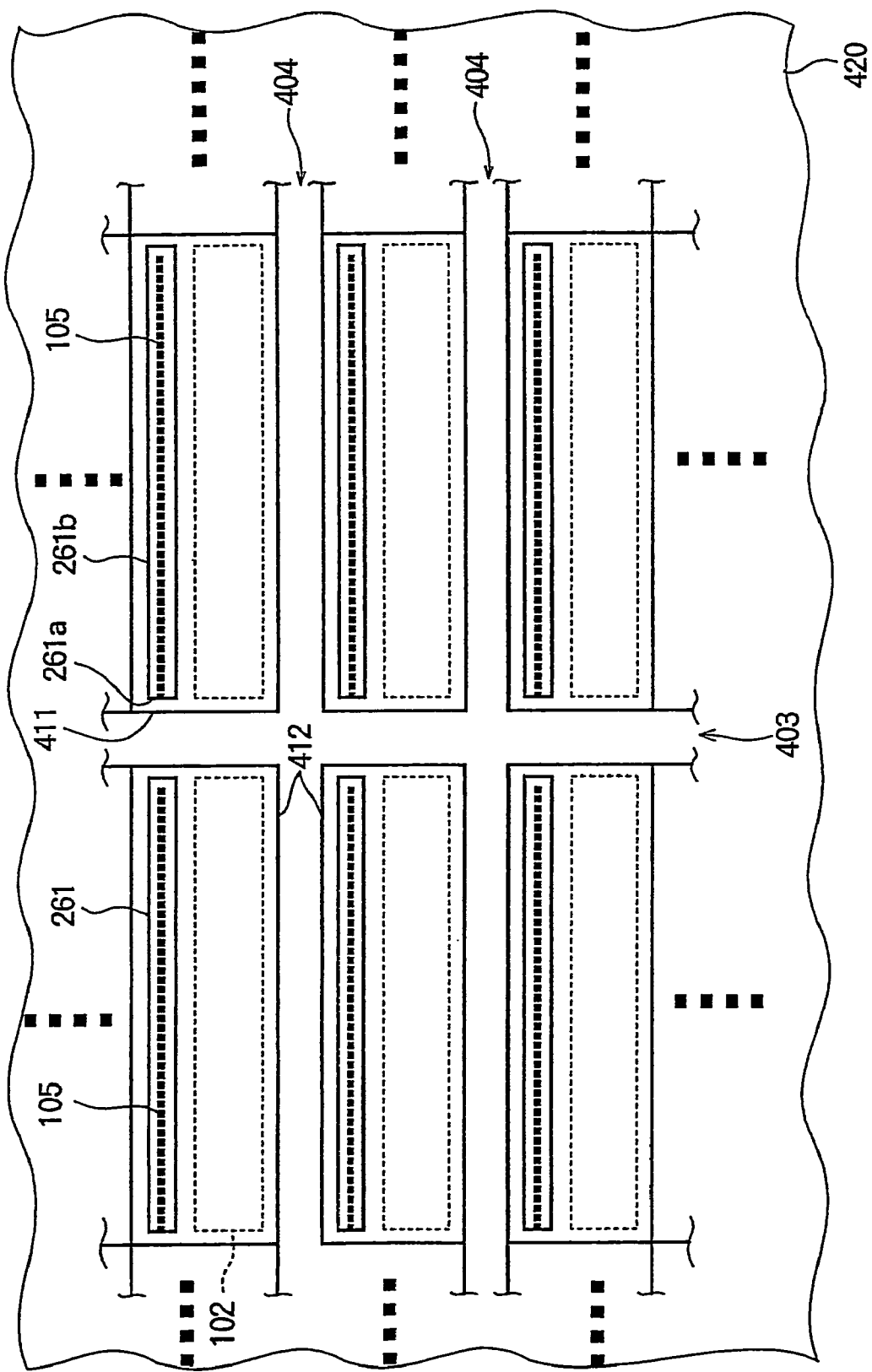
FIG. 36 is a plan view schematically showing part of a semiconductor wafer on which a plurality of integrated LED/driving-IC chips according to a modification of the ninth embodiment are formed.
Figure 37:
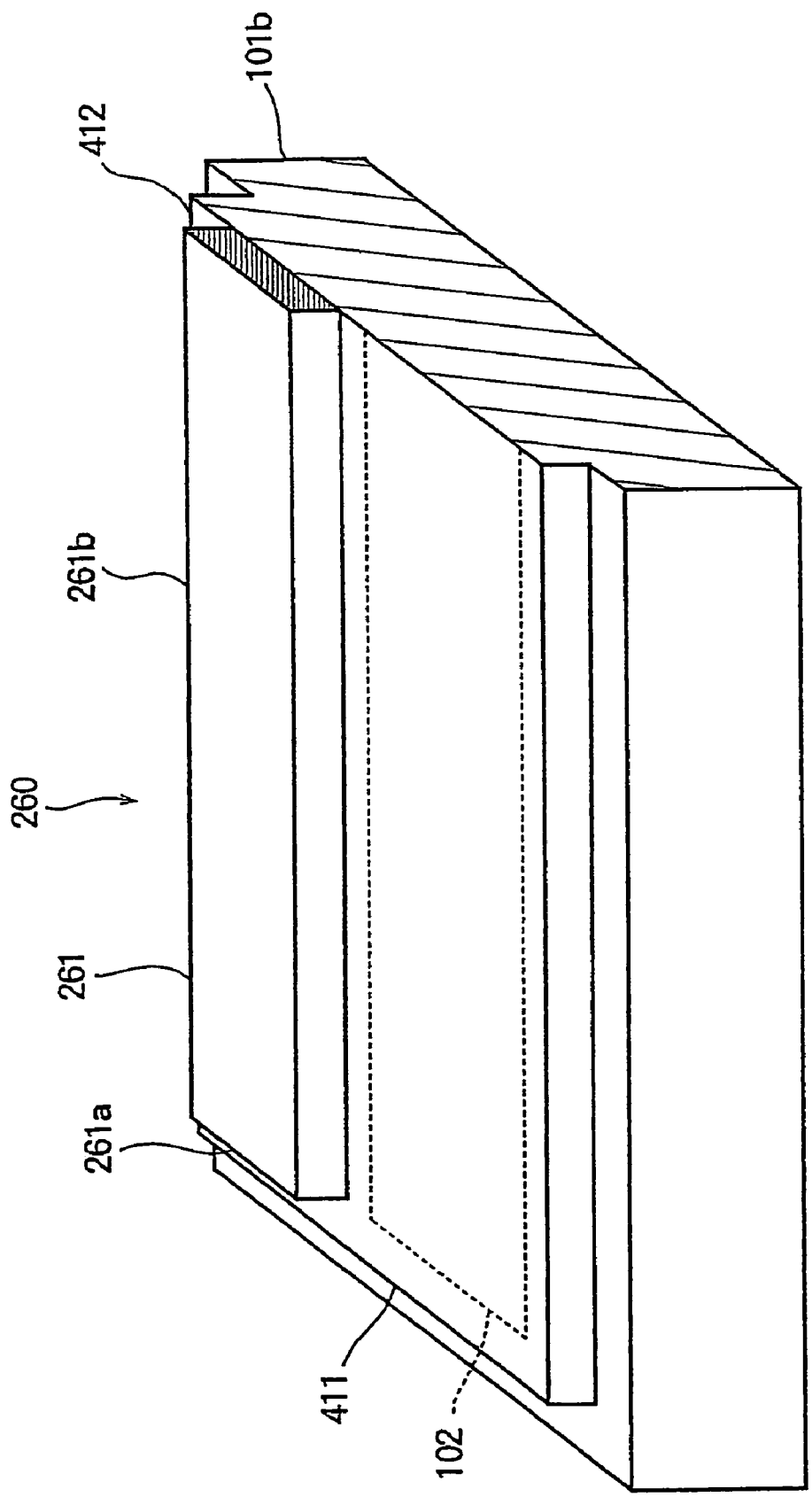
FIG. 37 is a perspective view schematically showing part of an integrated LED/driving-IC chip according to this modification of the ninth embodiment.

FIG. 36 is a plan view schematically showing part of a semiconductor wafer 420 on which a plurality of integrated LED/driving-IC chips according to a modification of the ninth embodiment are formed. FIG. 37 is a perspective view schematically showing part of an integrated LED/driving-IC chip 260 in this modification of the ninth embodiment.

In this modification, the pattern of trenches formed in the semiconductor wafer 420 after the integrated circuits 102 of the integrated LED/driving-IC chips 260 have been formed includes both the above-described trenches 411 following the dicing lines 403 extending in the vertical direction in FIG. 36, and trenches 412 following the dicing lines 404 extending in the horizontal direction. Both sets of trenches 411, 412 are wider than the dicing lines 403, 404 they follow. (Here, when widths of the dicing lines 403 and 404 are compared with width of the trench 411, the dicing line is defined as the line on which a dicing saw actually cuts the substrate; width of the dicing line is roughly equivalent to the width of the dicing saw used in a dicing process.) After the trenches 411, 412 have been formed, the LED epitaxial films 261 are attached; then the semiconductor wafer 420 is diced along the dicing lines 403, 404, which lie within the trenches 411, 412.

The preferred constraints on the distances from the edges of the dicing lines 403 to the edges of the trenches 411 extending in the vertical direction in FIG. 36 and from the edges of these trenches 411 to the ends 261a of the LED epitaxial films 261 mentioned above also apply in this modification of the ninth embodiment; The distance from the edges of the dicing lines 403 to the adjacent edges of the trenches 411, and the distance from the edges of the trenches 411 to the ends of the LED epitaxial film 261, are preferably designed so that a plurality of integrated LED/driving-IC chips 250 can be placed end to end to form a single row with substantially equal spacing between all LEDs 105. In addition, the distance from the edges of the trenches 412 extending in the horizontal direction in FIG. 36 and the longitudinal edges 261b of the LED epitaxial films 261 is preferably at least about 3 □m, to prevent damage to the LED epitaxial films 261 from chipping etc. during the dicing process.

The trenches 411, 412 in this modification of the ninth embodiment protect the interiors of the integrated LED/driving-IC chips 260 during the dicing process, thereby further improving the fabrication yield of the separated chips.

Except for the additional trenches 412, the modification shown in FIGS. 36 and 37 is identical to the ninth embodiment as shown in FIGS. 34 and 35.

Figure 38:
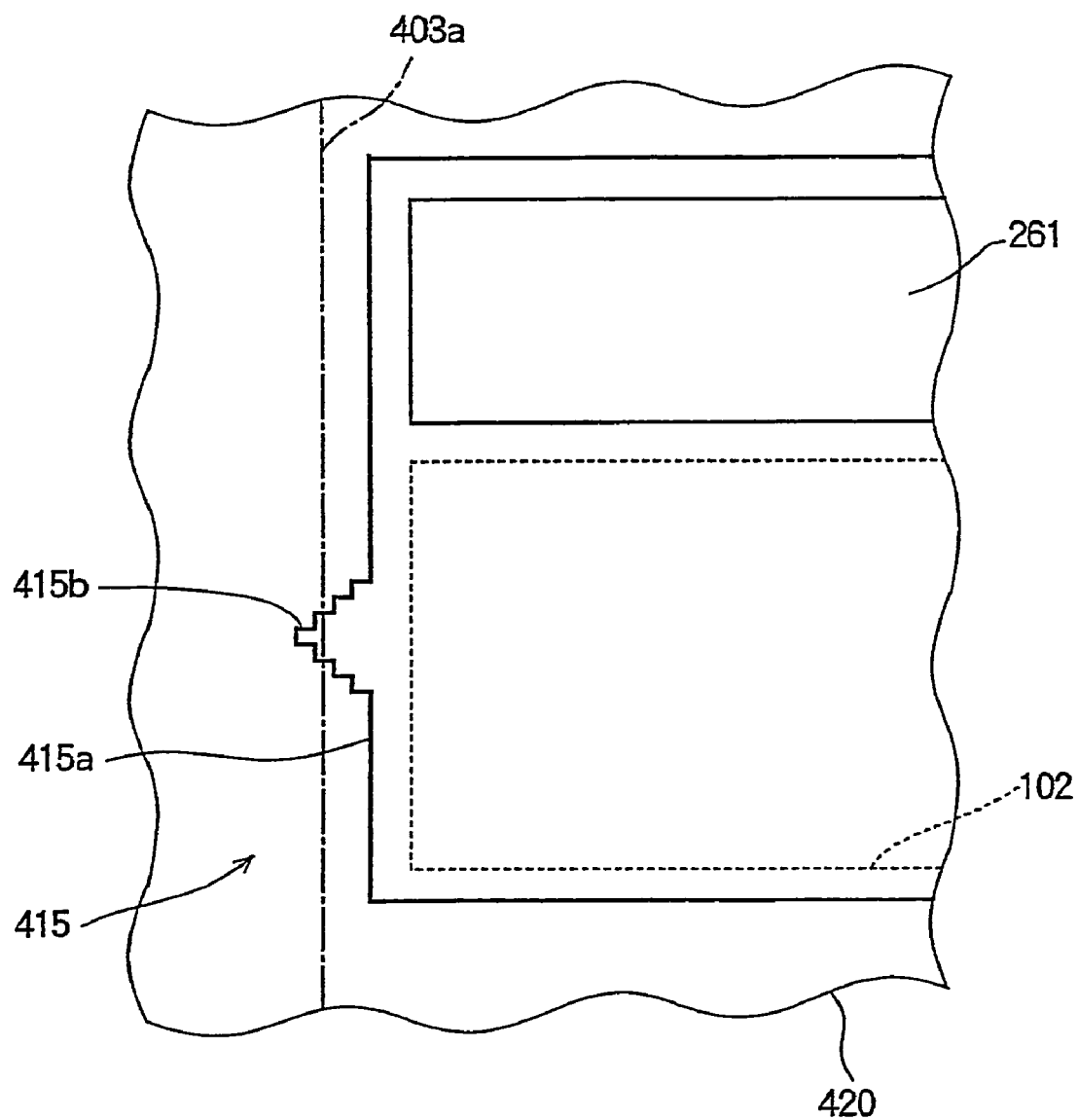
FIG. 38 is a plan view schematically showing a further modification of the ninth embodiment.

In a further modification of the ninth embodiment, shown in plan view in FIG. 38, the edges 415a of the trench pattern 415 include a dicing-cut-monitor 415b of the non-trench region. The dicing-cut-monitor indicates a mark to use for determination or alignment of the position of the dicing-line 403a, and for deduction easily exact distance between an actual dicing position 403a or a chip-edge and the trench-edge 415a. These dicing-cut-monitors 415b are preferably located adjacent to the integrated circuits 102, as shown in FIG. 38, rather than adjacent to the LED epitaxial films 261. The dicing-cut-monitors 415b have staircase-like profile to deduce easily distance between the dicing line and the trench-edge.

Tenth Embodiment

Figure 39:
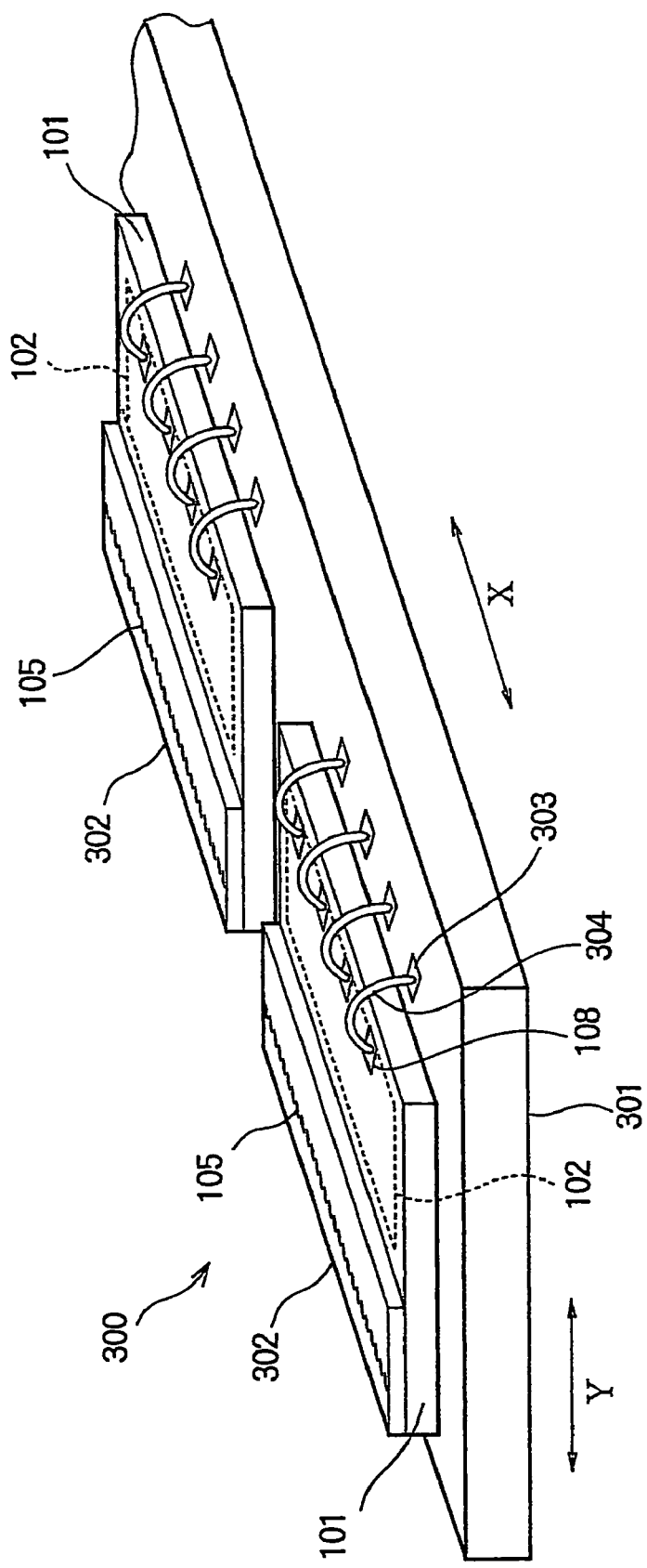
FIG. 39 is a perspective view schematically showing part of an LED unit according to a tenth embodiment.

The semiconductor apparatus in a tenth embodiment of the invention, shown in partial perspective view in FIG. 39, is an LED unit 300 comprising a chip-on-board (COB) circuit board 301 and a plurality of integrated LED/driving-IC chips 302 mounted thereon. The integrated LED/driving-IC chips 302 have, for example, the structure of the integrated LED/driving-IC chip 100 in the first embodiment. The integrated LED/driving-IC chips 302 are mounted on the COB circuit board 301 at regular intervals by means of an adhesive such as an insulating paste or conductive paste, and are disposed so that, for example, the light-emitting parts of the LED epitaxial films 104 form a single row of LEDs 105 spaced at regular intervals, extending the entire length of the LED unit 300 in the longitudinal direction (X-direction).

The COB circuit board 301 has a printed wiring pattern including electrode pads 303 for supplying power and control signals (including illumination data) necessary for illumination control for the LEDs 105 to the integrated circuits 102 in the integrated LED/driving-IC chips 302. The silicon substrates 101 of the integrated LED/driving-IC chips 302 have electrode pads 108 for receiving these power and control signals. The LED unit 300 has bonding wires 304 electrically interconnecting the electrode pads 303 on the COB circuit board 301 and the electrode pads 108 on the silicon substrates 101 of the integrated LED/driving-IC chips 302.

Although wire bonding is used for electrical connections between the integrated LED/driving-IC chips 302 and the COB circuit board 301, the number of wire bonds is greatly reduced, in comparison to conventional LED units, because no wire bonds are necessary between the individual electrode for the LEDs in the LED epitaxial films 104 and the output-electrode-pads for the driving ICs on the silicon substrates 101.

Furthermore, the number of chips mounted on the COB circuit board 301 is reduced by half in comparison to conventional units in which LED array chips and driver IC chips are mounted separately. Thus reducing amount of wire bonding and chip mounting considerably simplifies the assembly process of the LED unit 300 in the tenth embodiment, and growing up speeds in the assembly process. Consequently, assembly costs are much reduced. Assembling reliability partly depends on the amount of chip-mounting and wire-binding. In this sense, the reliability of the LED unit 300 goes up.

Furthermore, since the integrated LED/driving-IC chips 302 are narrower in the Y-direction (orthogonal to the LED array direction) than the conventional configuration as separately mounting LED array chips and driving IC chips on a COB. The width of the COB circuit board 301 can be reduced, leading to a reduction in board material cost. This is in addition to the cost reduction in semiconductor material cost noted in the first embodiment.

Eleventh Embodiment

Figure 40:
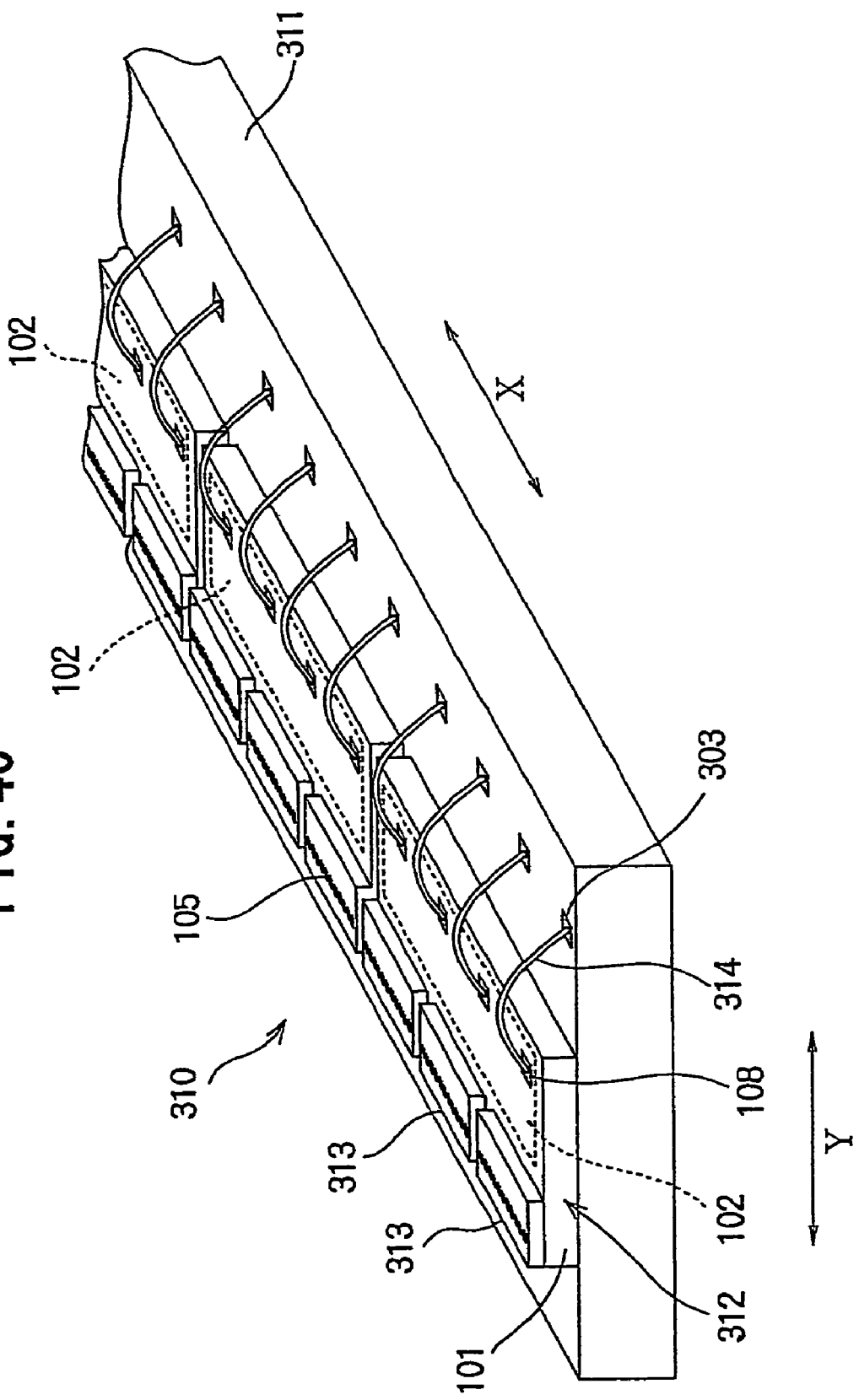
FIG. 40 is a perspective view schematically showing part of an LED unit according to an eleventh embodiment.

The semiconductor apparatus in an eleventh embodiment of the invention, shown in partial perspective view in FIG. 40, is an LED unit 310 comprising a COB circuit board 311 and a plurality of integrated LED/driving-IC chips 322 mounted thereon. The integrated LED/driving-IC chips 312 have, for example, the structure of the integrated LED/driving-IC chip 100 in the third embodiment, each chip including a plurality of LED epitaxial films 313. As in the tenth embodiment, the integrated LED/driving-IC chips 312 are mounted on the COB circuit board 311 at regular intervals by an adhesive such as an insulating paste or conductive paste, and are disposed so that, for example, the light-emitting parts of the LED epitaxial films 313 form a single row of LEDs 105 spaced at regular intervals, extending the entire length of the LED unit 310 in the longitudinal direction (X-direction).

As in the tenth embodiment, electrode pads 303 on the COB circuit board 311 are connected to electrode pads 108 on the integrated LED/driving-IC chips 312 by bonding wires 314 for supplying power and control signals to the integrated circuits 102 in the integrated LED/driving-IC chips 312.

The eleventh embodiment provides the same effects as the tenth embodiment: the number of wire bonds is greatly reduced; the number of chips mounted on the COB circuit board 311 is reduced by half; the reliability of the LED unit 310 is enhanced; its assembly cost is reduced; the width of the COB circuit board 301 is reduced; and material costs can be reduced.

Twelfth Embodiment

Figure 41:
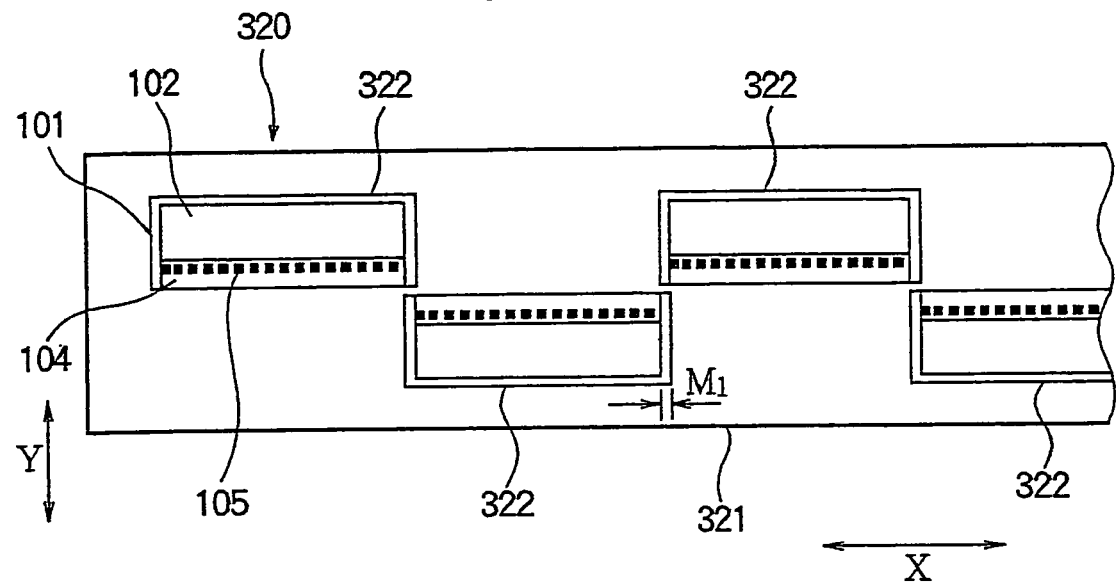
FIG. 41 is a plan view schematically showing part of an LED unit according to a twelfth embodiment of the invention.

The semiconductor apparatus in the twelfth embodiment of the invention is an LED unit 320, shown schematically in partial plan view in FIG. 41 that has a COB circuit board 321 on which a plurality of integrated LED/driving-IC chips 322 are mounted. The basic structure of the integrated LED/driving-IC chips 322 may be, for example, the structure shown in the first embodiment. The plurality of integrated LED/driving-IC chips 322 are mounted by an adhesive such as an insulating paste or conductive paste on the COB circuit board 321 at regular intervals in a staggered fashion, so that the short sides of adjacent integrated LED/driving-IC chips 312 are offset in the Y-direction and do not even partially face each other. The integrated LED/driving-IC chips 322 are electrically connected to the COB circuit board 321 by bonding wires (not shown) as explained in the tenth embodiment.

The integrated LED/driving-IC chips 322 in the twelfth embodiment differ from the integrated LED/driving-IC chips 100 shown in the first embodiment in that they include a substantial dicing margin $M_1$, that is, a substantial amount of material is left around the edges of the chips to allow a tolerance for dicing inaccuracy. Despite this dicing margin $M_1$, the staggered arrangement makes it possible to arrange the integrated LED/driving-IC chips 322 so that the LEDs 105 are spaced at regular intervals in the X-direction, including the X-direction interval between the LEDs 105 at the ends of two adjacent integrated LED/driving-IC chips 322. The extra dicing margin $M_1$ simplifies the control of the dicing process and thus reduces the fabrication cost of the integrated LED/driving-IC chips, and increases the fabrication yield. Increase in the fabrication yield also contributes to cost reduction.

Aside from the extra dicing margin $M_1$ and the staggered arrangement of the integrated LED/driving-IC chips 322, the LED unit 320 in twelfth embodiment is identical to LED unit 300 described in the tenth embodiment. When the LED unit 320 of the twelfth embodiment is used in, for example, an electrophotographic printer, alternate integrated LED/driving-IC chips 322 may be driven at different timings so that all of the integrated LED/driving-IC chips 322 illuminate a single row of dots on a rotating photosensitive drum.

The twelfth embodiment may be modified by using integrated LED/driving-IC chips of the type shown in any of the second through ninth embodiments.

LED Print Head

Figure 42:
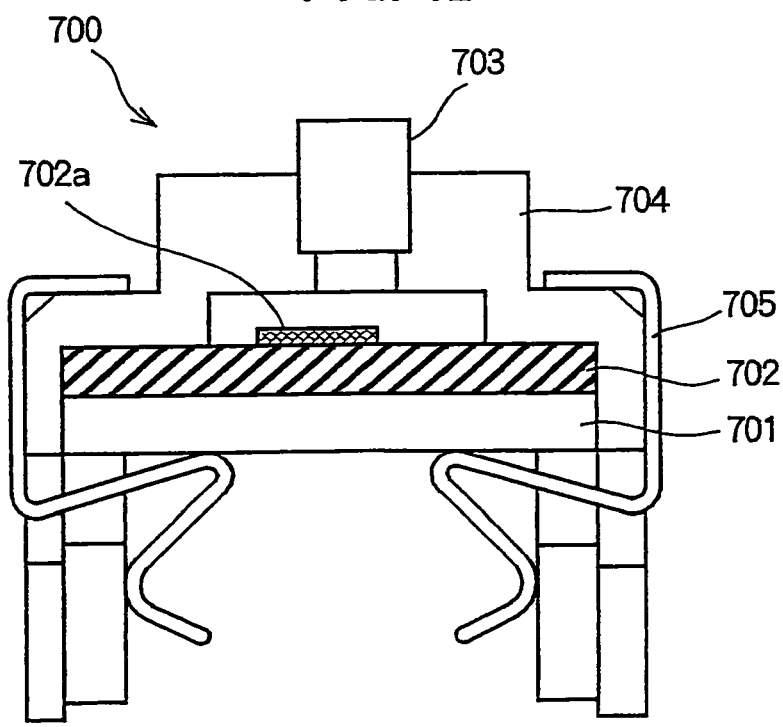
FIG. 42 is a cross sectional view schematically showing an LED print head employing the invented semiconductor apparatus.

FIG. 42 shows an example of an LED print head 700 employing the present invention. The LED print head 700 includes a base 701 on which is mounted an LED unit 702 of, for example, the type described in the tenth, eleventh, or twelfth embodiment. The LED unit 702 includes a plurality of integrated LED/driving-IC chips 702a of the type described in any of the first nine embodiments, mounted so that their light-emitting parts are positioned beneath a rod lens array 703. The rod lens array 703 is supported by a holder 704. The base 701, LED unit 702, and holder 704 are held together by clamps 705. Light emitted by the light-emitting elements in the LED unit 702 is focused by rod lenses in the rod lens array 703 onto, for example, a photosensitive drum (not shown) in an electrophotographic printer or copier.

LED Printer

Figure 43:
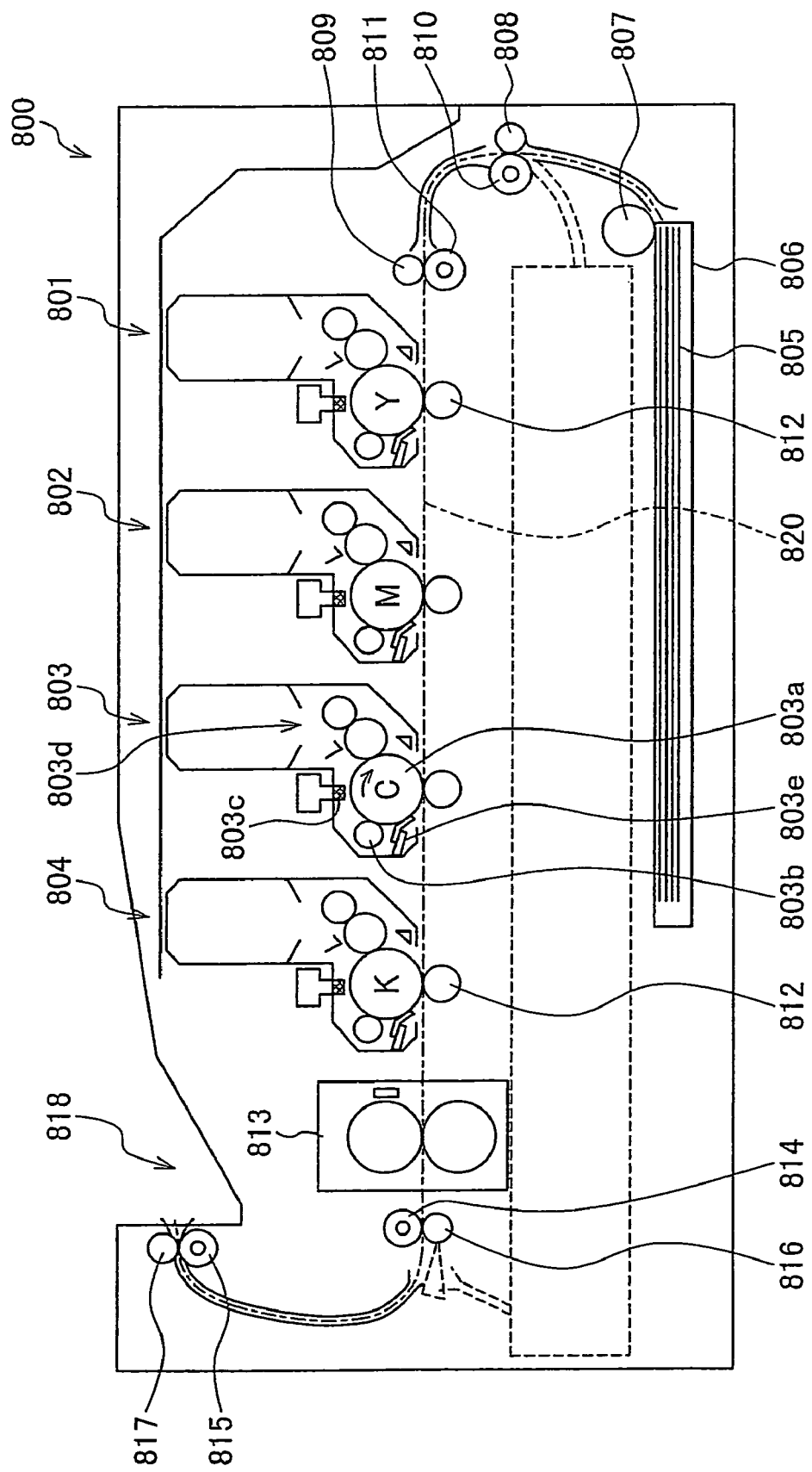
FIG. 43 is a schematic cutaway side view of an LED printer employing the invented semiconductor apparatus.

FIG. 43 shows an example of a full-color LED printer 800 in which the present invention may be employed. The printer 800 has a yellow (Y) process unit 801, a magenta (M) process unit 802, a cyan (C) process unit 803, and a black (K) process unit 804, which are mounted following one another in tandem fashion. The cyan process unit 803, for example, includes a photosensitive drum 803a that turns in the direction indicated by the arrow, a charging unit 803b that supplies current to the photosensitive drum 803a to charge the surface thereof, an LED print head 803c that selectively illuminates the charged surface of the photosensitive drum 803a to form an electrostatic latent image, a developing unit 803d that supplies cyan toner particles to the surface of the photosensitive drum 803a to develop the electrostatic latent image, and a cleaning unit 803e that removes remaining toner from the photosensitive drum 803a after the developed image has been transferred to paper. The LED print head 803c has, for example, the structure shown in FIG. 42, including integrated LED/driving-IC chips 702a of the type described in any of the first nine embodiments. The other process units 801, 802, 804 are similar in structure to the cyan process unit 803, but use different toner colors.

The paper 805 (or other media) is held as a stack of sheets in a cassette 806. A hopping roller 807 feeds the paper 805 one sheet at a time toward a paired transport roller 810 and pinch roller 808. After passing between these rollers, the paper 805 travels to a registration roller 811 and pinch roller 809, which feed the paper toward the yellow process unit 801.

The paper 810 passes through the process units 801, 802, 803, 804 in turn, traveling in each process unit between the photosensitive drum and a transfer roller 812 made of, for example, semi-conductive rubber. The transfer roller 812 is charged so as to create a potential difference between it and the photosensitive drum. The potential difference attracts the toner image from the photosensitive drum onto the paper 805. A full-color image is built up on the paper 805 in four stages, the yellow process unit 801 printing a yellow image, the magenta process unit 802 a magenta image, the cyan process unit 803 a cyan image, and the black process unit 804 a black image.

From the black process unit 804, the paper 805 travels through a fuser 813, in which a heat roller and back-up roller apply heat and pressure to fuse the transferred toner image onto the paper. A first delivery roller 814 and pinch roller 816 then feed the paper 805 upward to a second delivery roller 815 and pinch roller 817, which deliver the printed paper onto a stacker 818 at the top of the printer.

The photosensitive drums and various of the rollers are driven by motors and gears not shown in the drawing. The motors are controlled by a control unit (not shown) that, for example, drives the transport roller 810 and halts the registration roller 811 until the front edge of a sheet of paper 805 rests flush against registration roller 811, then drives the registration roller 811, thereby assuring that the paper 805 is correctly aligned during its travel through the process units 801, 802, 803, 804. The transport roller 810, registration roller 811, delivery rollers 814, 815, and pinch rollers 808, 809, 816, 817 also have the function of changing the direction of travel of the paper 805.

The LED heads account for a significant part of the manufacturing cost of this type of LED printer 800. By using highly reliable and space-efficient integrated LED/driving-IC chips and enabling these chips and the LED units in the LED heads to be manufactured by a simplified fabrication process with reduced material costs, the present invention enables a high-quality printer to be produced at a comparatively low cost.

Similar advantages are obtainable if the invention is applied to a full-color copier. The invention can also be advantageously used in a monochrome printer or copier or a multiple-color printer or copier, but its effect is particularly great in a full-color image-forming apparatus (printer or copier), because of the large number of exposure devices (print heads) required in such apparatus.

The invention is not limited to the preceding embodiments. For example, the metal layer 103 used in several of the embodiments can be replaced by a thin-film layer of polysilicon, ITO, ZnO, or another non-metallic electrically conductive material.

Figure 44:
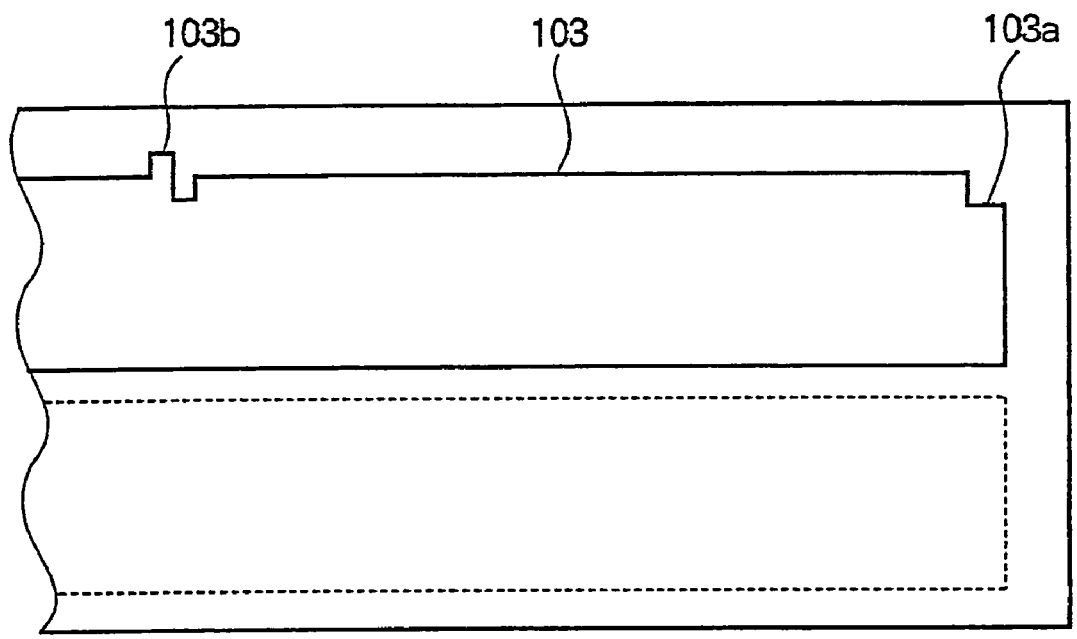
FIG. 44 is a plan view illustrating a modification of a metal layer present in several of the preceding embodiments.
Figure 45:
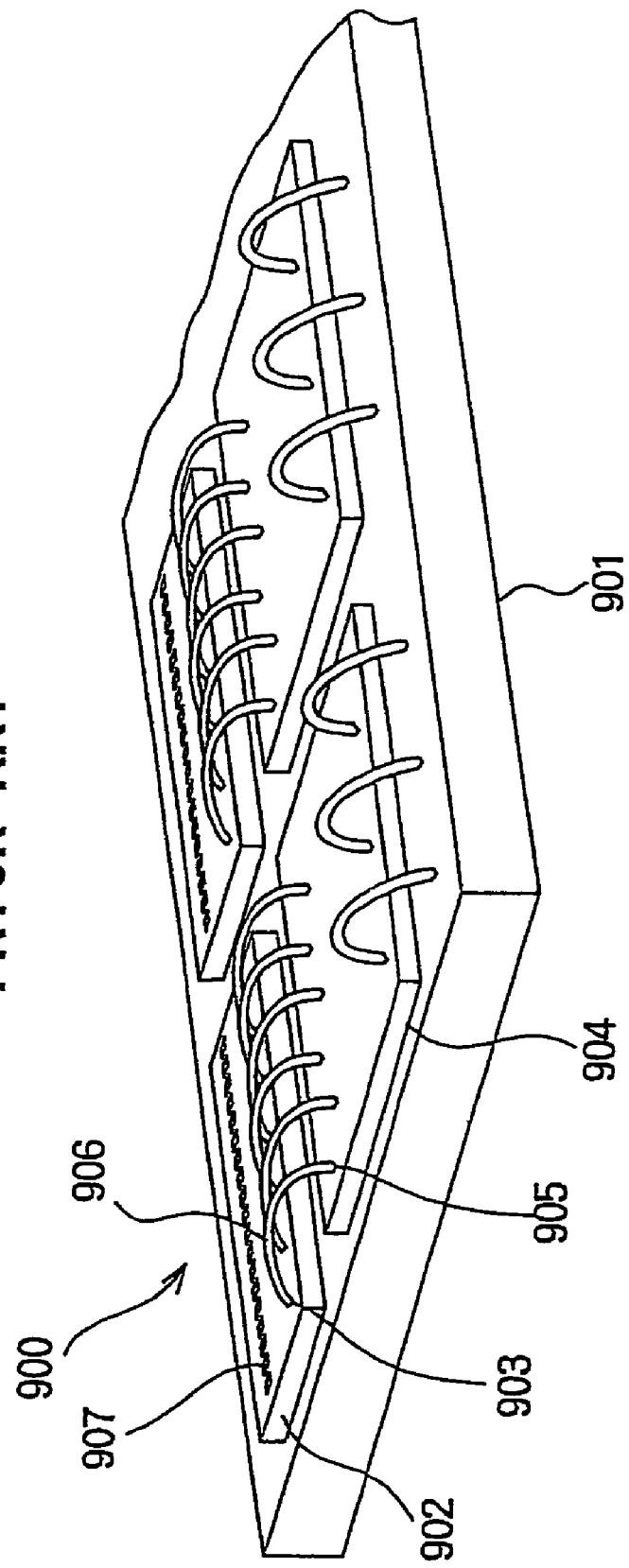
FIG. 45 is a perspective view schematically showing part of a conventional LED print head.
Figure 46:
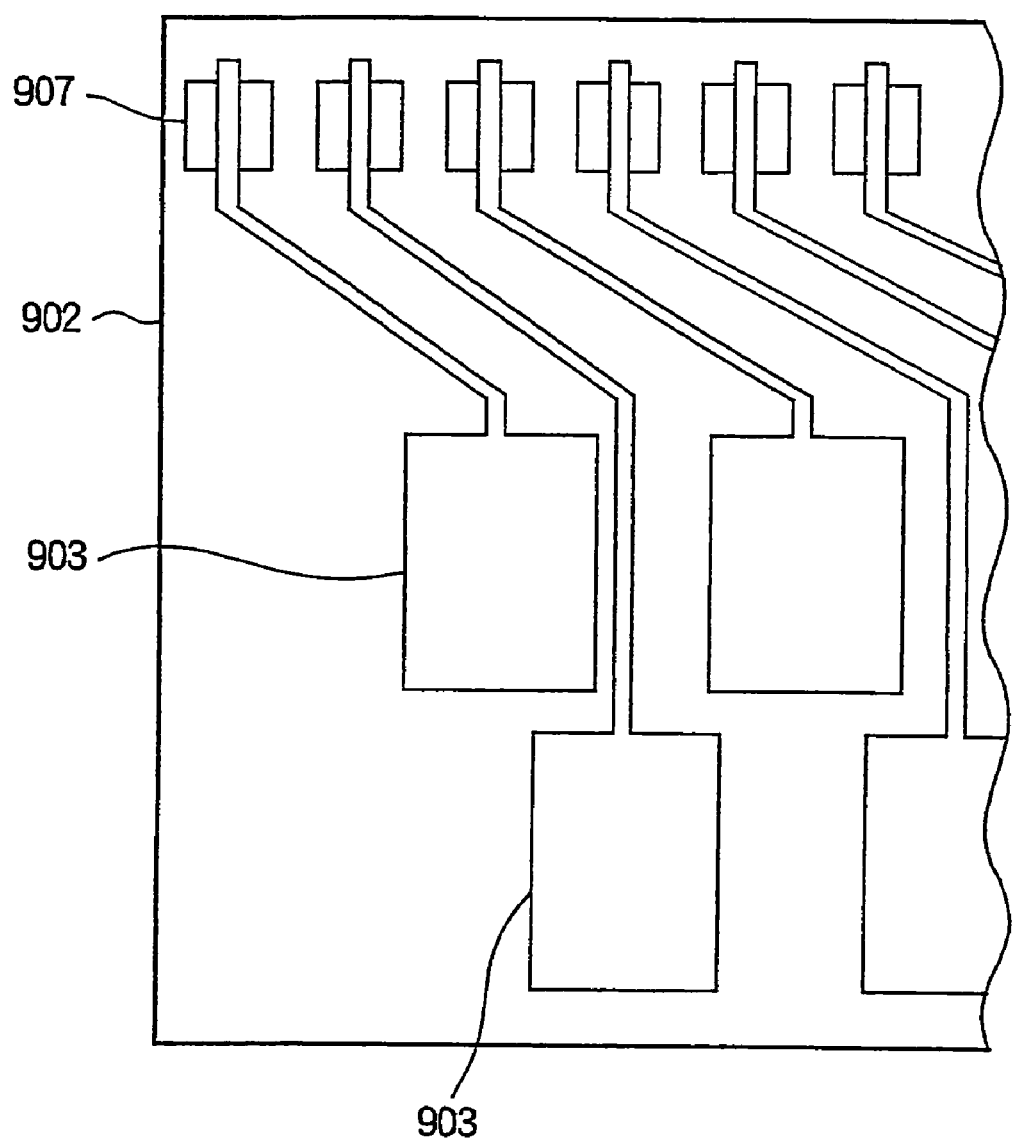
FIG. 46 is a plan view schematically showing part of an LED array chip in the LED print head in FIG. 45.

The conductive thin-film layers in the embodiments above have been drawn as rectangles, but as shown in FIG. 44, the rectangular shape of, for example, the metal layer 103 may be modified to include a cut-off corner 103a and a side meander 103b. The cut-off corner 103a can be used as a reference for determining the orientation of the chip. The meander 103b can be used as a reference for determining the positions of the LEDs. These marks can also be used as alignment marks for alignment of the LED epitaxial film with the metal pattern.

The silicon substrate 101 may be replaced by a compound semiconductor substrate, an organic semiconductor substrate, or an insulating substrate such as a glass or sapphire substrate. The substrate may be monocrystalline, polycrystalline, or amorphous.

The integrated circuit 102 need not be formed within the substrate on which the metal film or LED epitaxial film is mounted. An interconnection pattern and terminal may be formed on the surface of this substrate, and the integrated circuit 102 may be formed separately and then mounted on the substrate.

The LED epitaxial film may be replaced with a thin semiconductor film in which semiconductor devices other than LEDs are formed. Possible examples of these other semiconductor devices include semiconductor lasers, photodetectors, Hall elements, and piezoelectric devices.

The LED epitaxial film or other thin semiconductor film need not be grown as an epitaxial layer on a fabrication substrate. Any available fabrication method may be used.

The LED epitaxial film or other thin semiconductor film need not be mounted above or adjacent to the integrated circuit area on the substrate; it may be separated from the integrated circuit by an arbitrary distance.

Those skilled in the art will recognize that further modifications are possible within the scope of invention, which is defined by the appended claims.

What is claimed is:

1. An LED unit including a circuit board and a plurality of semiconductor chips bonded thereon, each of the semiconductor chips comprising:
    a semiconductor substrate having a substantially planarized surface, having an integrated circuit formed therein, and having a terminal electrically connected to the integrated circuit;
    a plurality of thin semiconductor films each including at least one light emitting element, the thin semiconductor films being disposed on the substantially planarized surface of the semiconductor substrate, under surfaces of the thin semiconductor films facing the semiconductor substrate being closely bonded to the substantially planarized surface of the semiconductor substrate, the thin semiconductor films being less than about 10 μm thick, and forming a step with the semiconductor substrate; and a plurality of individual interconnecting lines formed as thin conductive films, each of which extends from an upper surface of the light emitting element in the thin semiconductor film, along a top surface of the thin semiconductor film to an edge thereof, across a rise of the step, and to the terminal on the semiconductor substrate and electrically connects the light emitting element to the terminal;

the circuit board having a wiring pattern and electrode pads for supplying power and a control signal to the semiconductor chips, the semiconductor chips being electrically connected to the electrode pads of the circuit board respectively, and the integrated circuit having a plurality of driving circuits that drives the light emitting elements of the semiconductor thin films, respectively.

2. The LED unit of claim 1, wherein each of the semiconductor chips further comprises a layer of conductive material disposed between the thin semiconductor films and the semiconductor substrate, the layer of conductive material being formed on the semiconductor substrate, the thin semiconductor films being bonded to the layer of conductive material, whereby the thin semiconductor films are bonded to the semiconductor substrate.

3. The LED unit of claim 1, wherein said semiconductor chips are disposed on the circuit board so that the light emitting elements are aligned at identical intervals in a single row.

4. The LED unit of claim 1, wherein said semiconductor chips are disposed on the circuit board in a staggered linear array, all of the light emitting elements in the semiconductor chips being aligned at identical intervals in a direction parallel to the staggered linear array.

5. The LED unit of claim 1, further comprising a thin dielectric film disposed on the thin semiconductor films and the semiconductor substrate.

6. The LED unit of claim 5, wherein the individual interconnecting lines are disposed on the thin dielectric film.

* * * * *